United States Patent
Santilli

(10) Patent No.: US 10,100,262 B2
(45) Date of Patent: Oct. 16, 2018

(54) METHOD AND APPARATUS FOR THE INDUSTRIAL PRODUCTION OF NEW HYDROGEN-RICH FUELS

(71) Applicant: MagneGas Corporation, Clearwater, FL (US)

(72) Inventor: Ruggero Maria Santilli, Palm Harbor, FL (US)

(73) Assignee: MAGNEGAS CORPORATION, Clearwater, FL (US)

( * ) Notice: Subject to any disclaimer, the term of this patent is extended or adjusted under 35 U.S.C. 154(b) by 29 days.

(21) Appl. No.: 15/612,457

(22) Filed: Jun. 2, 2017

(65) Prior Publication Data
US 2017/0321130 A1    Nov. 9, 2017

Related U.S. Application Data

(63) Continuation-in-part of application No. 14/244,229, filed on Apr. 3, 2014, now Pat. No. 9,700,870.

(60) Provisional application No. 61/808,951, filed on Apr. 5, 2013.

(51) Int. Cl.

| | |
|---|---|
| *C10G 32/02* | (2006.01) |
| *C10L 9/04* | (2006.01) |
| *C10L 1/06* | (2006.01) |
| *C10L 1/08* | (2006.01) |
| *B01J 19/08* | (2006.01) |
| *H01L 21/447* | (2006.01) |
| *B01J 19/12* | (2006.01) |

(52) U.S. Cl.
CPC ............ *C10G 32/02* (2013.01); *B01J 19/088* (2013.01); *B01J 19/12* (2013.01); *C10L 1/06* (2013.01); *C10L 1/08* (2013.01); *C10L 9/04* (2013.01); *H01L 21/447* (2013.01); *B01J 2219/0805* (2013.01); *B01J 2219/085* (2013.01); *B01J 2219/0884* (2013.01); *B01J 2219/0886* (2013.01); *C10G 2300/405* (2013.01); *C10G 2400/02* (2013.01); *C10G 2400/04* (2013.01); *C10L 2200/0423* (2013.01); *C10L 2200/0446* (2013.01); *C10L 2270/023* (2013.01); *C10L 2270/026* (2013.01); *C10L 2290/38* (2013.01); *C10L 2290/40* (2013.01)

(58) Field of Classification Search
None
See application file for complete search history.

(56) References Cited

U.S. PATENT DOCUMENTS

| | | |
|---|---|---|
| 603,058 A | 4/1898 | Eldridge |
| 3,992,277 A | 11/1976 | Trieschmann et al. |
| 4,054,513 A | 10/1977 | Windle |
| 4,089,770 A | 5/1978 | Lemke |
| 4,229,307 A | 10/1980 | Lowe et al. |
| 4,369,102 A | 1/1983 | Galluzzo et al. |

(Continued)

*Primary Examiner* — Kishor Mayekar
(74) *Attorney, Agent, or Firm* — Larson & Larson, P.A.; Frank Liebenow; Justin P. Miller

(57) ABSTRACT

A method for bonding a fluid to a substance includes filling a first pressure vessel with the fluid and pressurizing the first pressure vessel to a first pressure. The fluid is the circulated through an electric arc formed within the first pressure vessel, thereby creating a treated fluid. Within a second pressure vessel, the substance is exposed to a magnetic field, thereby forming a polarized substance. The treated fluid and polarized substance are combined under a second pressure within a third pressure vessel, thereby exposing the treated fluid to the polarized substance at a pressure sufficient to achieve a bond.

20 Claims, 54 Drawing Sheets

(56) References Cited

U.S. PATENT DOCUMENTS

| | | | |
|---|---|---|---|
| 4,566,961 | A | 1/1986 | Diaz et al. |
| 4,683,146 | A | 7/1987 | Hirai et al. |
| 5,026,484 | A | 6/1991 | Juvan |
| 5,069,765 | A | 12/1991 | Lewis |
| 5,159,900 | A | 11/1992 | Dammann et al. |
| 5,227,038 | A | 7/1993 | Smalley et al. |
| 5,319,176 | A | 6/1994 | Alvi et al. |
| 5,343,699 | A | 9/1994 | McAlister |
| 5,417,817 | A | 5/1995 | Dammann et al. |
| 5,435,274 | A | 7/1995 | Richardson, Jr. |
| 5,482,601 | A | 1/1996 | Ohshima et al. |
| 5,692,459 | A | 12/1997 | Richardson, Jr. |
| 5,792,325 | A | 8/1998 | Richardson, Jr. |
| 5,826,548 | A | 10/1998 | Richardson, Jr. |
| 6,113,748 | A | 9/2000 | Richardson, Jr. |
| 6,153,058 | A | 11/2000 | Richardson, Jr. |
| 6,183,604 | B1 | 2/2001 | Santilli |
| 6,263,838 | B1 | 7/2001 | Richardson, Jr. |
| 6,299,656 | B1 | 10/2001 | Richardson, Jr. |
| 6,299,738 | B1 | 10/2001 | Richardson, Jr. |
| 6,314,918 | B1 | 11/2001 | McFarland et al. |
| 6,421,500 | B2 | 7/2002 | Wittle et al. |
| 6,540,966 | B1 | 4/2003 | Santilli |
| 6,663,752 | B2 | 12/2003 | Santilli |
| 6,673,322 | B2 | 1/2004 | Santilli |
| 6,926,872 | B2 | 8/2005 | Santilli |
| 7,105,079 | B2 | 9/2006 | Waldeck et al. |
| 7,780,924 | B2 | 8/2010 | Santilli |
| 2003/0051992 | A1 | 3/2003 | Rappa et al. |

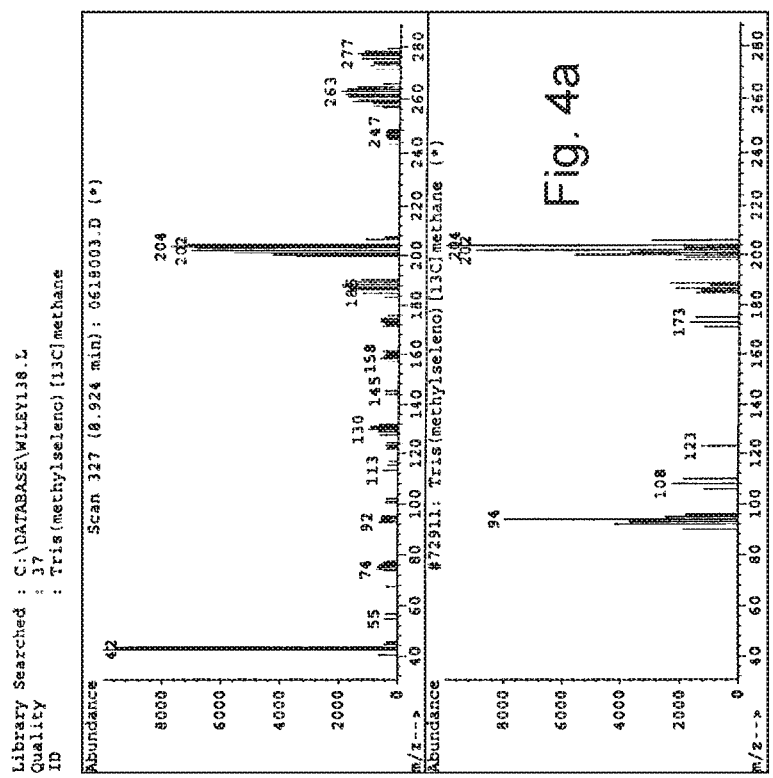

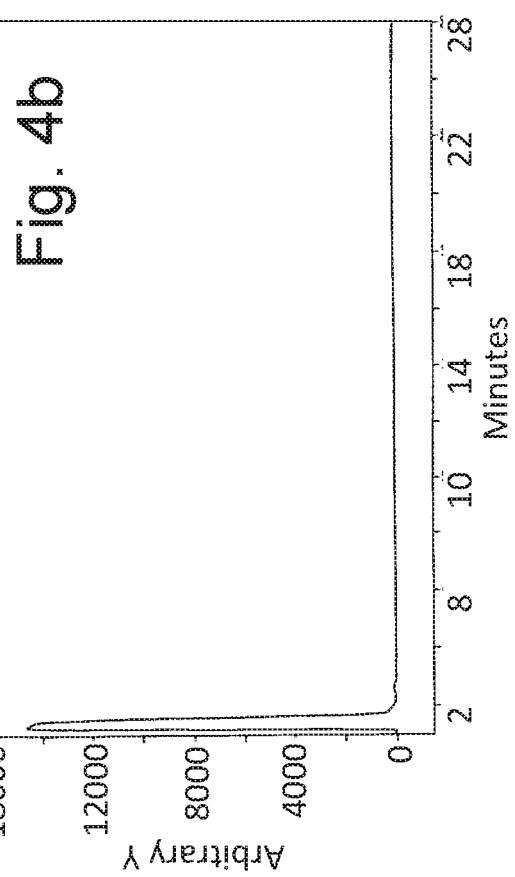

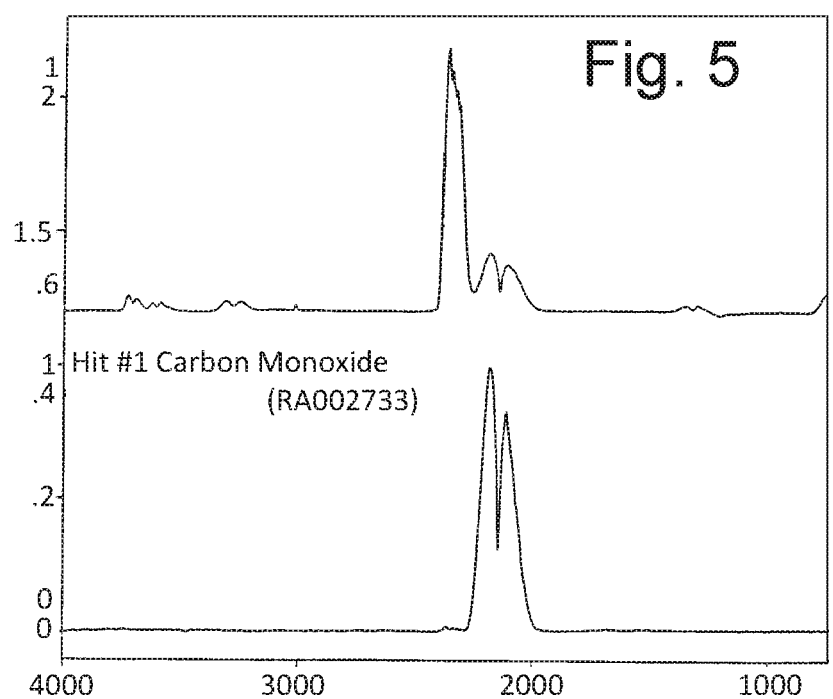

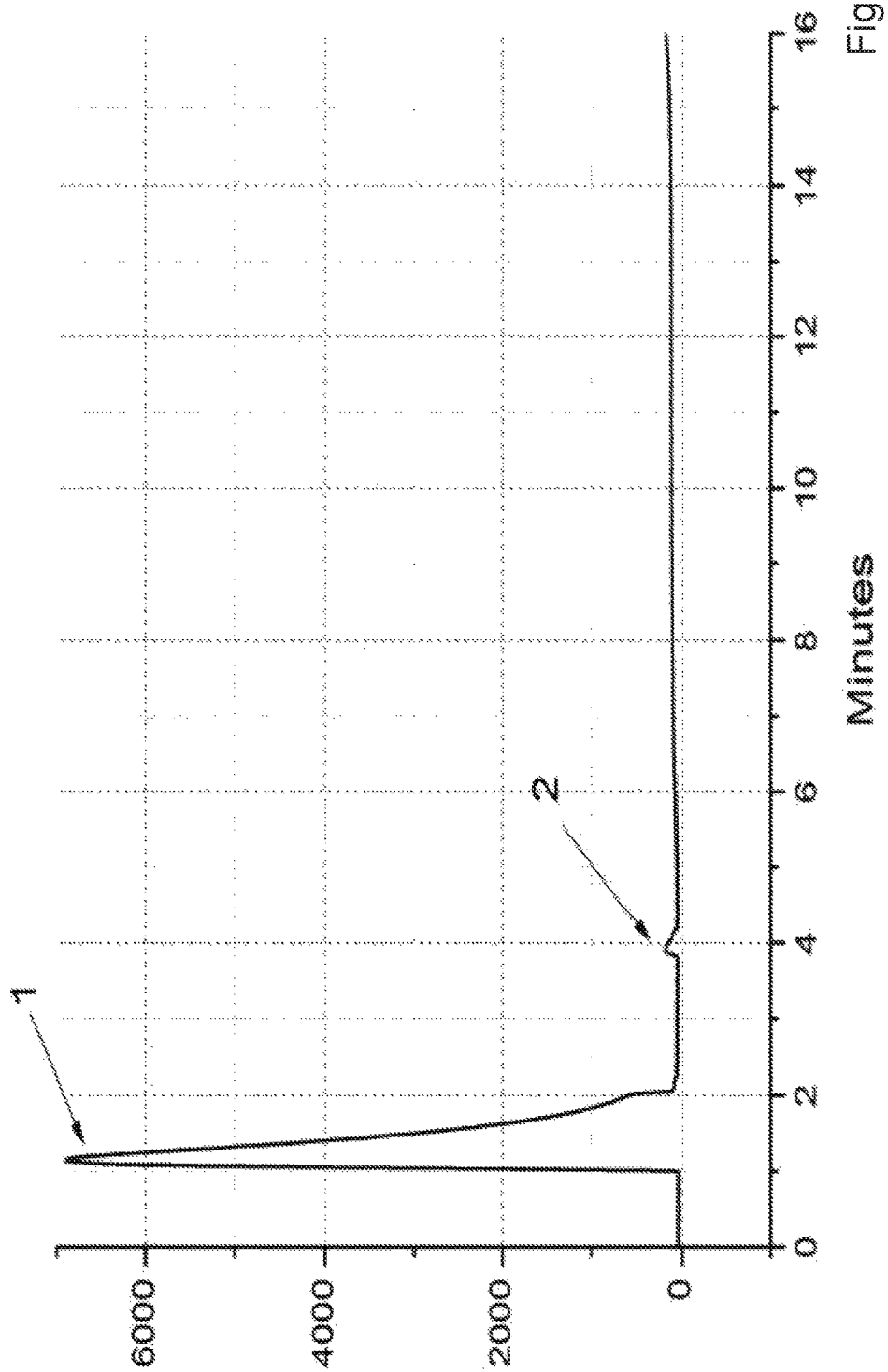

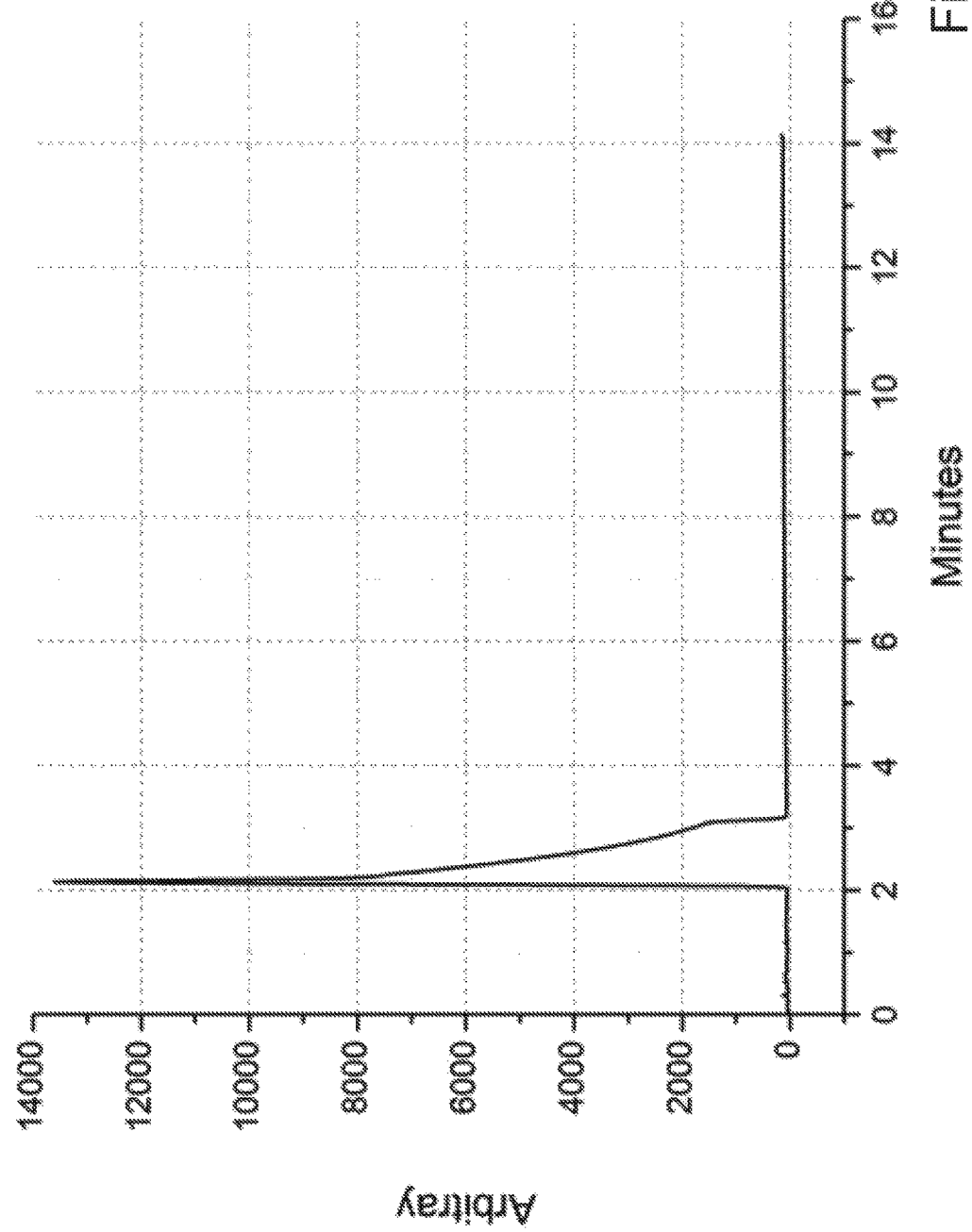

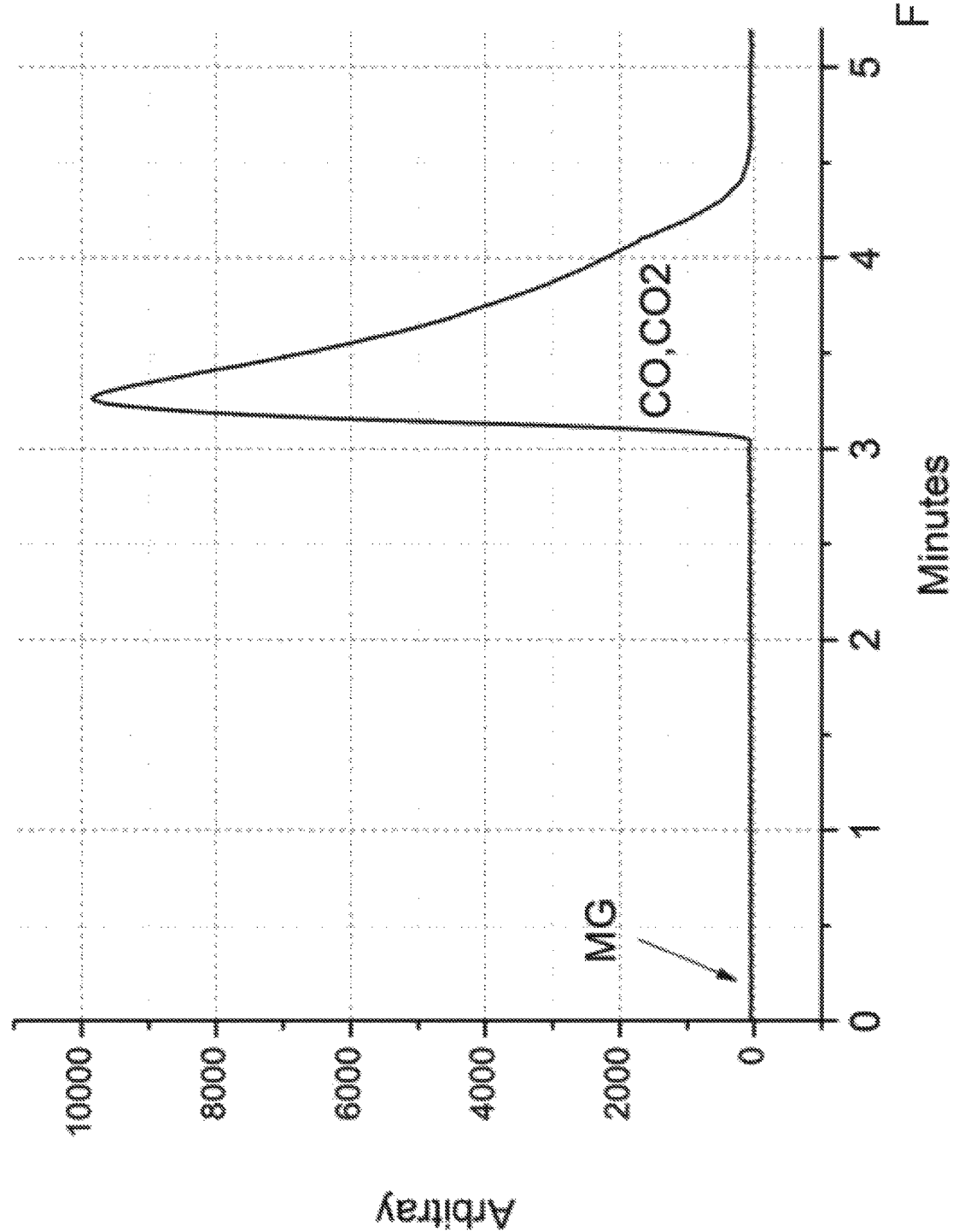

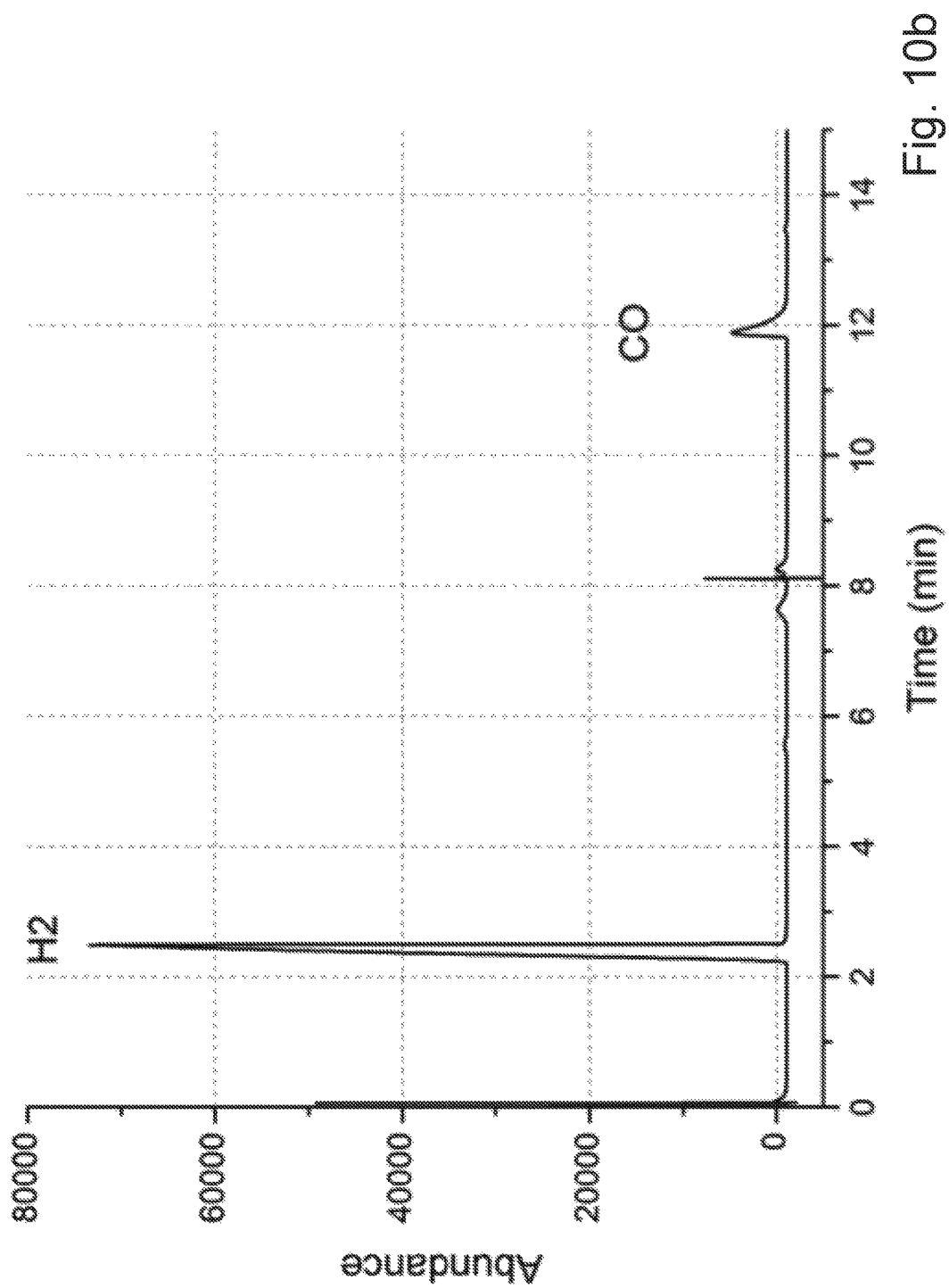

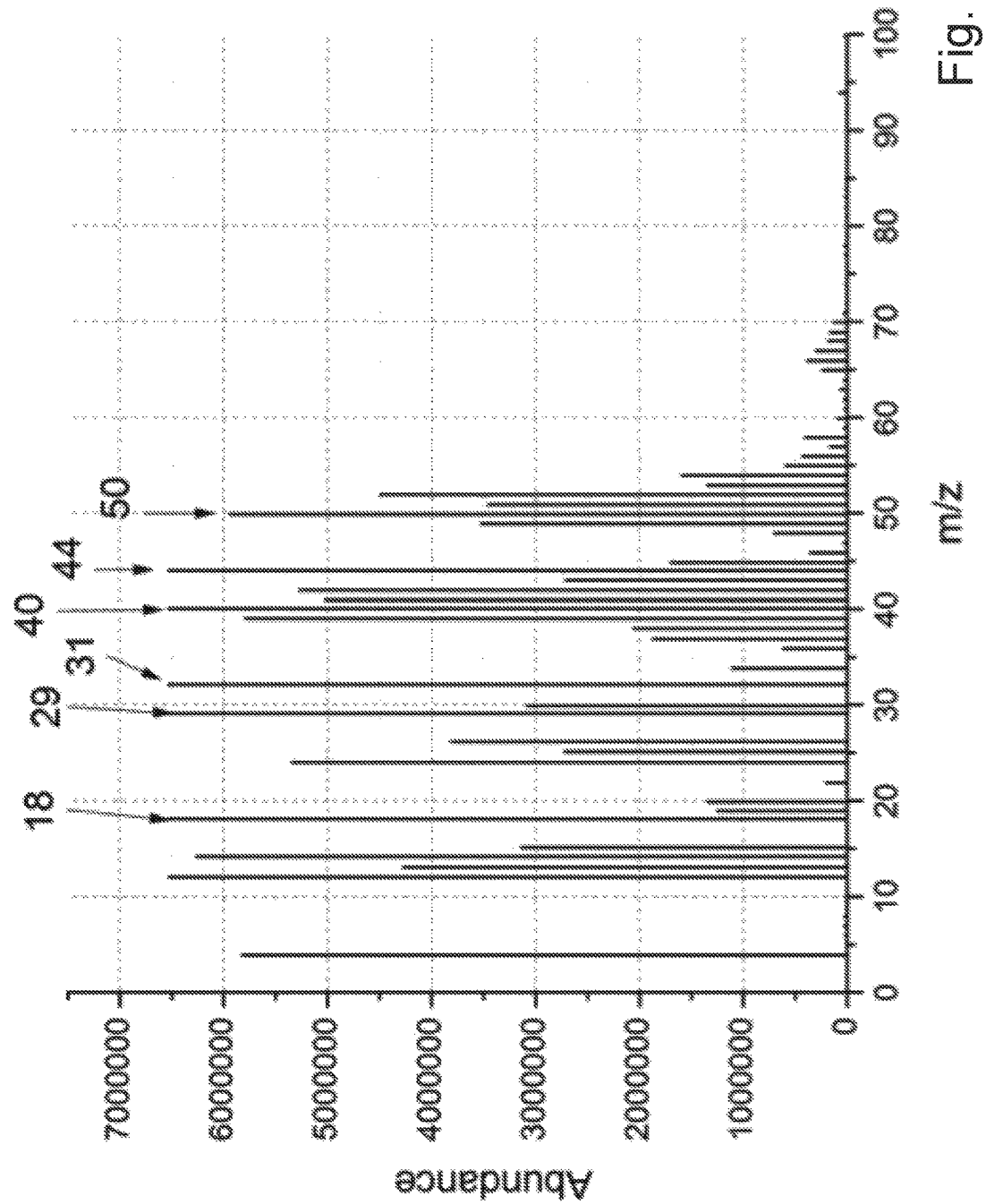

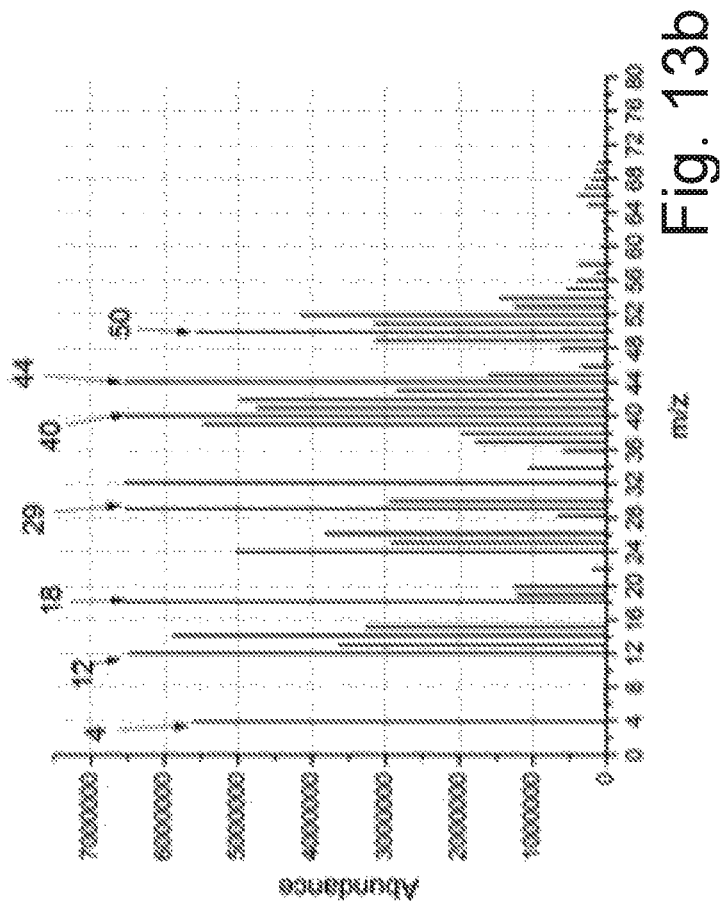

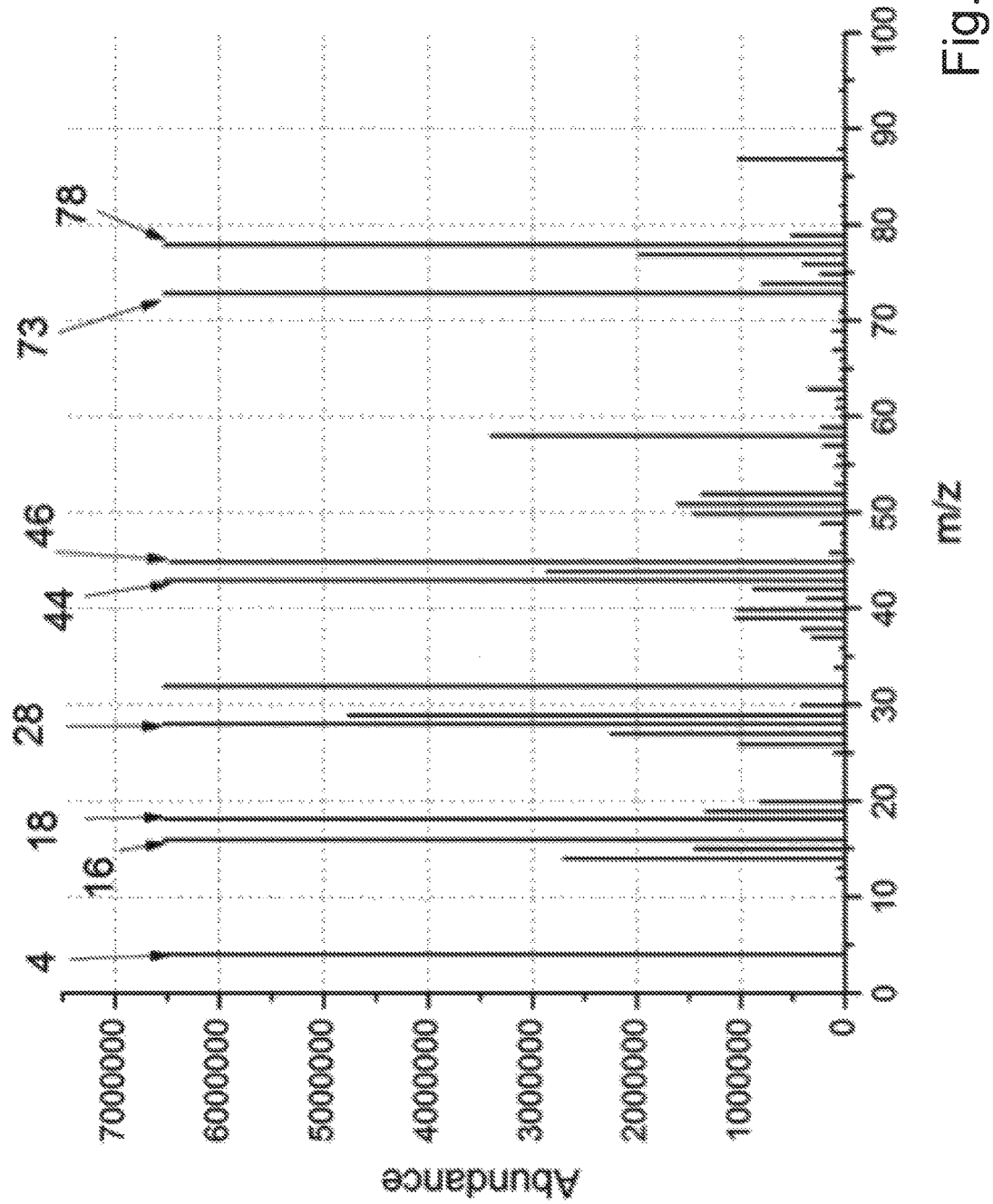

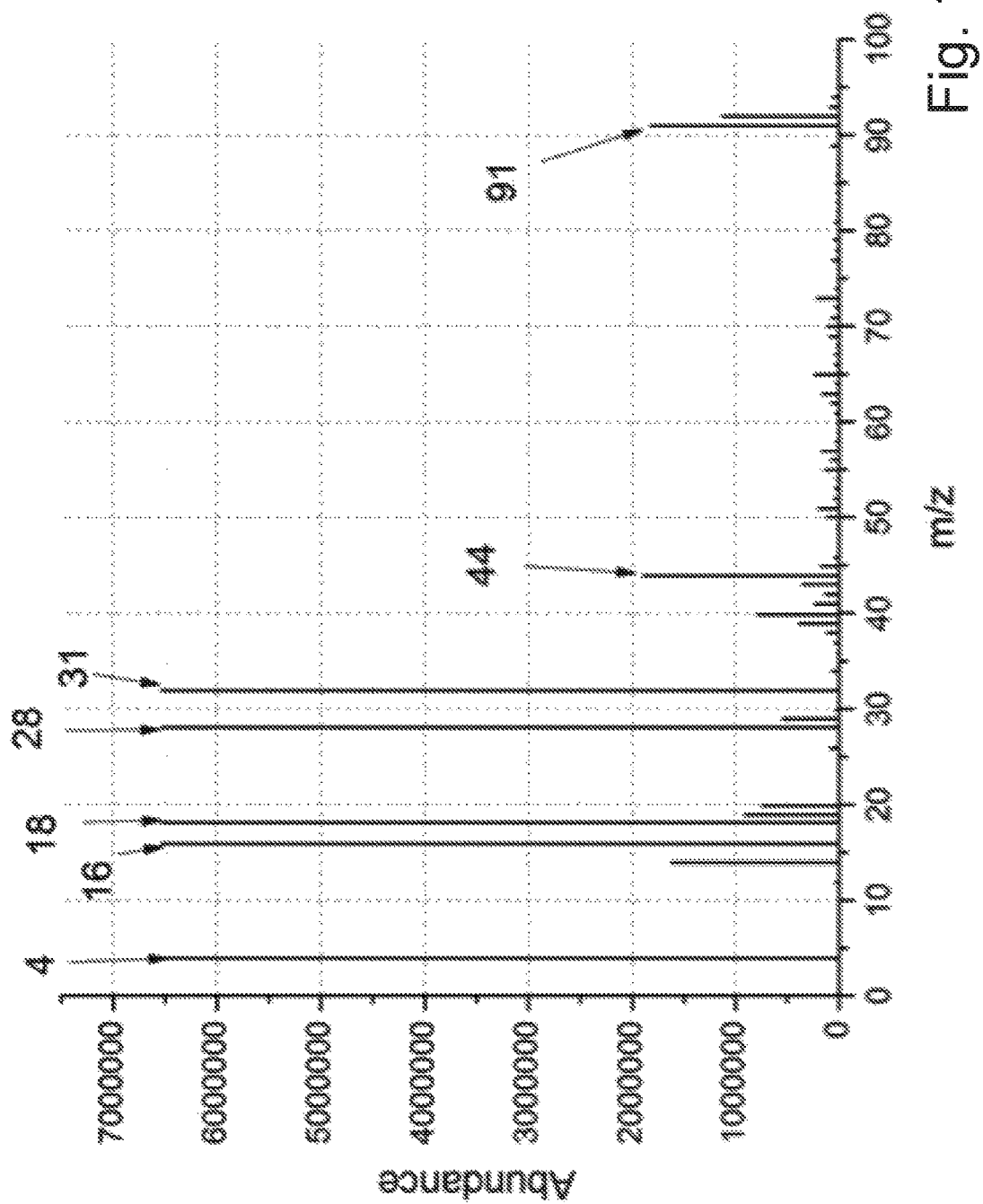

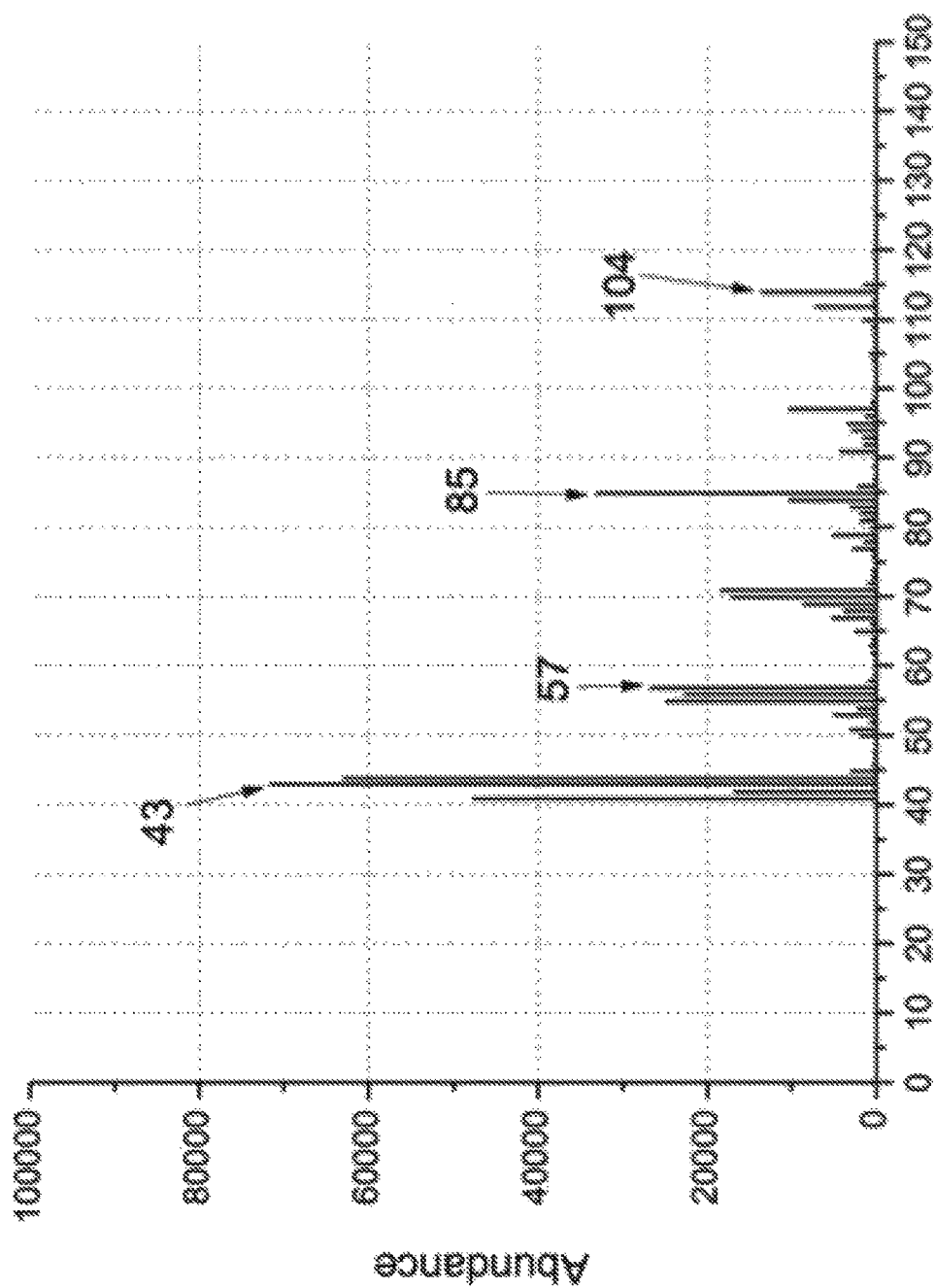

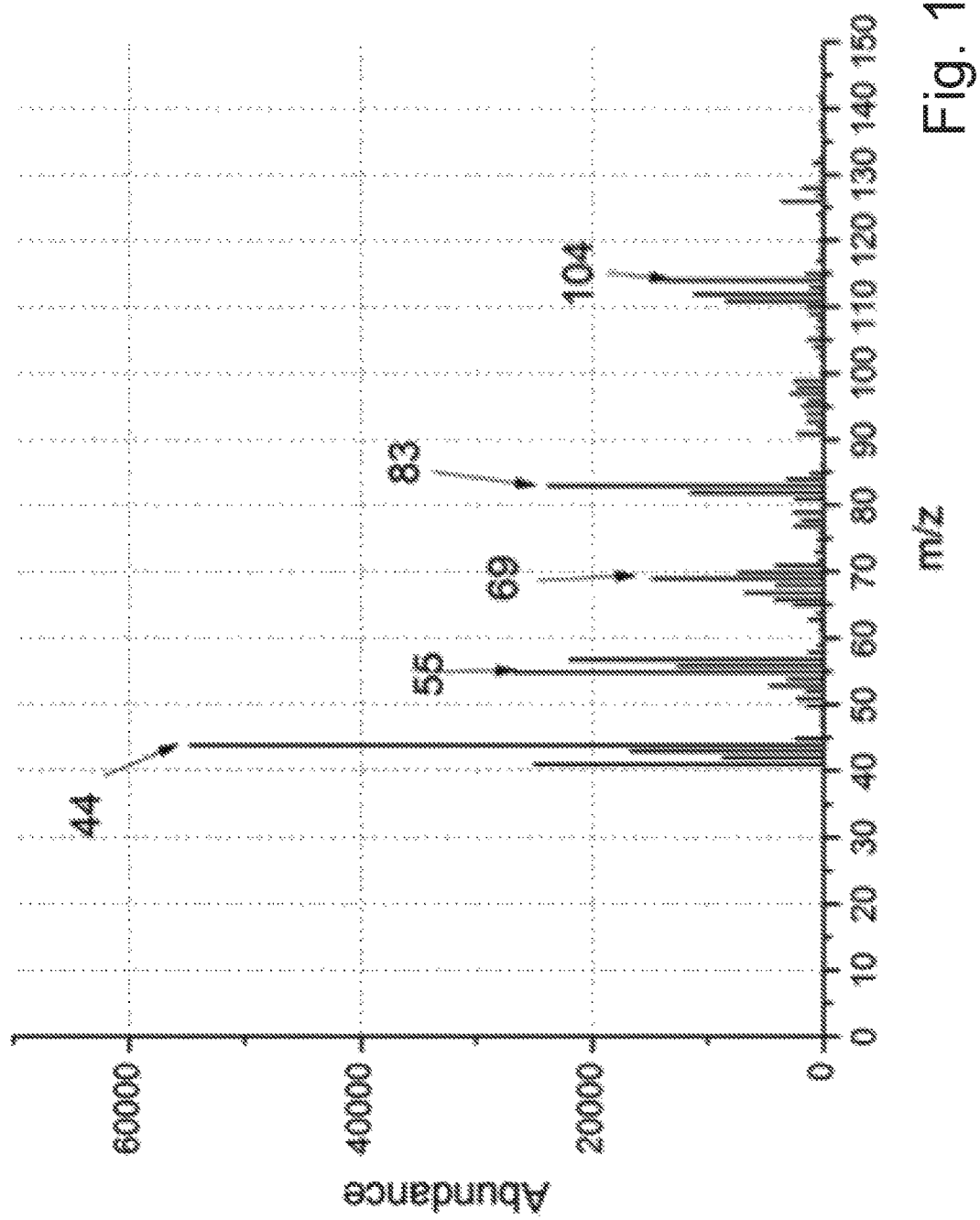

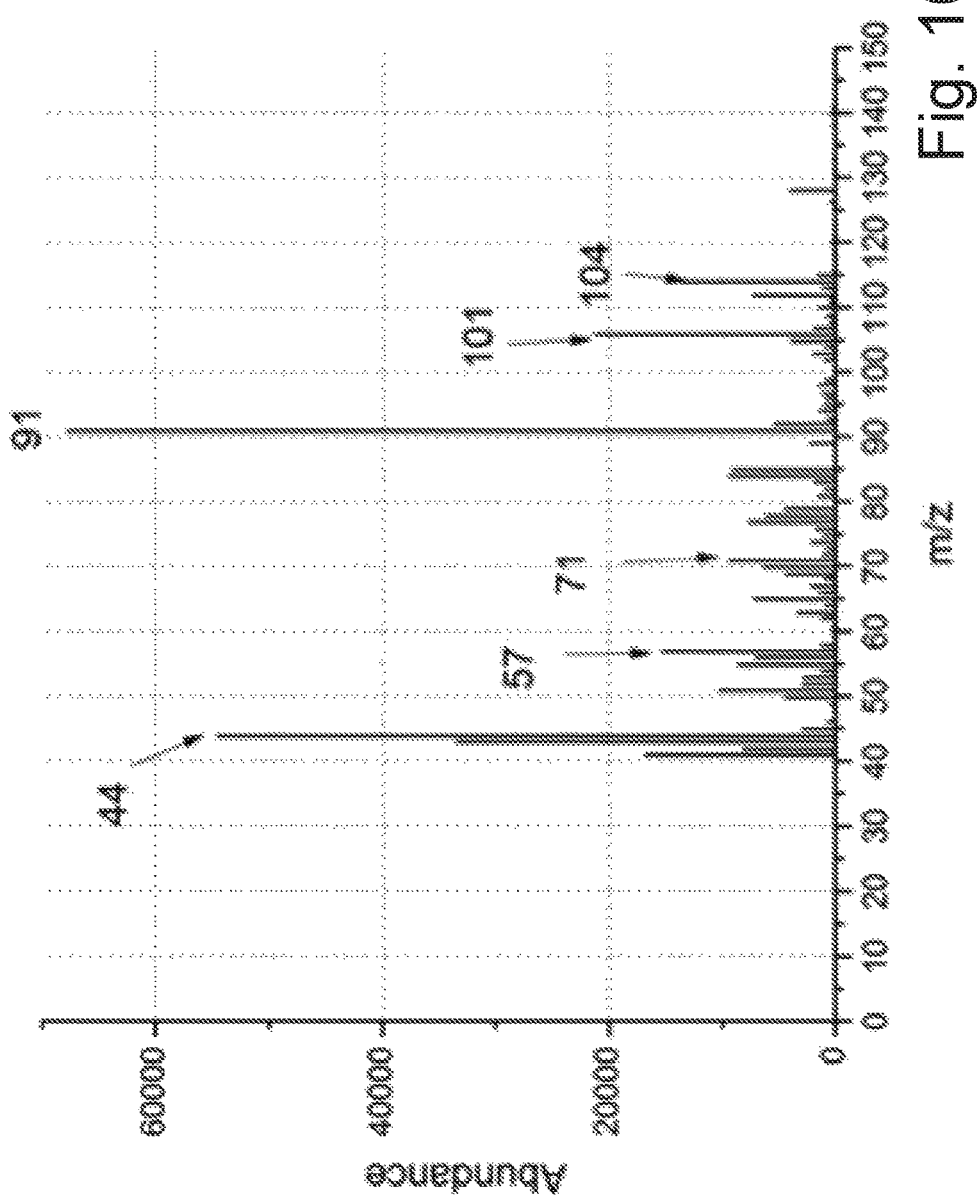

Fig. 19

| ORS REPORT NO. | 185343-001 | | | | |
|---|---|---|---|---|---|
| DATE TESTED | 4/10/2010 | | | | |
| QUANTITY TESTED | 7 | | | | |
| PACKAGE TYPE | standard | | | | |
| SAMPLE | ID | A | B | 1 | 2 |
| Mass | 2 | 1,531 | 3,343 | 288,163 | 185,549 |
| Mass | 3 | 0 | 236 | 49,815 | 438,891 |
| Mass | 4 | 0 | 203 | 12,648,080 | 12,342,540 |
| Mass | 5 | 0 | 0 | 332 | 933 |
| Mass | 6 | 0 | 0 | 13,260 | 12,020 |
| Mass | 7 | 1,507 | 1,185 | 0 | 0 |
| Mass | 8 | 380 | 0 | 0 | 0 |
| Mass | 11 | 160 | 122 | 0 | 0 |
| Mass | 12 | 619 | 158,821 | 4,850 | 9,025 |
| Mass | 13 | 0 | 1,781 | 449 | 400 |
| Mass | 14 | 887,617 | 745,201 | 57,902 | 11,191 |
| Mass | 15 | 3,525 | 2,392 | 1,875 | 1,578 |
| Mass | 16 | 286,293 | 259,183 | 24,627 | 16,952 |
| Mass | 17 | 14,875 | 15,487 | 2,269 | 12,165 |
| Mass | 18 | 50,806 | 52,423 | 10,248 | 104,140 |
| Mass | 19 | 53 | 11,475 | 3,242 | 8,594 |
| Mass | 20 | 12,301 | 11,149 | 8,302 | 71,458 |
| Mass | 21 | 0 | 0 | 0 | 729 |
| Mass | 22 | 0 | 19,942 | 222 | 159 |
| Mass | 23 | 0 | 61 | 0 | 0 |
| Mass | 24 | 0 | 0 | 182 | 218 |
| Mass | 25 | 0 | 0 | 633 | 240 |
| Mass | 26 | 220 | 180 | 2,838 | 1,408 |
| Mass | 27 | 0 | 0 | 873 | 878 |
| Mass | 28 | 8,188,280 | 7,056,760 | 536,530 | 125,200 |
| Mass | 29 | 57,521 | 49,468 | 4,334 | 2,548 |
| Mass | 30 | 10,389 | 8,393 | 3,618 | 5,306 |
| Mass | 31 | 0 | 101 | 178 | 1,601 |
| Mass | 32 | 1,880,953 | 96,766 | 118,498 | 13,475 |
| Mass | 33 | 1,339 | 0 | 139 | 483 |
| Mass | 34 | 7,608 | 365 | 577 | 1,449 |
| Mass | 35 | 0 | 0 | 0 | 225 |
| Mass | 36 | 409 | 313 | 0 | 1,848 |
| Mass | 37 | 0 | 0 | 0 | 79 |
| Mass | 38 | 123 | 61 | 0 | 119 |
| Mass | 39 | 301 | 0 | 308 | 433 |
| Mass | 40 | 97,549 | 80,615 | 5,857 | 563 |
| Mass | 41 | 463 | 81 | 209 | 328 |
| Mass | 42 | 225 | 0 | 197 | 317 |
| Mass | 43 | 480 | 0 | 113 | 295 |
| Mass | 44 | 5,795 | 1,806,671 | 14,262 | 13,828 |
| Mass | 45 | 166 | 20,644 | 199 | 265 |
| Mass | 46 | 60 | 7,265 | 98 | 159 |
| Mass | 47 | 0 | 109 | 0 | 0 |
| Mass | 48 | 0 | 0 | 0 | 0 |

Fig. 21b

|  | H2 | air |
|---|---|---|
| 5 psi | -0.2022 | -27.5648 |
|  | -0.2013 | -27.4421 |
|  | -0.199 | -27.1286 |
|  | -0.2009 | -27.3876 |
| 0 psi | -0.1458 | -27.8265 |
|  | -0.1459 | -27.8456 |
|  | -0.1472 | -28.0937 |

Fig. 21a

|  | H2 | air |
|---|---|---|
| 15 psi | -0.3018 | -27.8709 |
|  | -0.3003 | -27.7323 |
|  | -0.3026 | -27.9447 |
|  | -0.3015 | -27.8432 |
| 10 psi | -0.2439 | -26.8554 |
|  | -0.245 | -26.9765 |
|  | -0.2447 | -26.9435 |
|  | -0.2445 | -26.9215 |

|  | He | air |
|---|---|---|
| 15 psi | -0.2776 | -25.636 |
|  | -0.278 | -25.673 |
|  | -0.2773 | -25.6083 |
|  | -0.2776 | -25.636 |
| 10 psi | -0.2241 | -24.6752 |
|  | -0.2263 | -24.9175 |
|  | -0.225 | -24.7743 |
|  | -0.2251 | -24.7854 |

|  | He | air |
|---|---|---|
| 5 psi | -0.1871 | -25.5063 |
|  | -0.1868 | -25.4654 |
|  | -0.1865 | -25.4245 |
|  | -0.1868 | -25.4654 |
| 0 psi | -0.1351 | -25.7844 |
|  | -0.135 | -25.7653 |
|  | -0.1376 | -26.2615 |
|  | -0.136 | -25.9562 |

Fig. 22b

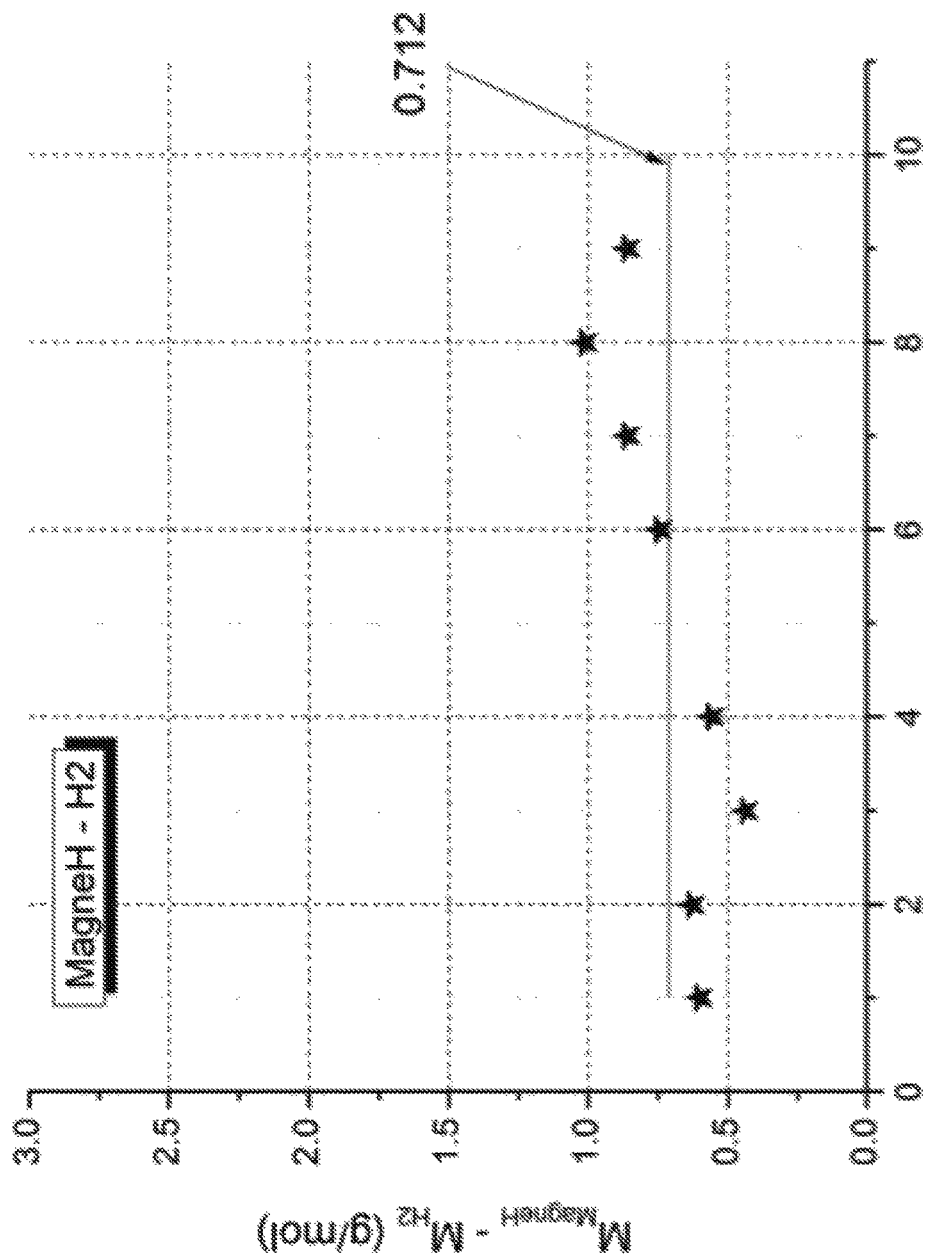

| | | | |
|---|---|---|---|
| ORS REPORT NO. | 196809-001 | | |
| DATE TESTED | 9/5/2012 | | |
| QUANTITY TESTED | 2 | | |
| PACKAGE TYPE | standard | | |
| SAMPLE | ID | EQ09012 | EQ02171 |
| Mass | 2 | 177,131 | 150,391 |
| Mass | 3 | 93,300 | 77,390 |
| Mass | 4 | 354,930 | 397,630 |
| Mass | 5 | 373 | 242 |
| Mass | 6 | 20,779 | 16,402 |
| Mass | 12 | 1,208 | 753 |
| Mass | 13 | 73 | 70 |
| Mass | 14 | 4,517 | 3,051 |
| Mass | 15 | 641 | 518 |
| Mass | 16 | 4,393 | 2,411 |
| Mass | 17 | 9,362 | 3,121 |
| Mass | 18 | 39,386 | 12,362 |
| Mass | 19 | 5,922 | 2,123 |
| Mass | 20 | 17,950 | 4,954 |
| Mass | 22 | 178 | 0 |
| Mass | 24 | 239 | 0 |
| Mass | 26 | 1,043 | 236 |
| Mass | 27 | 466 | 320 |
| Mass | 28 | 43,690 | 28,234 |
| Mass | 29 | 1,186 | 881 |
| Mass | 30 | 1,305 | 382 |
| Mass | 31 | 228 | 0 |
| Mass | 32 | 7,328 | 5,828 |
| Mass | 40 | 469 | 337 |
| Mass | 42 | 137 | 0 |
| Mass | 43 | 459 | 456 |
| Mass | 44 | 11,546 | 8,718 |
| Mass | 45 | 399 | 375 |
| Mass | 46 | 137 | 0 |
| Mass | 73 | 320 | 336 |

Fig. 24

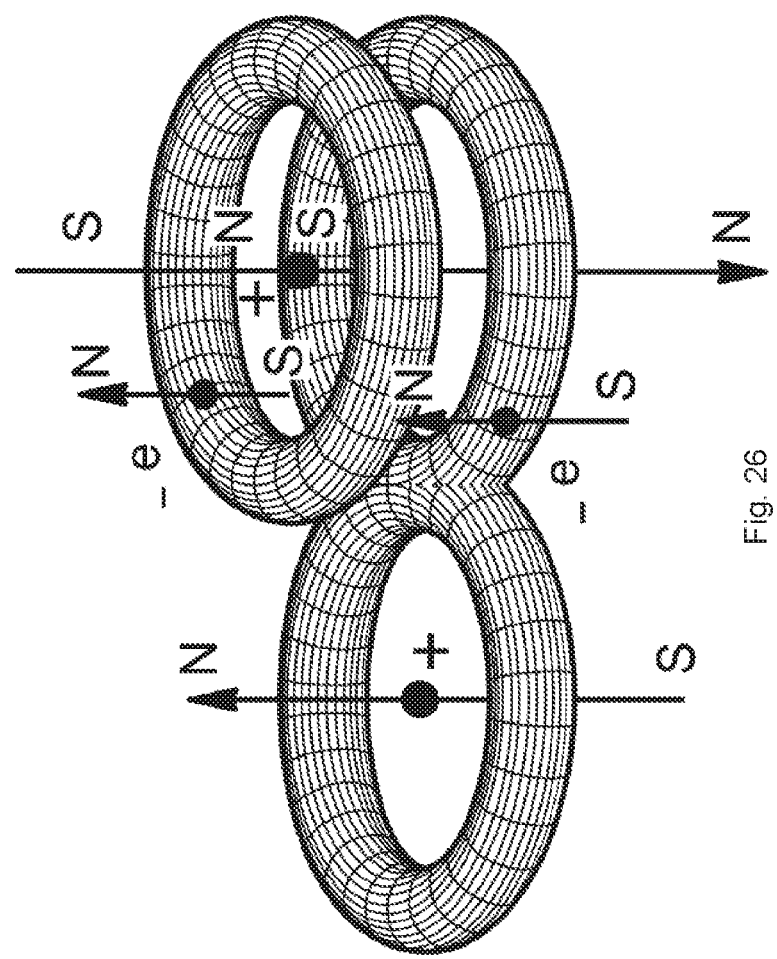
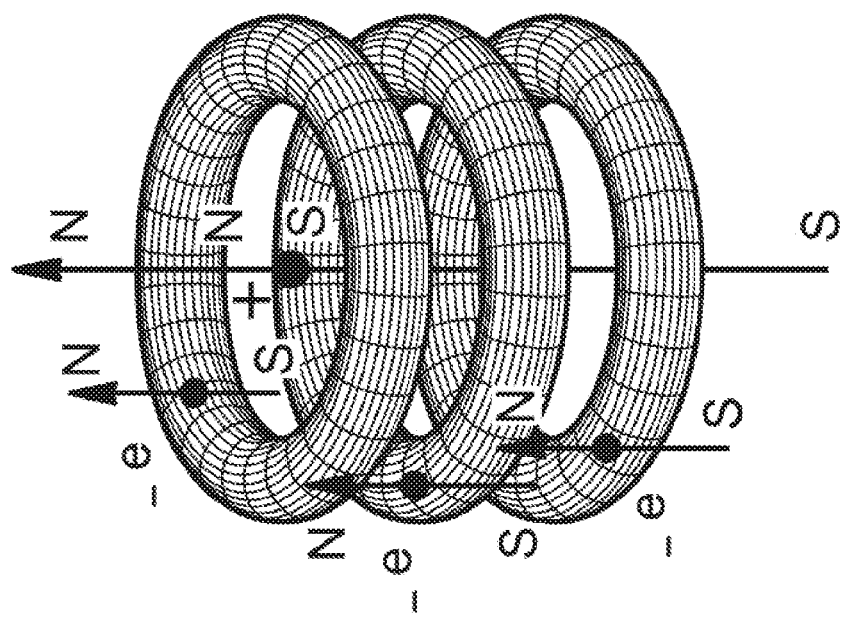
Fig. 26

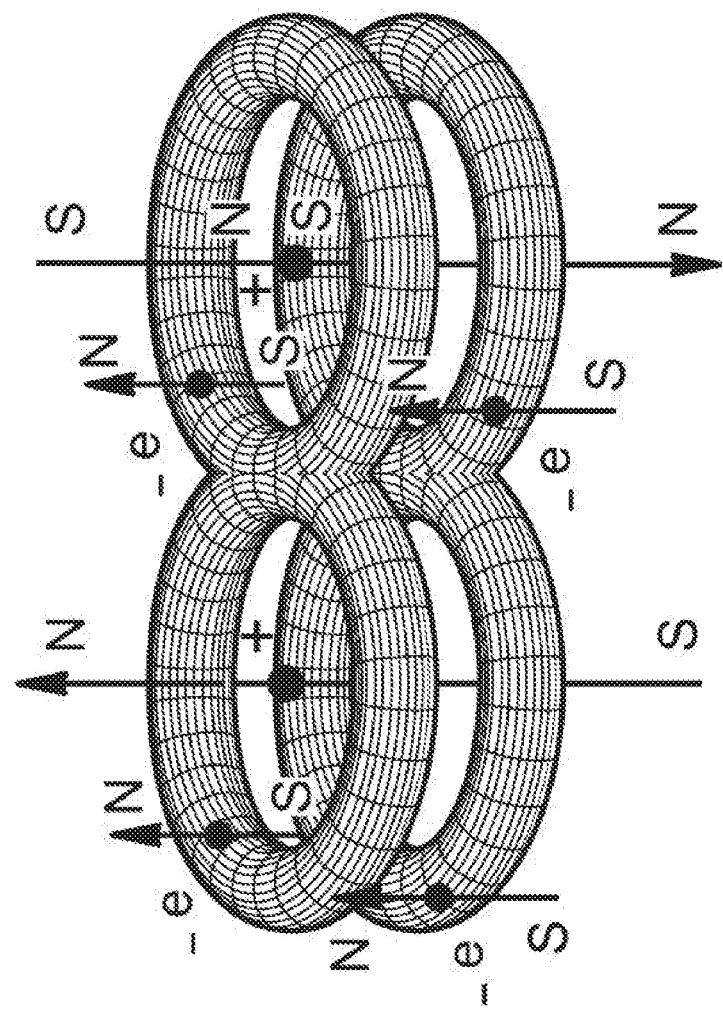
Fig. 27
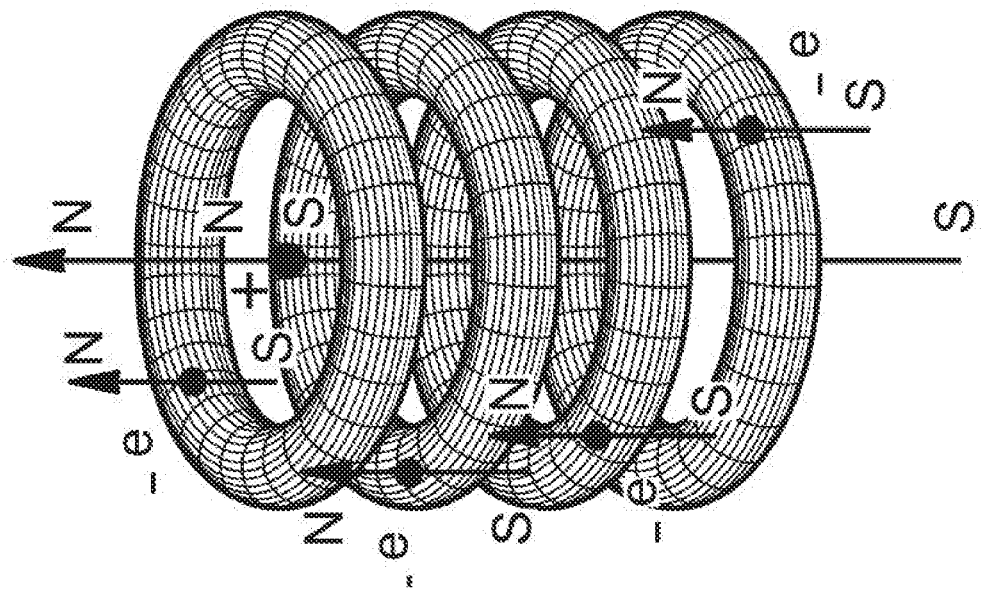

ORS REPORT NO. 196379-001
DATE TESTED 8/7/2012
QUANTITY TESTED 1
PACKAGE TYPE MAGNEGAS CYLINDER

| SAMPLE | ID | 1 | SAMPLE | ID | 1 |
|---|---|---|---|---|---|
| Mass | 2 | 4,732,984 | Mass | 40 | 15,538 |
| Mass | 3 | 3,693 | Mass | 41 | 31,231 |
| Mass | 6 | 371 | Mass | 42 | 18,092 |
| Mass | 11 | 41 | Mass | 43 | 8,817 |
| Mass | 12 | 100,209 | Mass | 44 | 48,816 |
| Mass | 13 | 70,767 | Mass | 45 | 1,189 |
| Mass | 14 | 106,530 | Mass | 46 | 226 |
| Mass | 15 | 407,928 | Mass | 48 | 287 |
| Mass | 16 | 485,703 | Mass | 49 | 1,496 |
| Mass | 17 | 9,663 | Mass | 50 | 4,345 |
| Mass | 18 | 3,436 | Mass | 51 | 2,955 |
| Mass | 19 | 1,190 | Mass | 52 | 3,280 |
| Mass | 22 | 436 | Mass | 53 | 2,480 |
| Mass | 24 | 36,642 | Mass | 54 | 2,931 |
| Mass | 25 | 124,295 | Mass | 55 | 1,494 |
| Mass | 26 | 600,569 | Mass | 56 | 1,886 |
| Mass | 27 | 199,348 | Mass | 57 | 199 |
| Mass | 28 | 1,893,663 | Mass | 58 | 271 |
| Mass | 29 | 62,519 | Mass | 63 | 82 |
| Mass | 30 | 9,496 | Mass | 65 | 246 |
| Mass | 31 | 1,017 | Mass | 66 | 328 |
| Mass | 32 | 20,274 | Mass | 67 | 269 |
| Mass | 34 | 82 | Mass | 68 | 120 |
| Mass | 36 | 1,296 | Mass | 70 | 136 |
| Mass | 37 | 5,843 | Mass | 73 | 417 |
| Mass | 38 | 7,803 | Mass | 77 | 82 |
| Mass | 39 | 30,692 | Mass | 78 | 346 |

METHOD AND APPARATUS FOR THE INDUSTRIAL PRODUCTION OF NEW HYDROGEN-RICH FUELS

CROSS-REFERENCE TO RELATED APPLICATION

This application is continuation-in-part of patent application Ser. No. 14/244,229, filed Apr. 3, 2014, which in turn is a non-provisional application of provisional patent application Ser. No. 61/808,951, filed Apr. 5, 2013. The contents of both are incorporated by reference.

FIELD

This invention relates to the field of molecular science and more particularly to a system for polarization of the orbits of atomic electrons via sufficiently strong magnetic fields suitable to create in the atomic structure not existing in the natural state of said atoms.

BACKGROUND

In U.S. Pat. No. 6,673,322 which is incorporated by reference, theoretical and experimental evidence on the existence of the new chemical species of magnecules defined as clusters of individual atoms (H, O, C, etc.), dimers (HO, CH, etc.) and ordinary molecules ($H_2$, CO, $H_2O$, etc.) bonded together by attractive forces between opposing magnetic polarities of toroidal polarizations of atomic orbitals, as well as the polarization of the magnetic moments of nuclei and electrons (a conceptual rendering is shown in FIG. 1).

The name "magnecules" is used to distinguish the new species from conventional "molecules" (namely stable clusters of atoms solely under the conventional valence bond), as well as to indicate the primary magnetic origin of the new bond. The dash symbol "—" is widely used to denote valence bond (such as H—H) while the multiplication symbol "×" is used to denote magnecular bond (such as H×H).

An assertion of the above patent is that the toroidal polarization of the electron orbitals creates a magnetic field (due to the rotation of the electrons within said toroid) which does not exist for the same atom when the electron orbitals have the conventional spherical distribution.

When two so polarized atoms are at a sufficiently close distance, the resulting total force between the two atoms is attractive because all acting forces are attractive except for the repulsive forces due to nuclear and electron charges. However, the latter forces can be averaged to zero in first approximation since the individual atoms have a null total charge. Alternatively, individual atoms can be assumed in first approximation to have a null total charge distribution, resulting in the evident dominance of the attractive magnetic forces between two atoms with toroidal polarization of their orbitals as shown in FIG. 1.

U.S. Pat. No. 6,673,322 discloses the creation of a gas with the new magnecular chemical structure, currently in industrial production known as MagneGas™. In this, the polarization of the electron orbitals from their natural spherical distribution to the needed toroidal form requires extremely high magnetic fields (expected to be of the order of $10^{10}$ Gauss or more) that, as such, are not available in our macroscopic environment.

Therefore, for the creation of the new magnecular species, a DC electric arc between graphite electrodes submerged within a liquid (e.g., distilled water) is used. The arc decomposes the liquid molecules into mostly ionized atoms by creating between the tip of the electrodes a plasma composed by H, C, and O individual atoms, CH and OH dimers and ordinary molecules such as CO, $H_2O$ and others. At atomic distances from said electric arc, the magnetic field does indeed have the desired strength since said magnetic field is inversely proportional to the distance (on the order of $10^{-8}$ cm) and directly proportional to the electric current (on the order of $10^3$ ampere or more), thus having a strength on the order of $10^{11}$ Gauss which is sufficient to achieved the desired toroidal polarizations of the electron orbitals (see FIG. 2).

Additionally, the strong magnetic field surrounding a DC arc naturally aligns polarized atoms in the needed sequence of magnetic polarities South-North-South-North, etc. resulting in the configuration shown in FIG. 1.

As soon as the arc abates, the atoms return to their natural spherical distribution due to collisions and other reasons. The main argument is that the spherical distribution is indeed recovered but for the bonded pairs of polarized atoms as shown in FIG. 1. This spherical distribution cannot be returned to for each individual atom of the bonded pair due to insufficient energies to break said bond.

Considerable experimental evidence on the existence of the new species of magnecules for a gas created via the above reviewed method is described in U.S. Pat. No. 6,673,322. In such, measurements were achieved via the use of a Gas Chromatographer Mass Spectrometer equipped with an Infrared Detector, namely a GC-MS/IRD.

All gas chromatographic equipment available in the early 2000's were conceived and developed for the detection of molecules. Therefore, the only possibility available at that time to establish the existence of the new species of magnecules was that of subjecting the same injection, first to detection via the GC-MS and then detection via the IRD.

The identification of clear clusters in the GC-MS that have no IR signature establishes the lack of presence of valence bonds in type indicated clusters, since that would require perfect spherical shape which is impossible for clusters at large a.m.u. values. Once the valence bond was eliminated by experimental evidence, the magnecular bond became the sole plausible alternative due to the means of creation of the species here considered.

U.S. Pat. No. 6,673,322 shows that it was impossible to achieve the same results in a resolutory way via two separate instruments, the GC-MS and the IRD due to the impossibility of matching without ambiguities scans in the GC-MS with scans in a separate IRD.

Gas chromatographic analyses reported in U.S. Pat. No. 6,673,322 were conducted via a GC-MS/IRD consisting of a HP GC model 5890, a HP MS model 5972, and a HP IRD model 5965 operated in rather unusual conditions described in details, such as: largest available feeding line of at least 0.3 mm ID; cryogenic cooling of the feeding line; lowest available column temperature of 100 C; longest available elusion time of about 25 m; and other conditions.

Representative chromatographs out of a considerable number of scans from U.S. Pat. No. 6,673,322 are reported in FIGS. 3, 4, and 5. This reports the confirmation of the results (here not reproduced for brevity) obtained via an identical GC-MS/IRD located.

This patent also provided considerable experimental evidence for the existence of magnecules in liquids, and comments on the expected existence of magnecular bonds in solids.

The scientific literature in the new chemical species of magnecules is now significant. A first update was made available in the monograph by R. M. Santilli, The New Fuels with Magnecular Structure, International Academic Press (2005). A recent comprehensive list of publications in the field has been made by Y. Yang, J. V. Kadeisvili, and S. Marton, in the paper entitled "Experimental confirmation of the new chemical species of Santilli MagneHydrogen," which is expected to publish after the filing of this Patent Application.

Following the original discovery of the new species of magnecules, confirmation was difficult due to a variety of difficulties of one skilled in the art of independent verifications.

The primary difficulty has been the fact that all currently available gas chromatographic equipment has been conceived, developed and tested for the detection of clusters of atoms under the conventional valence bond that, being notoriously strong, allows for comparatively strong detection means (such as ionization, thermal conductivity. etc.) without destroying the species to be detected.

By contrast, magnecular bonds are much weaker than valence bonds by conception and industrial realization, so as to allow full combustion (see U.S. Pat. No. 6,673,322). Therefore, detection equipment and procedures that are unquestionably valid for molecules may in reality destroy the very magnecular species to be detected, unless appraised with care, caution and objectivity.

One of the difficulties is the existence of a very large number of conventional molecules identified so far, apparently of the order of 750,000. Whenever a chemical species is identified in a GC or a GC-MS, it is rather natural for experienced analysts to assume that it merely consists of either a known conventional molecule, or a molecule yet to be identified, thus denying the possibility for chemical novelty. Consequently, testing of gases with magnecular structure at various analytic laboratories around the world turned out to be scientifically sterile.

Another difficulty was caused by the understandable tendency by senior analysts to assume that any chemical anomaly (that is, novelty over established 20th century knowledge) is due to a malfunction of the instrument, in which case all efforts are generally made to modify the operation of the instrument (by increasing the column temperature, decreasing the elusion time, etc.) until conventional results are obtained without any chemical novelty.

Further difficulties have been created by the fact that the chemical novelties of magnecular species are generally dismissed a priori by analysts, thus preventing their serious experimental confirmation or dismissal.

As an example, magnecular gases have an anomalous adhesion to most substances, including paramagnetic ones (because magnetization by induction occurs at the atomic, rather than molecular level). Following a test with a GC-MS and a conventional flushing of the instrument, the background generally retains most of the peaks detected during the normal test (see the documentation in Pat. No. 6,673, 322).

Analysts generally consider this occurrence a malfunction of the instrument, and often send it to the manufacturer for service, rather than admitting an essentially new chemical occurrence deserving inspection.

In reality, the conventional, background is readily recovered by flushing the instrument with a hot inert gas (such as Nitrogen at 400° C.), by confirming in this way the sensitivity of magnecular species on the temperature, as expected for all magnetic polarizations.

Other difficulties occur in detecting magnecules with the recent generation of gas chromatographic equipment using capillary feeding lines, because the lines rapidly clog up following the injection of a magnecular gas due to its anomalous adhesion, thus providing the analyst the mere illusion of analyzing the gas, while in reality the gas to be tested did not reach the column in the necessary volume.

In one case, a major U.S. analytic laboratory equipped with the most advanced GC-MS dismissed its signed report on the commercially produced and sold MagneGas. In essence, the analyst calibrated the GC-MS for air, flushed the instrument via established procedures, injected Magne-Gas into the capillary feeding line, conducted a variety of measurements, and released a signed report according to which MagneGas was contaminated with at least 30% air.

Another analytic laboratory conducted the analysis of MagneGas, first of all, with a GC-MS having a large feeding line, and second by using the proceedings for its proper detection, after which MagneGas resulted as having no air contamination at all.

This decade long inability to repeat the original experimental evidence in the existence of magnecules as depicted in FIGS. 3, 4, and 5 confirmed that the best gas chromatographic equipment for the scope here considered is the original one used by the inventor, namely, a GC-MS/IRD as originally used in 1998.

We are here referring to the principle of jointly testing the same gas with two different spectrometers, the GC-MS for the identification of the clusters composing the species, and the IRD for the verification that the bond responsible for the clusters is not a valence type.

In particular, a molecular interpretation should be accepted not only when the clusters at the GC-MS are identified by the instrument as being known molecules, but also when their known IR signature is confirmed in the IRD at the a.m.u. value of the cluster, and not at smaller a.m.u. values, since the latter refer to the conventional constituent of the cluster. Due to the protracted difficulties with contemporary equipment, the same instruments used during the discovery of magnecules are used, consisting of a GC-MS/IRD consisting of a HP GC model 5890, a HP MS model 5972, and a HP IRD model 5965 equipped with a HP Ultra 2 column 25 m long, 0.32 mm ID, and film thickness of 0.52 um, with temperatures starting at 10° C. for 4 min, then incrementally raised to 250° C. at 10° C./min.

The production and service of the above identified GC-MS/IRD had been discontinued one decade ago. Therefore, the desired instrument had to be restored. Such a restoration was commissioned to Spectral Scientific Incorporation (SSI) 38 McPherson Street, Markham, Ontario, Canada, making sure that there was no "upgrade" made to the instrument, Such an upgrade would have likely prohibited the desired measurements.

Following about two years of laboratory work, SSI delivered the fully restored and operational GC-MS/IRD in early 2012, and tests were initiated immediately thereafter.

The following additional instrument was needed to achieve a comprehensive verification or dismissal of the measurements made in 1998. In essence, the chromatographic equipment that had systematically dismissed the existence of the new species of magnecules is the GC-TCD. However, contemporary GC-TCD are definitely not recommendable for analyses of magnecular gases due to the use of capillary feeding lines and undesired detection procedures.

Consequently, an old GC-TCD comprising a HP model 5890-2T and a HP GC model 5890 Series II equipped with two columns, one being a packed-column 80/100 mesh, and the another being a molecular-Sieve 5A Column. These devices were refurbished by Global Medical Instruments, Inc. 6511 Bunker Lake Blvd, Ramsey, Minn., U.S.A. Again, special attention was made to prevent damaging upgrades during the restoration. Following about one year of laboratory work, the desired instrument was delivered also in full operational conditions in early 2012, and tests were initiated immediately thereafter.

Among a large number of additional chemical analyses of gases with magnecular structure accumulated in a decade of studies, a representative scan was obtained by Oneida Research Services, 8282 Halsey Rd, Whitesboro, N.Y., via IVA 110s equipped with a vacuum chamber (with air-cooled turbomolecular pump), sample inlet with temperature control system and monitor, high performance quadrupole mass spectrometer system, interchangeable electro-pneumatic and manual sample piercing system, electro-pneumatic vacuum isolation valves, inlet pressure monitor for pumpdown, automatic calibration port, computer-controlled sampling valve and valve switching panel (VSP).

The used IVA 110s has a system sensitivity better than 100 ppmv for moisture and better than 10 ppmv for other gases and a system accuracy of 5% at 5000 ppmv. Also, the IVA 110s utilizes a NIST (National Institute of Standards and Technology) Mass Spec Database of more than 250,000 spectra with IVACS interface for use in identification of unknowns. Systematic measurements were conducted on MagneGas fuel that confirmed all originally claimed anomalous characteristics of the new species of magnecules as reported in FIGS. 5 to 33, including:

Characterization of magnecules by weakly bonded individual atoms, dimers, and conventional molecules;
Stability of magnecules at ambient temperature;
Progressive reduction of magnecules with the increase of the temperature;
Termination of magnecules at a suitable Curie temperature;
Detection of magnecular clusters under a suitably selected and operated GC-MS;
Transparency of magnecules to infrared detectors at the a.m.u. of the clusters (and not at smaller a.m.u. characterizing constituents);
Dependence of detected magnecules from the elusion time;
Dependence of magnecular species from filtration and compression;
Anomalous adhesion of magnecular gases to disparate materials;
Anomalous mutation of magnecular clusters under different detection procedures;
Anomalous accretion of magnecular clusters by individual atoms; and other features. Among a considerable number of tests that remains to be done for advances in the new chemical species of Santilli magnecules, we mention the need to achieve experiment identification of molecular and magnecular species having the same a.m.u.

The Figures show a large variety of analyses by qualified independent laboratories, depending on the selected liquid feedstock, MagneGas fuel contains from 30% to 35% Carbon Monoxide referred to the triple-bonded molecule C-O. These analyses are "good faith experimental beliefs," in the sense that the instrument says so and that is believed to be true without due scientific caution caused by the absence of independent chemical analysis on the same gas done with a different instrument.

In the event MagneGas did indeed contain 30% to 35% CO, exhaust from combustion would be expected to contain at least 25% Carbon Dioxide CO2 (since CO is combustible). Independent certification of MagneGas combustion has established the presence of about 5% CO2 in said exhaust, about 0.01% CO, up to 14% breathable Oxygen O2, no appreciable HC and NOx in ppm, the rest being water vapor (since MagneGas contains from 60% to 65% Hydrogen). It is evident that the sole presence in Magnegas exhaust of about 5% CO2 and no appreciable combusted CO does indeed render the 30% to 35% CO in MagneGas a "belief."

U.S. Pat. No. 6,673,322 provides contrasting data. In essence, the chemical species detected by GC-MS in MagneGas at 28 a.m.u. is composed partially by the conventional Carbon Monoxide C—O and partially by the magnecular bond of the same atoms C×O essentially in the configuration of FIG. 1. The high percentage of CO detected in MagneGas by various laboratories is in effect created by the equipment itself. Due to the known affinity between Carbon and Oxygen, the following reaction is in effect a possible reaction C×O+trigger→CO+heat, where the "trigger" is the detection mechanism of the instrument, and the release of heat is due to the fact that molecular bonds are much stronger than magnecular bonds.

Also, high collisions occurring in combustion are expected to breakdown the weakly bound magnecule C×O and produce the excess Oxygen needed to reach a quantitative understanding of the MagneGas exhaust. The above scenario is so unknown that caution is suggested in predicting the percentage of CO in existing in MagneGas from the measured percentage of $CO_2$ in the exhaust (expectedly of about 7%). Available experimental data cannot exclude the possibility that the entire content of the species in MagneGas with 28 a.m.u. can be the magnecule C×O, and the expected 7% CO can, in effect, be created by collisions during combustion.

SUMMARY

In one embodiment, a method for bonding a fluid to a substance is disclosed including exposing the fluid to an electric arc within a first pressure vessel, thereby creating a treated fluid. The substance is exposed to a magnetic field within a second pressure vessel, thereby forming a polarized substance. The treated fluid and polarized substance are combined under a high pressure within a third pressure vessel, thereby exposing the treated fluid to the polarized substance at a pressure sufficient to achieve a bond.

In another embodiment, a method for bonding a fluid to a substance is disclosed including filling a first pressure vessel with the fluid and pressurizing the first pressure vessel to a first pressure. The fluid is the circulated through an electric arc formed within the first pressure vessel, thereby creating a treated fluid. Within a second pressure vessel, the substance is exposed to a magnetic field, thereby forming a polarized substance. The treated fluid and polarized substance are combined under a second pressure within a third pressure vessel, thereby exposing the treated fluid to the polarized substance at a pressure sufficient to achieve a bond.

In another embodiment, an apparatus for the creation of a bond between a gas and a substance is disclosed including at least one pressure vessel containing in its interior at least one set of electrodes, between which an electric arc is created, plumbing for the passing of a gas through the electric arc thereby creating a treated gas, a control system for controlling the electric arc, and plumbing for the collection of the treated gas. At least one pressure vessel includes a device for exposing a substance to a magnetic field, thereby forming a polarized substance. A chamber is included for exposing the treated gas to the polarized substance under pressure, wherein the treated gas is conducted into the polarized substance producing a treated substance.

In another embodiment, an apparatus for bonding a fluid to coal is disclosed including a device for exposing the fluid to at least one electric arc formed between at least one pair of electrodes creating a treated fluid; and a device for exposing the treated fluid to coal.

BRIEF DESCRIPTION OF THE DRAWINGS

The invention can be best understood by those having ordinary skill in the art by reference to the following detailed description when considered in conjunction with the accompanying drawings in which:

FIG. 4a illustrates experimental measurements.
FIG. 4b illustrates experimental measurements.
FIG. 5 illustrates experimental measurements.
FIG. 6b illustrates experimental measurements.
FIG. 8b illustrates experimental measurements.
FIG. 9b illustrates experimental measurements.
FIG. 10b illustrates experimental measurements.
FIG. 13a illustrates experimental measurements.
FIG. 13b illustrates experimental measurements.
FIG. 14a illustrates experimental measurements.
FIG. 14b illustrates experimental measurements.
FIG. 15a illustrates experimental measurements.
FIG. 16a illustrates a magnecular structure composed by a mixture of molecular and magnetically bonds.
FIG. 16b illustrates a magnecular structure composed by a mixture of molecular and magnetically bonds.
FIG. 19 illustrates experimental measurements.
FIG. 21b illustrates experimental measurements.
FIG. 22b illustrates experimental measurements.
FIG. 23 illustrates experimental measurements.
FIG. 24 illustrates experimental measurements.
FIG. 26 illustrates polarized atoms.
FIG. 27 illustrates polarized atoms.
FIG. 30 illustrates experimental measurements.
FIG. 33 illustrates a summary of measurements conducted by scientists of the Institute of UltraFast Spectroscopy and Lasers.

DETAILED DESCRIPTION

Figure 1:
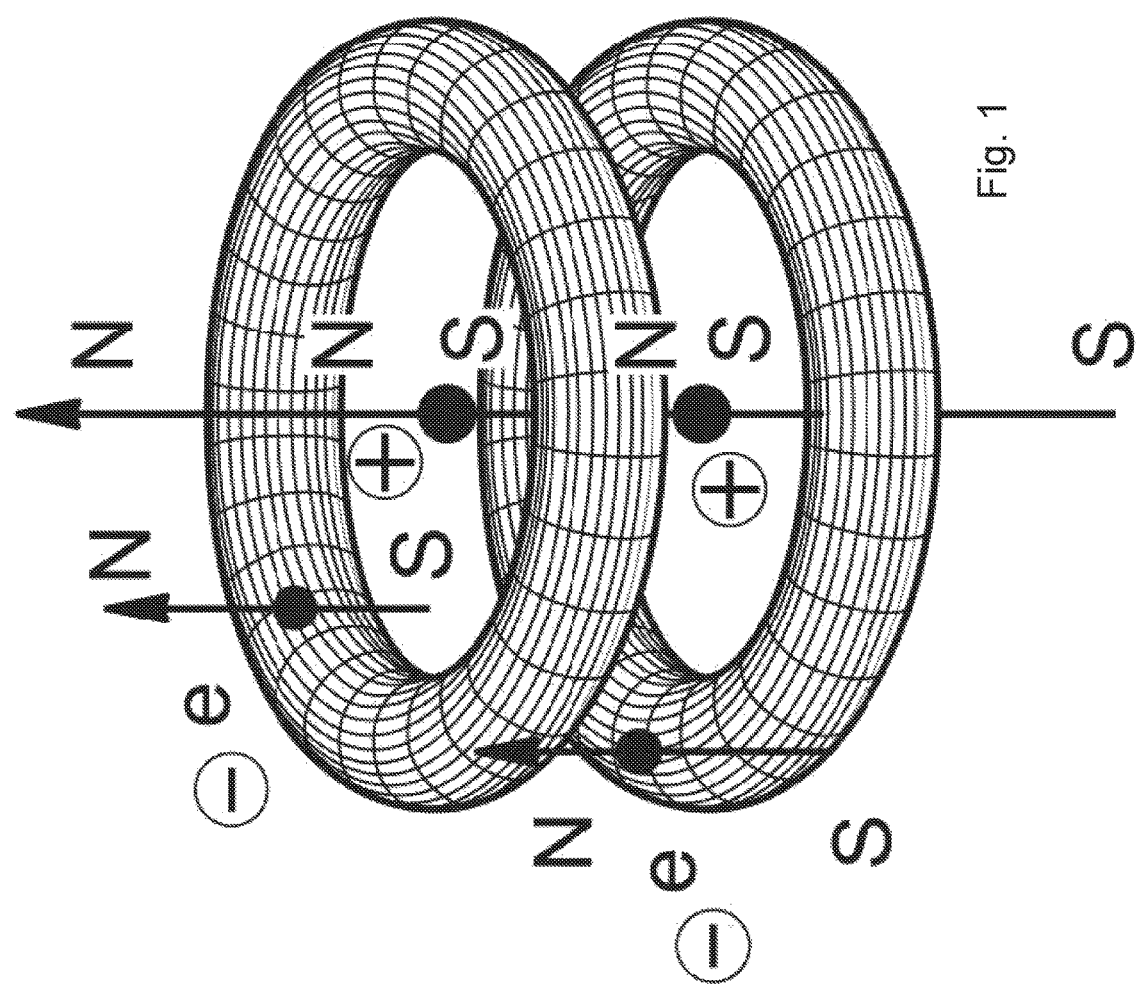
FIG. 1 illustrates a schematic view of toroidal polarizations of the orbits of atomic electrons exposed to magnetic forces.
Figure 2:
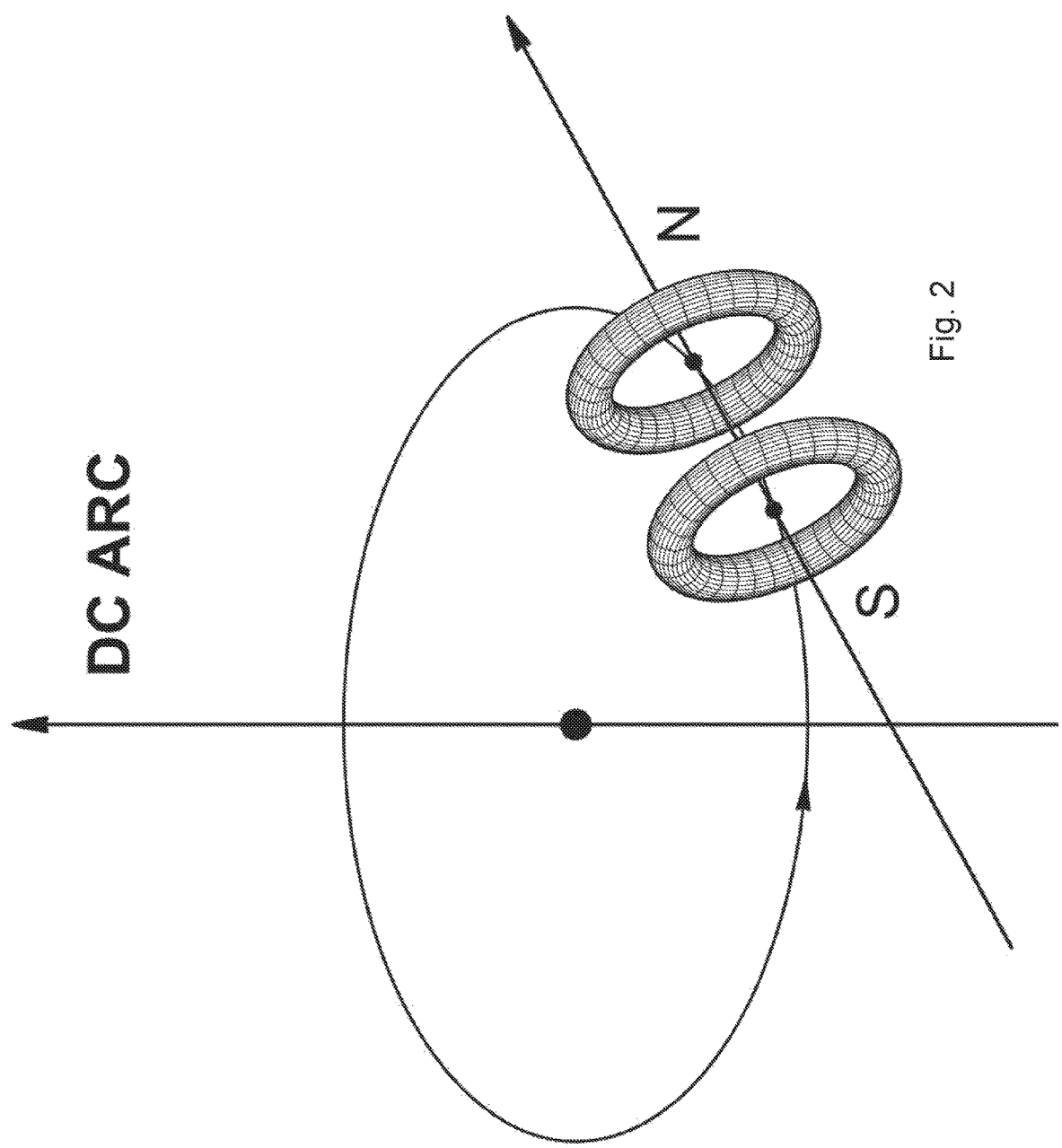
FIG. 2 illustrates a schematic view of toroidal polarizations of the orbits of atomic electrons two atoms exposed to magnetic forces from a DC arc.
Figure 3:
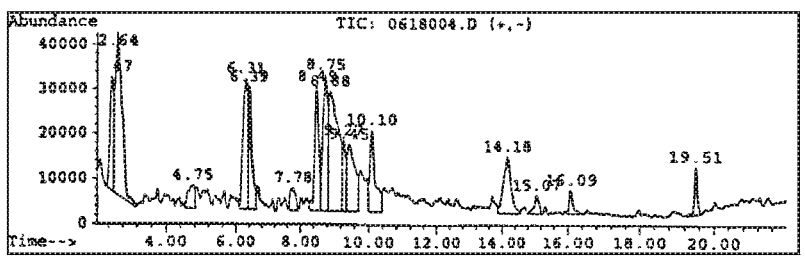
FIG. 3 illustrates experimental measurements.
Figure 6A:
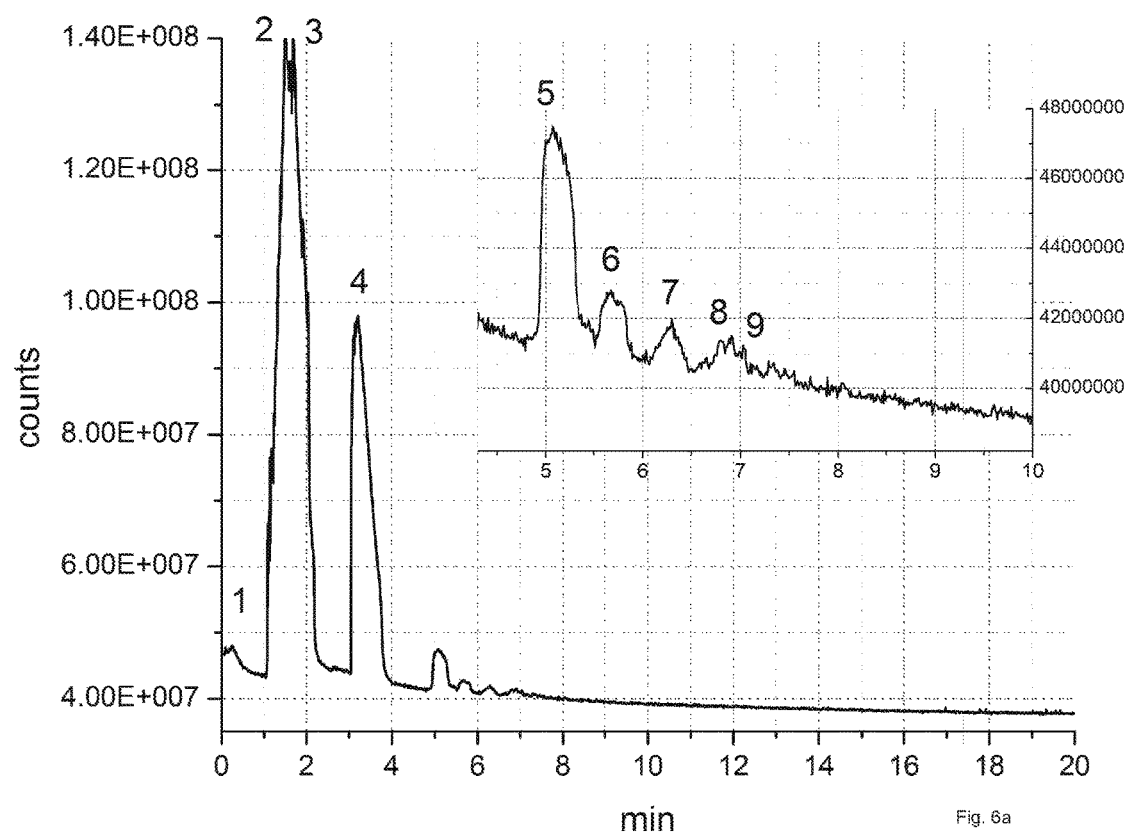
FIG. 6a illustrates experimental measurements.
Figure 7A:
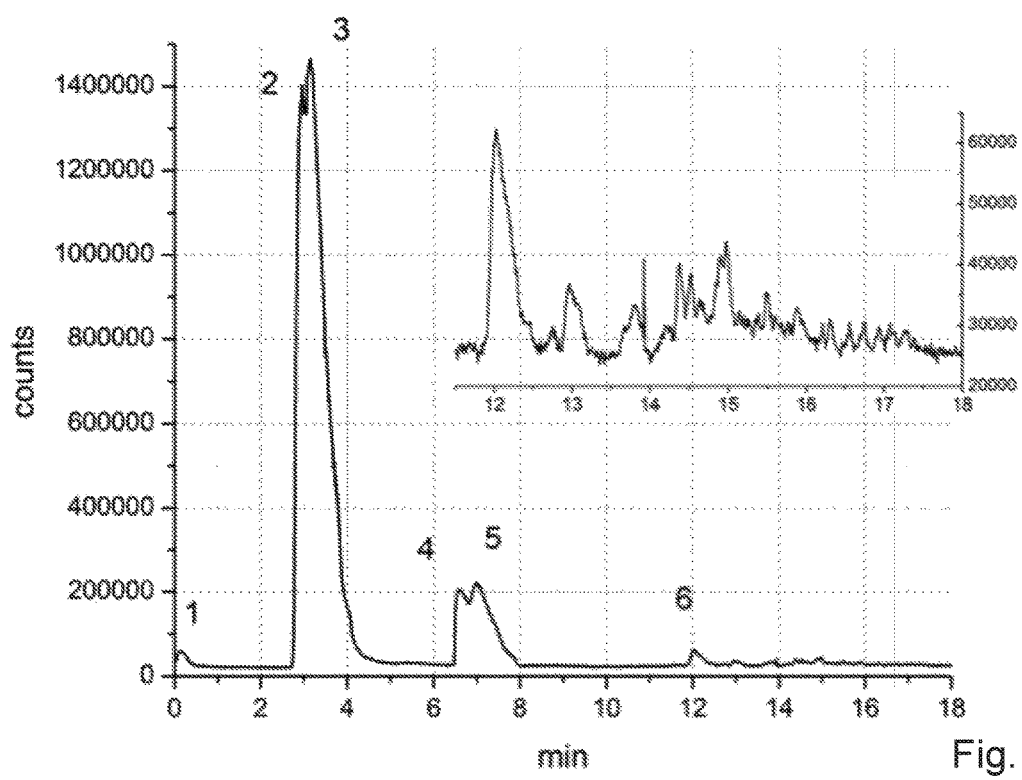
FIG. 7a illustrates experimental measurements.
Figure 7B:
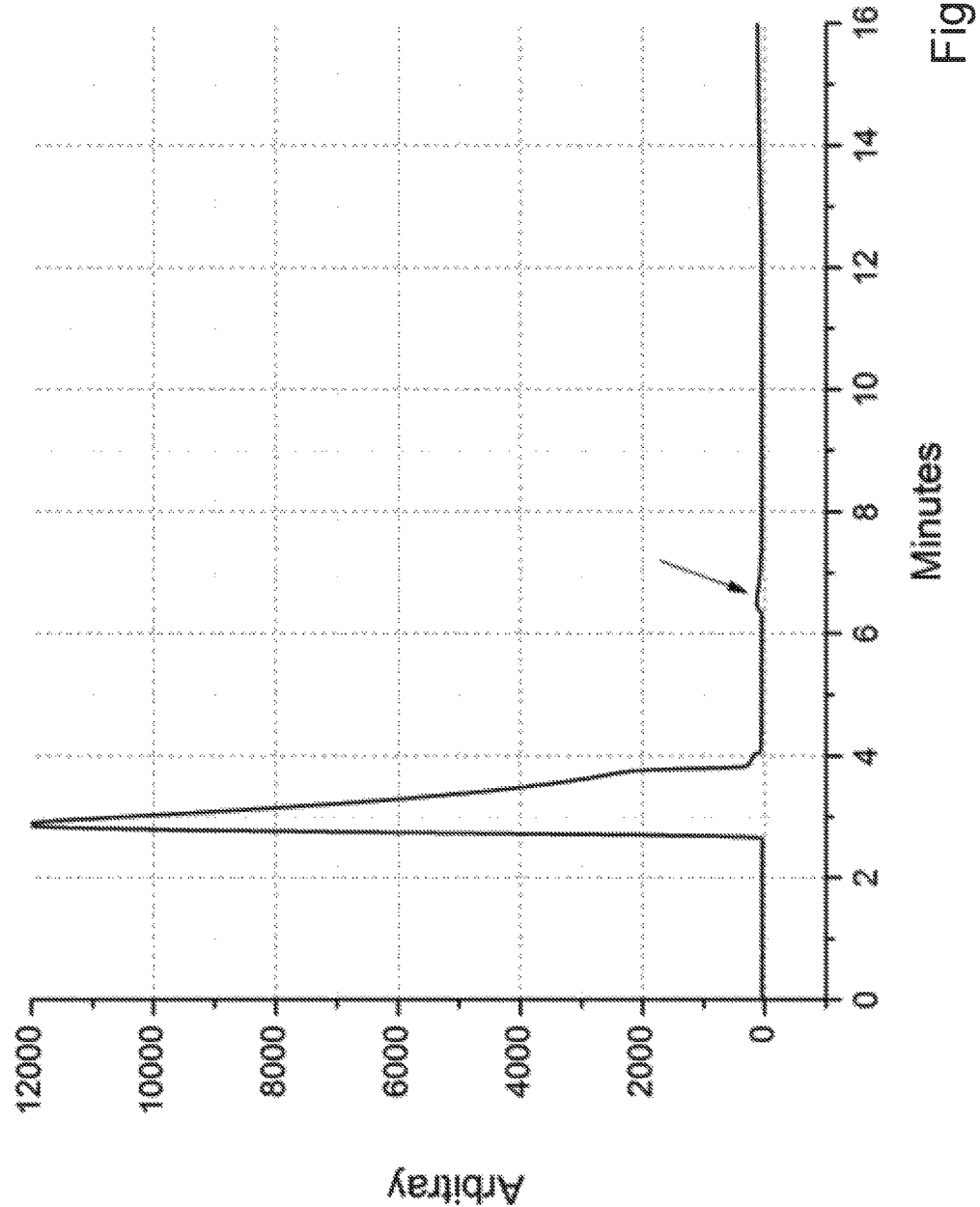
FIG. 7b illustrates experimental measurements.
Figure 8A:
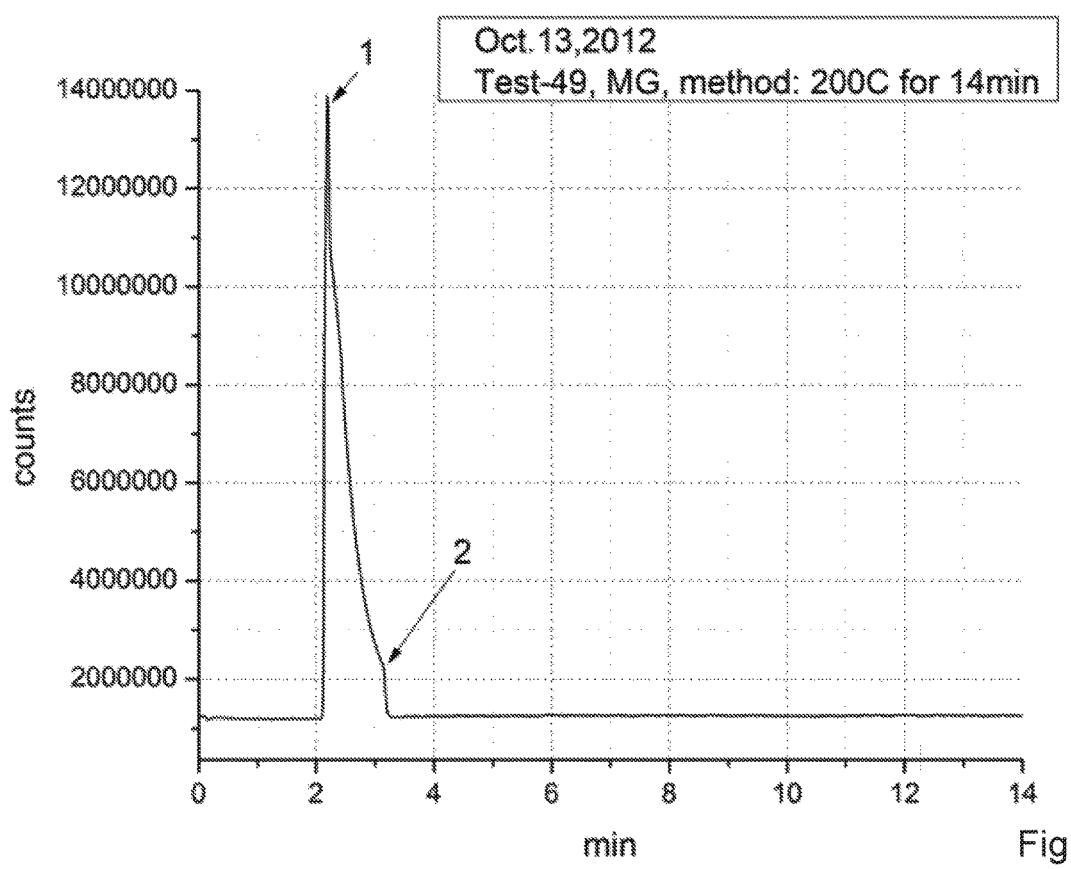
FIG. 8a illustrates experimental measurements.
Figure 9A:
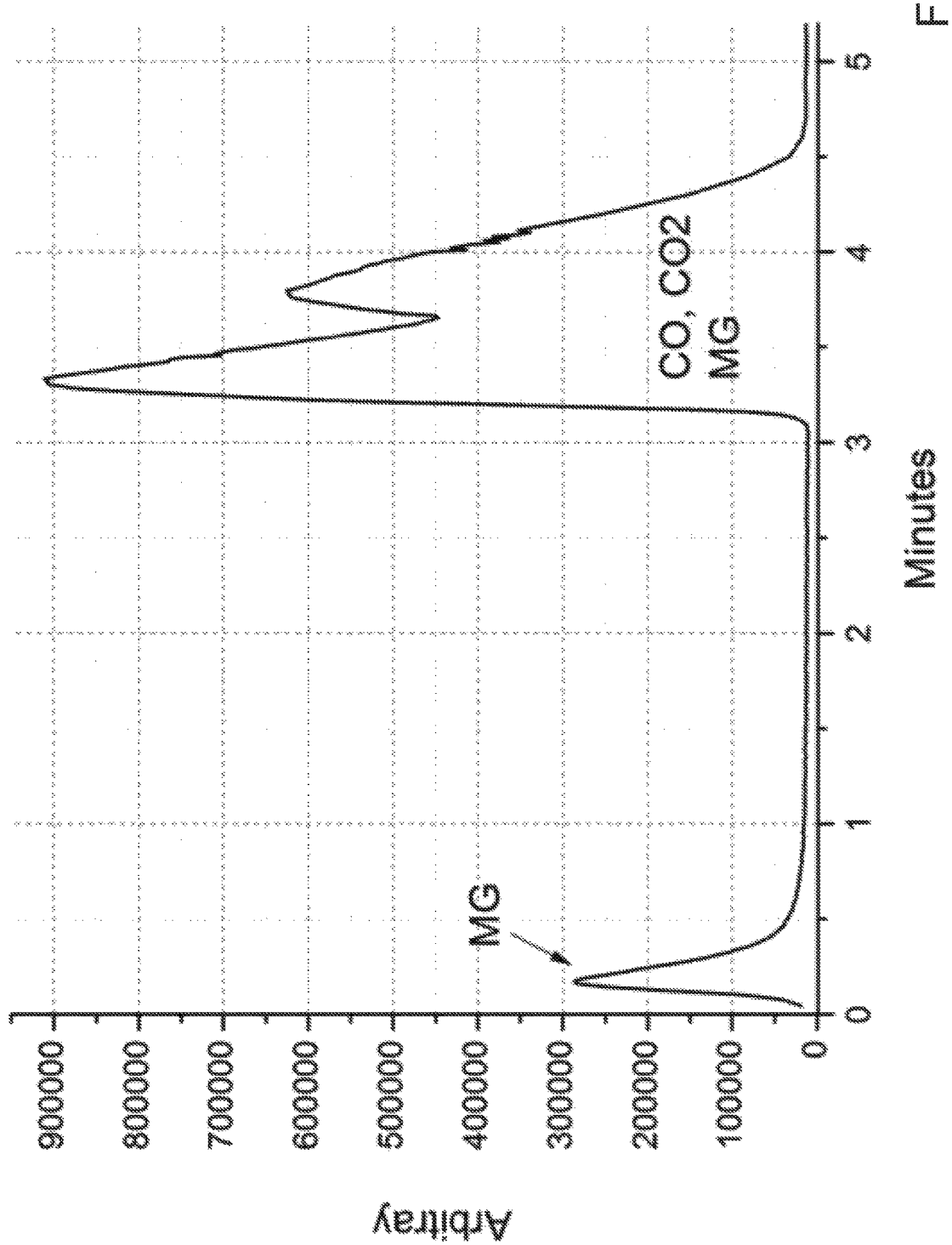
FIG. 9a illustrates experimental measurements.
Figure 10A:
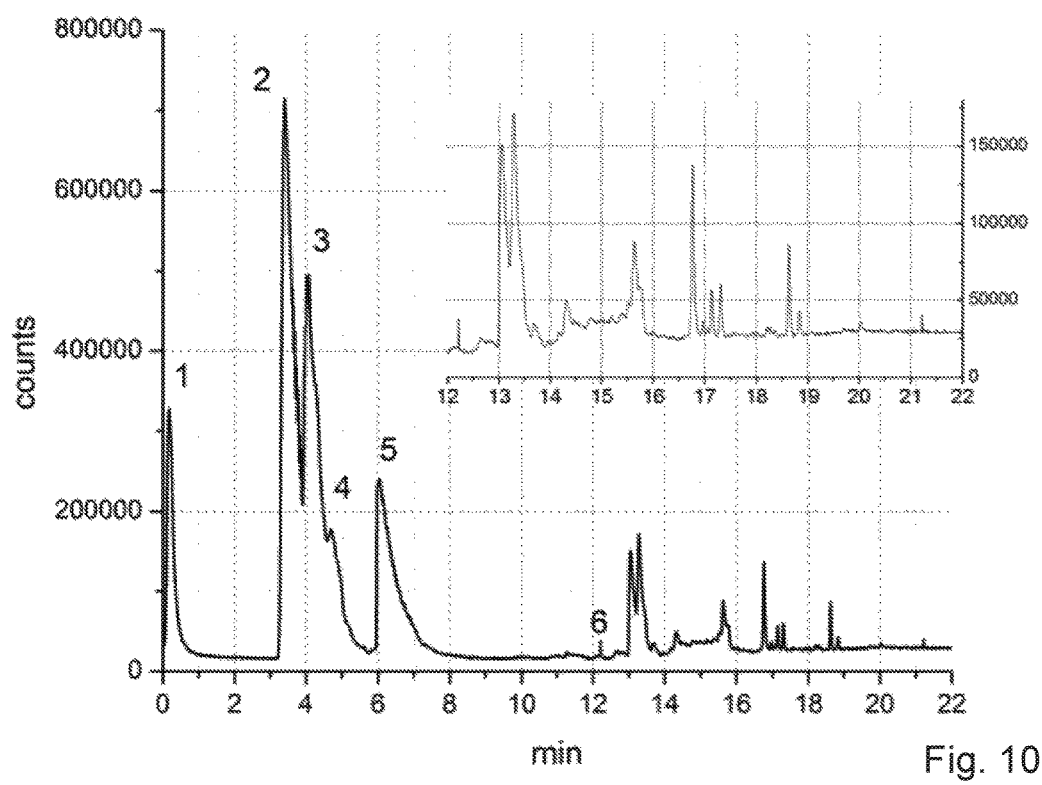
FIG. 10a illustrates experimental measurements.
Figure 11:
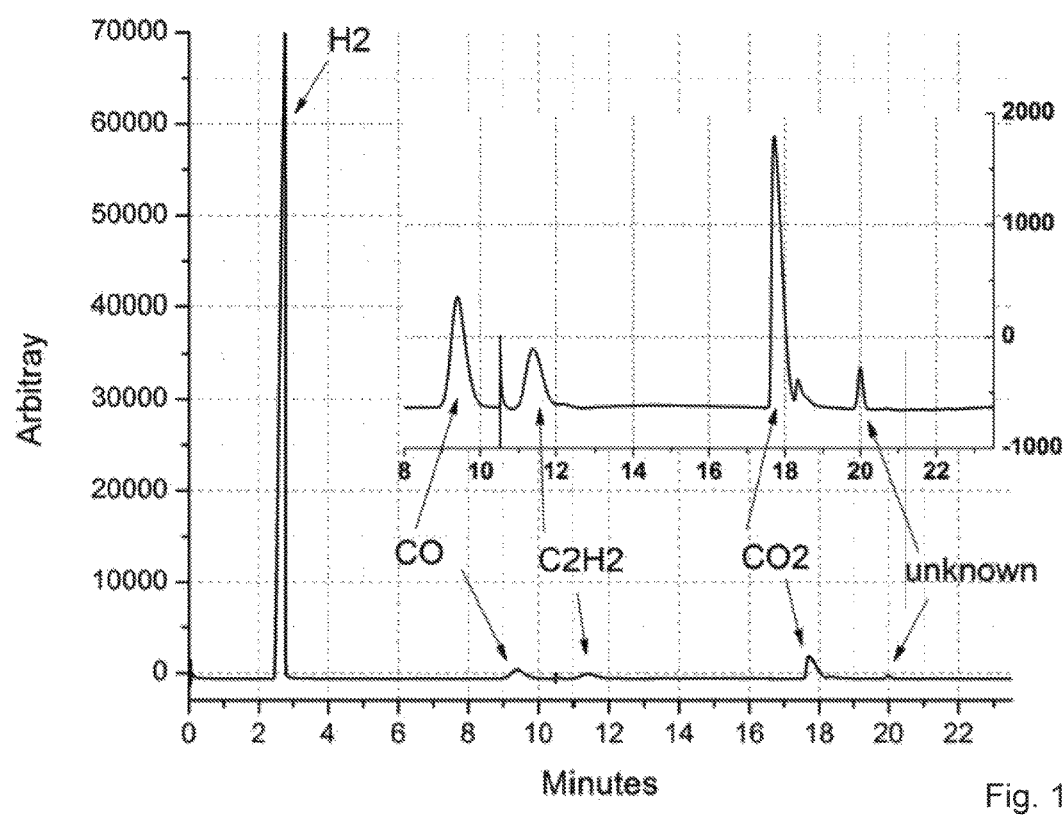
FIG. 11 illustrates experimental measurements.
Figure 12:
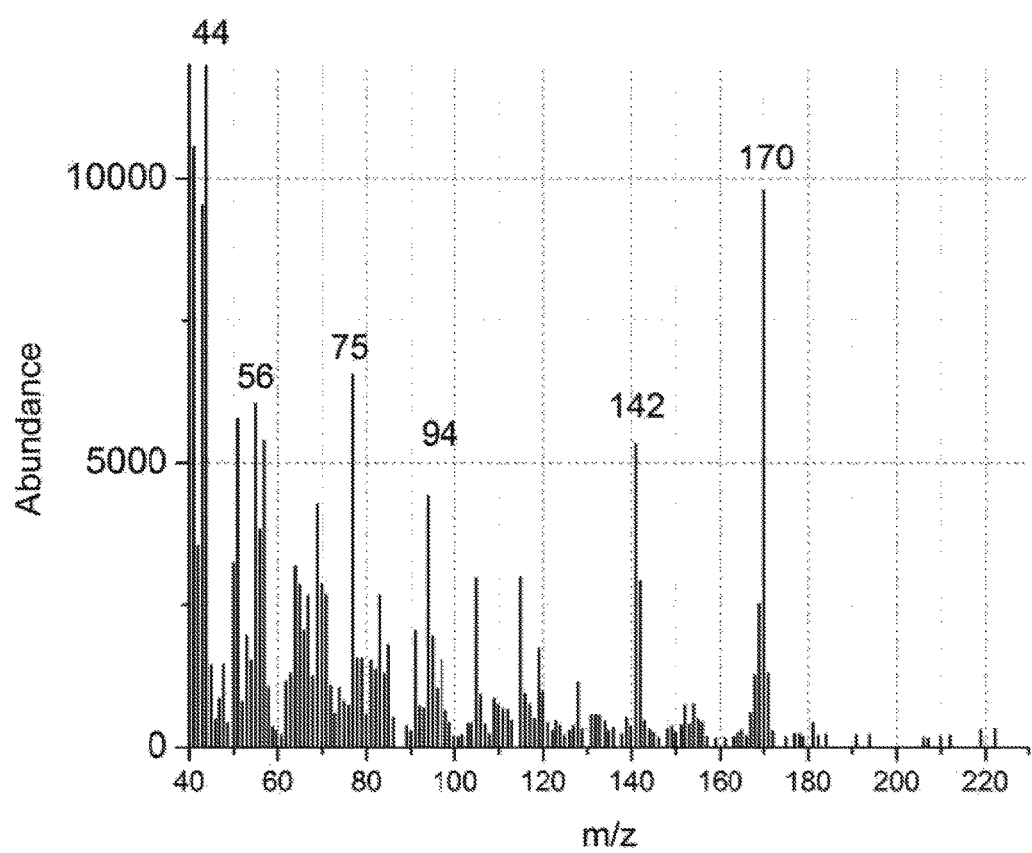
FIG. 12 illustrates an analysis of Hydrogen with toroid polarization.
Figure 15B:
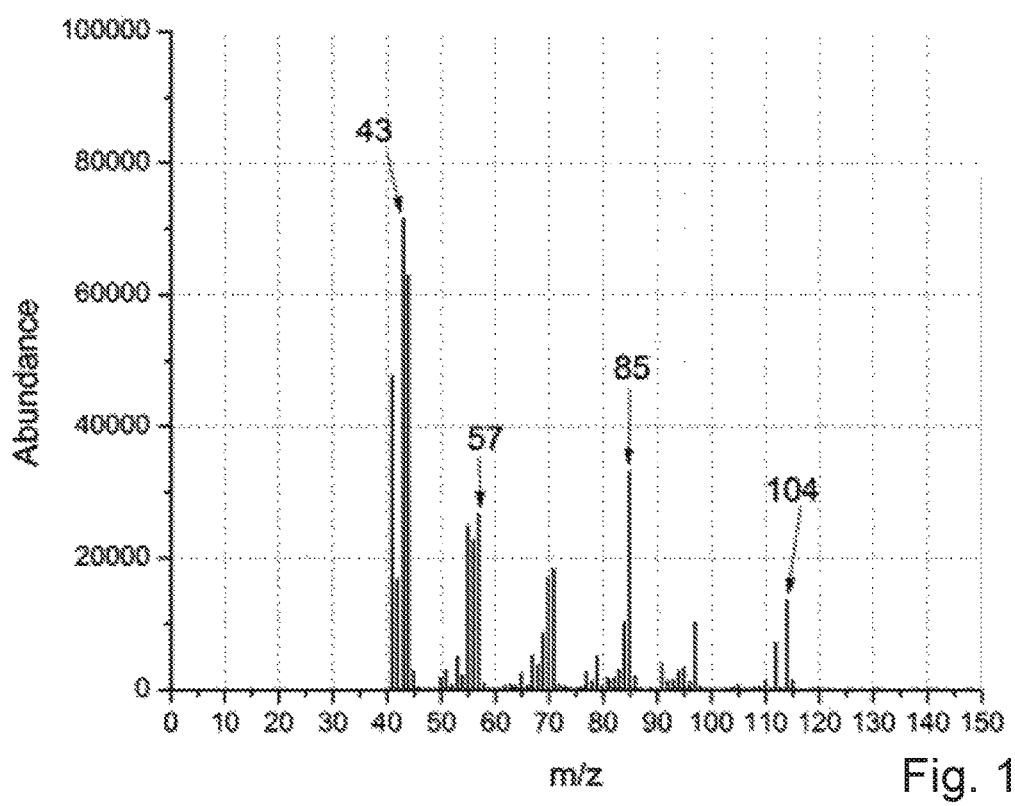
FIG. 15b illustrates experimental measurements.
Figure 17:
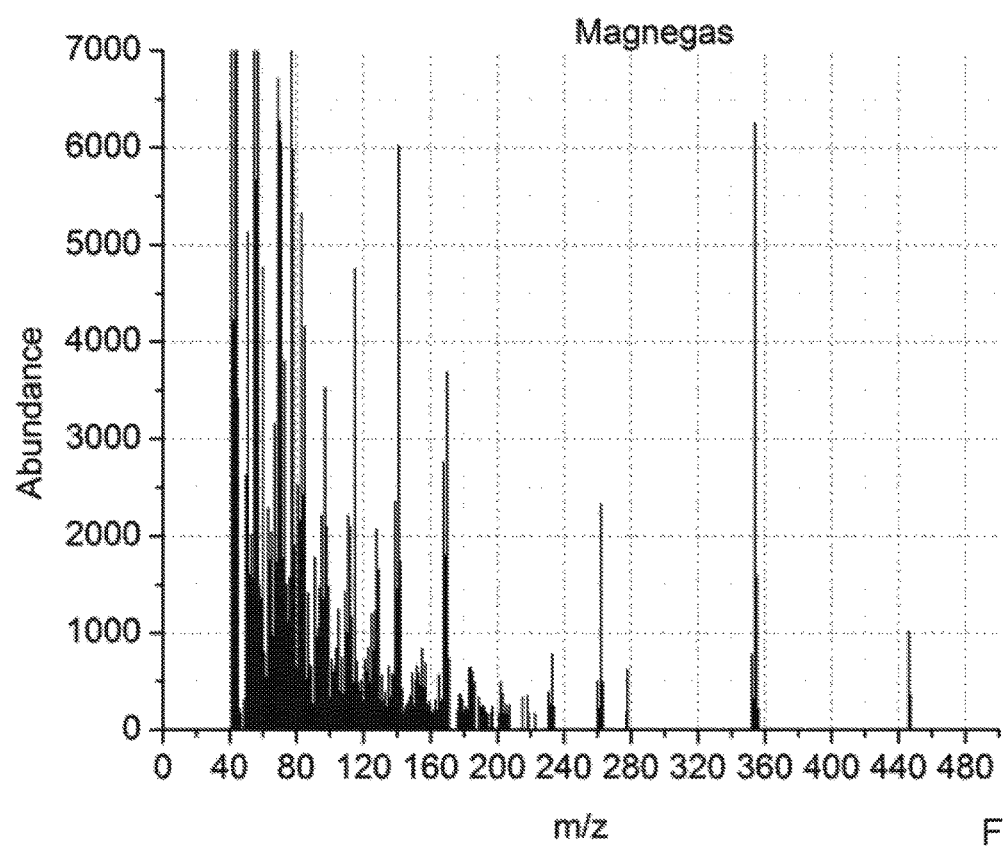
FIG. 17 illustrates experimental measurements.
Figure 18:
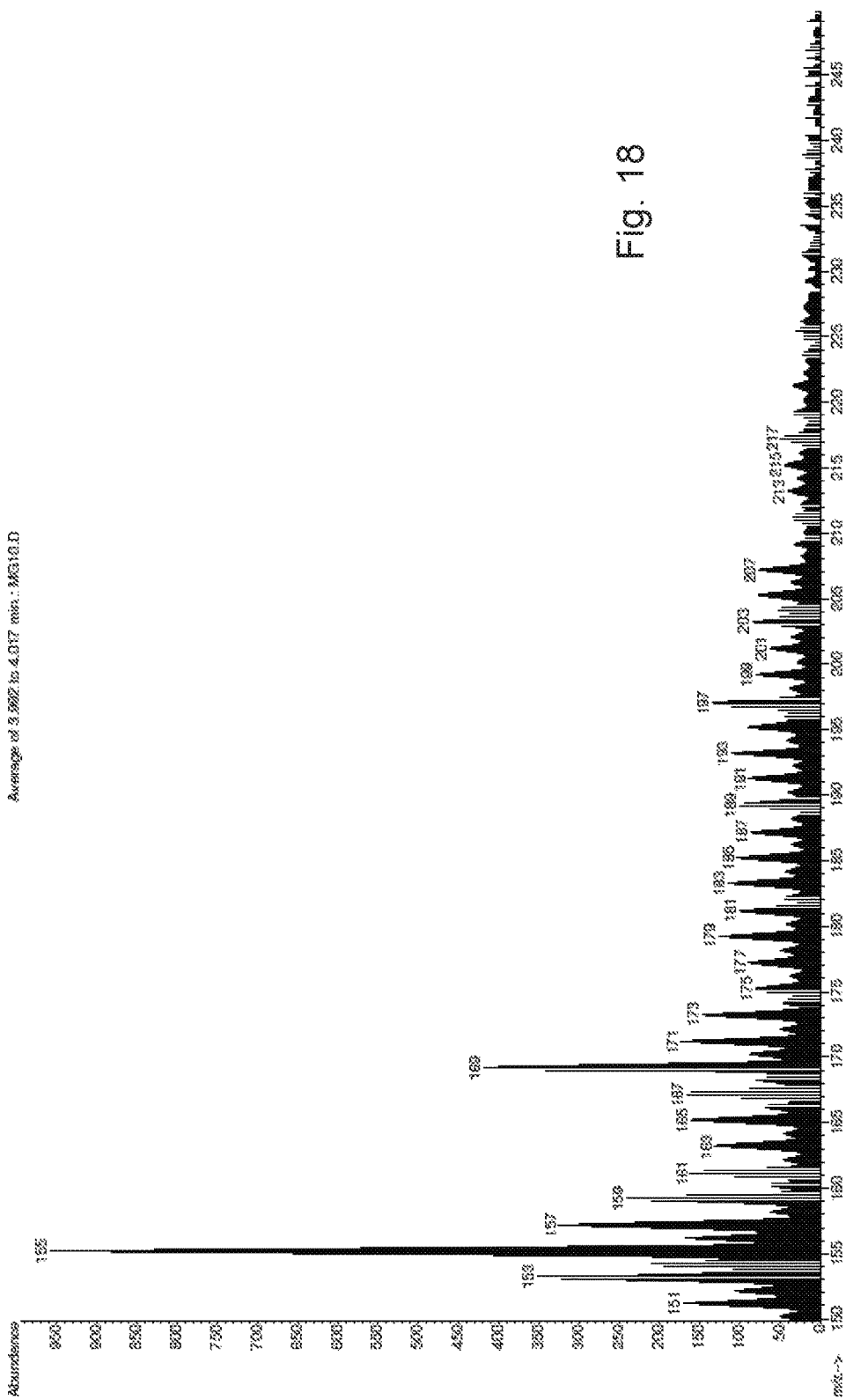
FIG. 18 illustrates experimental measurements.
Figure 20:
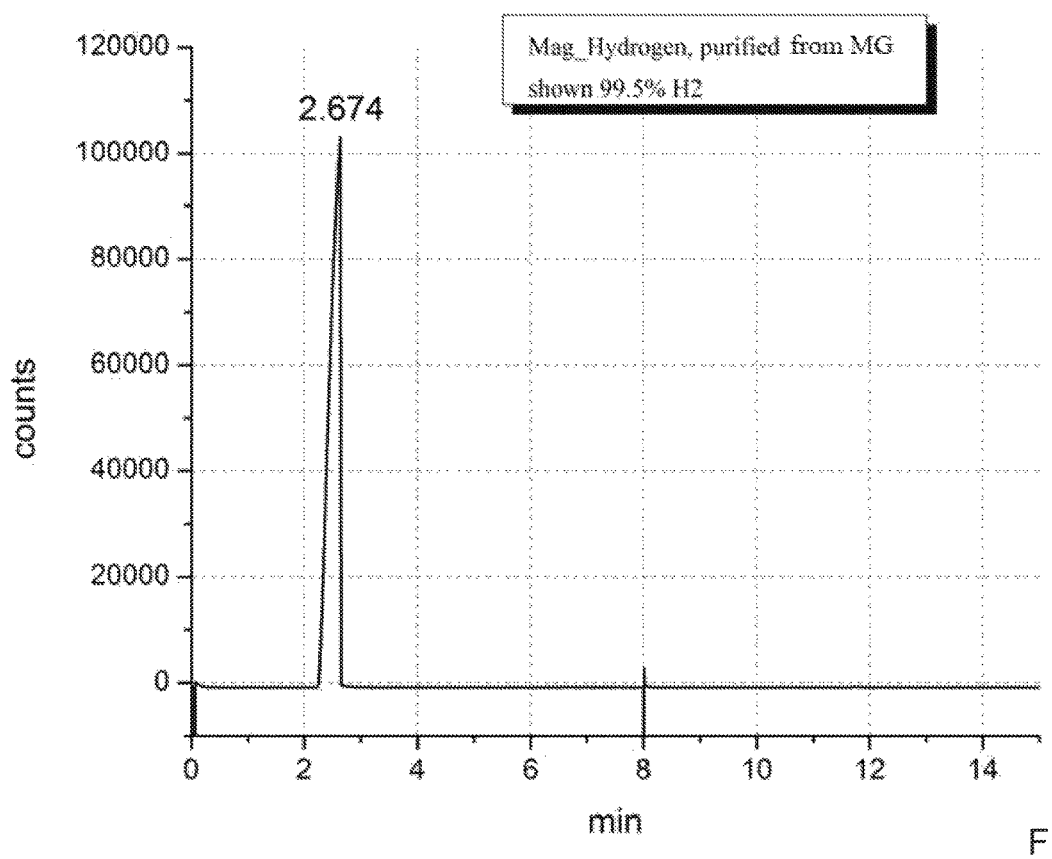
FIG. 20 illustrates experimental measurements.
Figure 21A:
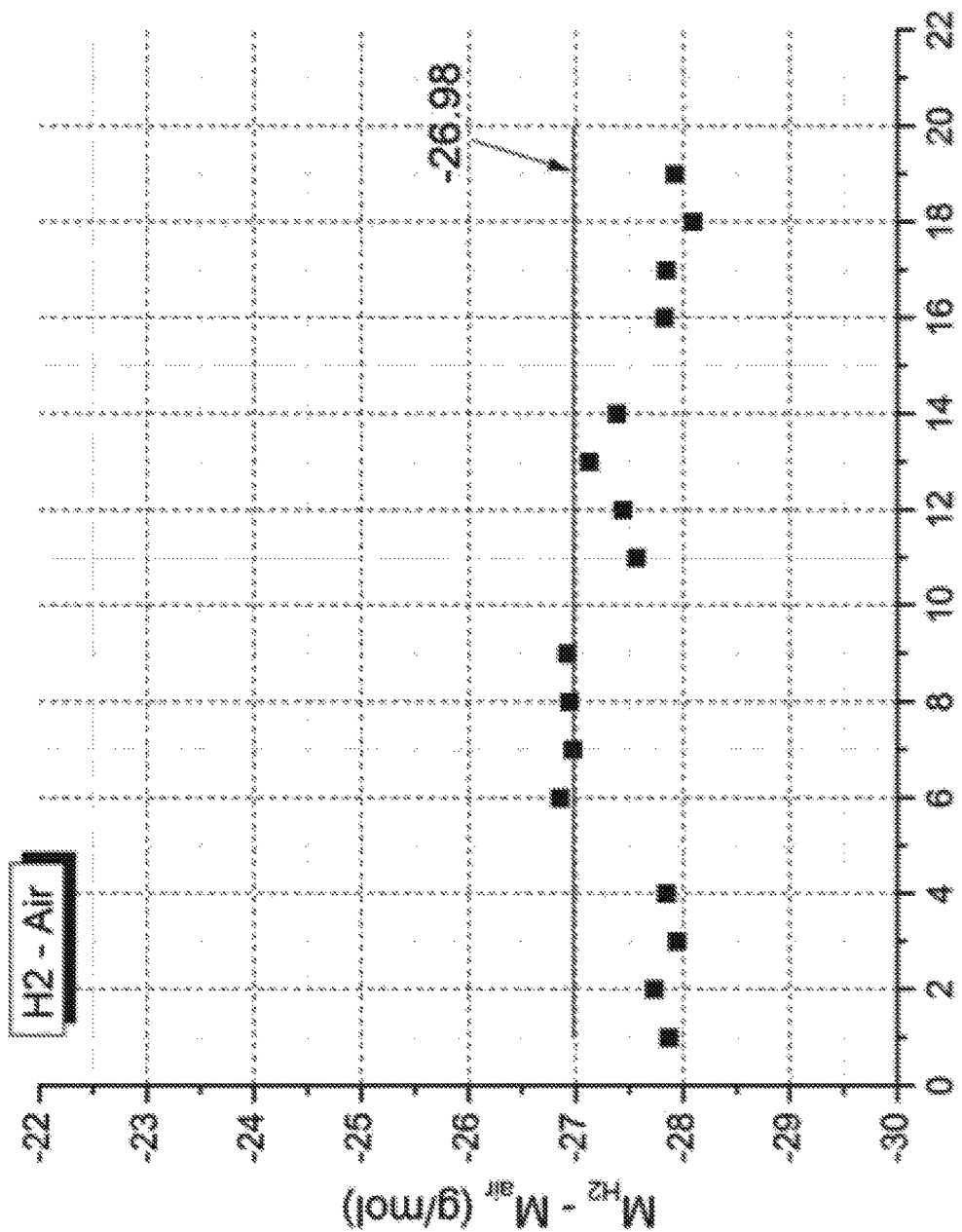
FIG. 21a illustrates experimental measurements.
Figure 22A:
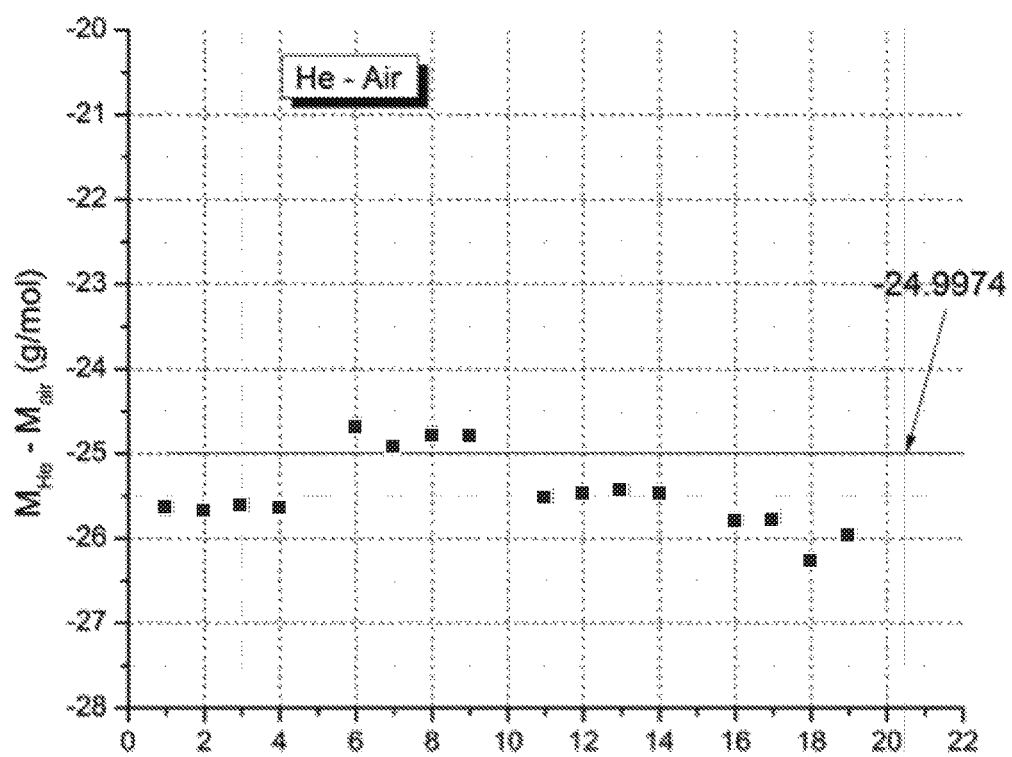
FIG. 22a illustrates experimental measurements.

Reference will now be made in detail to the presently preferred embodiments of the invention, examples of which are illustrated in the accompanying drawings. Throughout the following detailed description, the same reference numerals refer to the same elements in all figures.

Figure 28A:
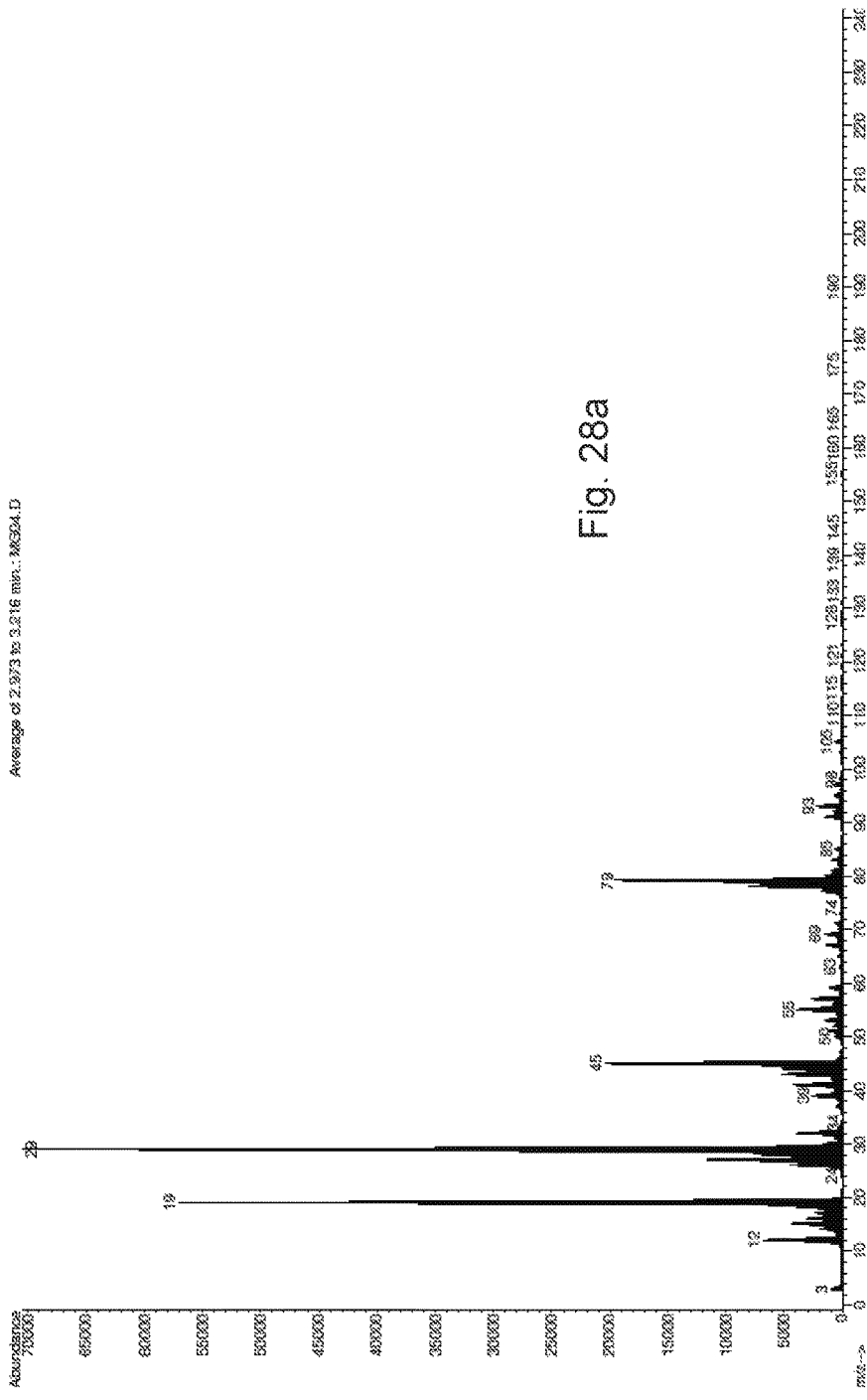
FIG. 28a illustrates an analysis of $H_3O=H-O-H\times H$.
Figure 28B:
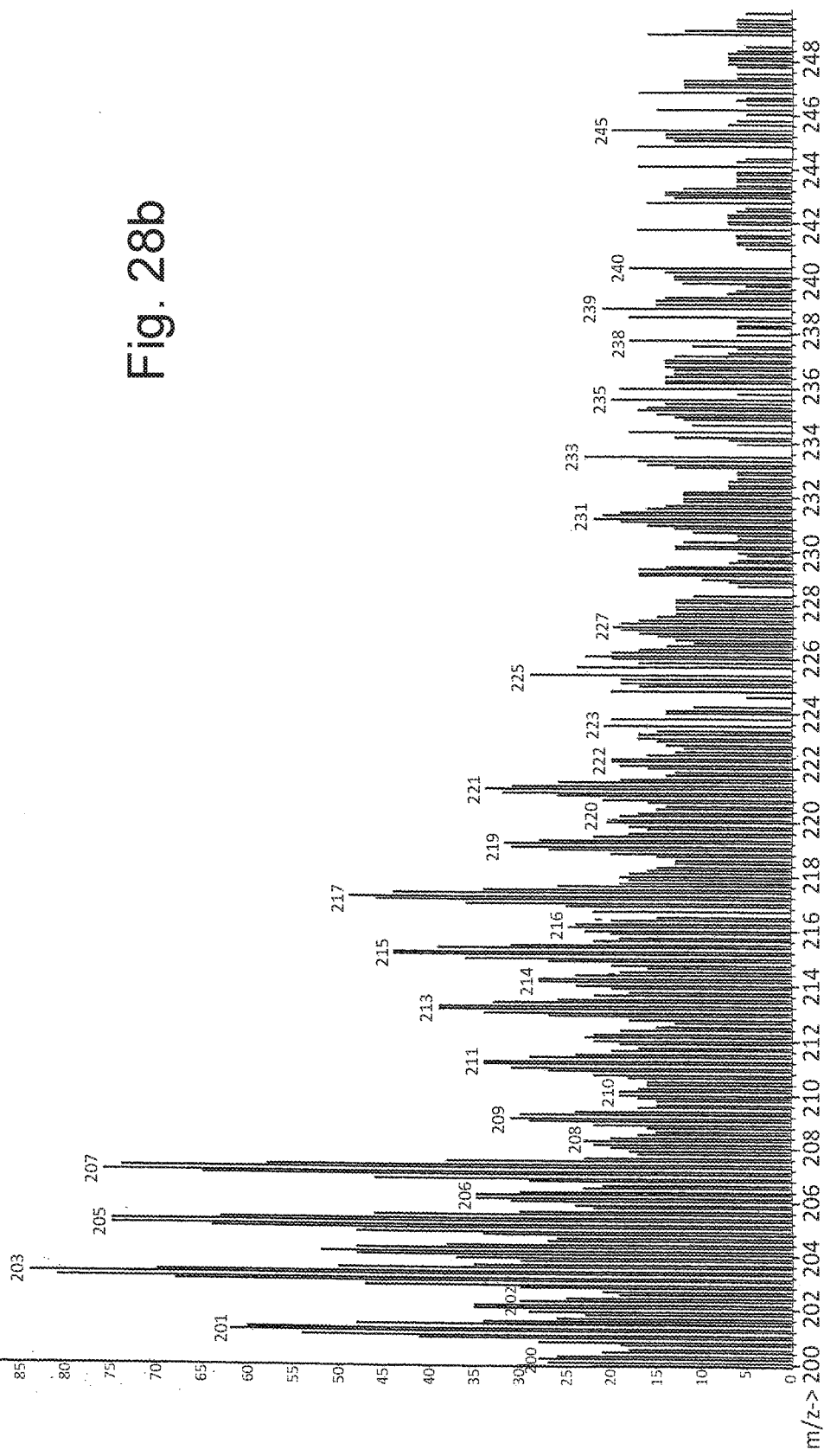
FIG. 28b illustrates an analysis of $H_3O=H-O-H\times H$.
Figure 29A:
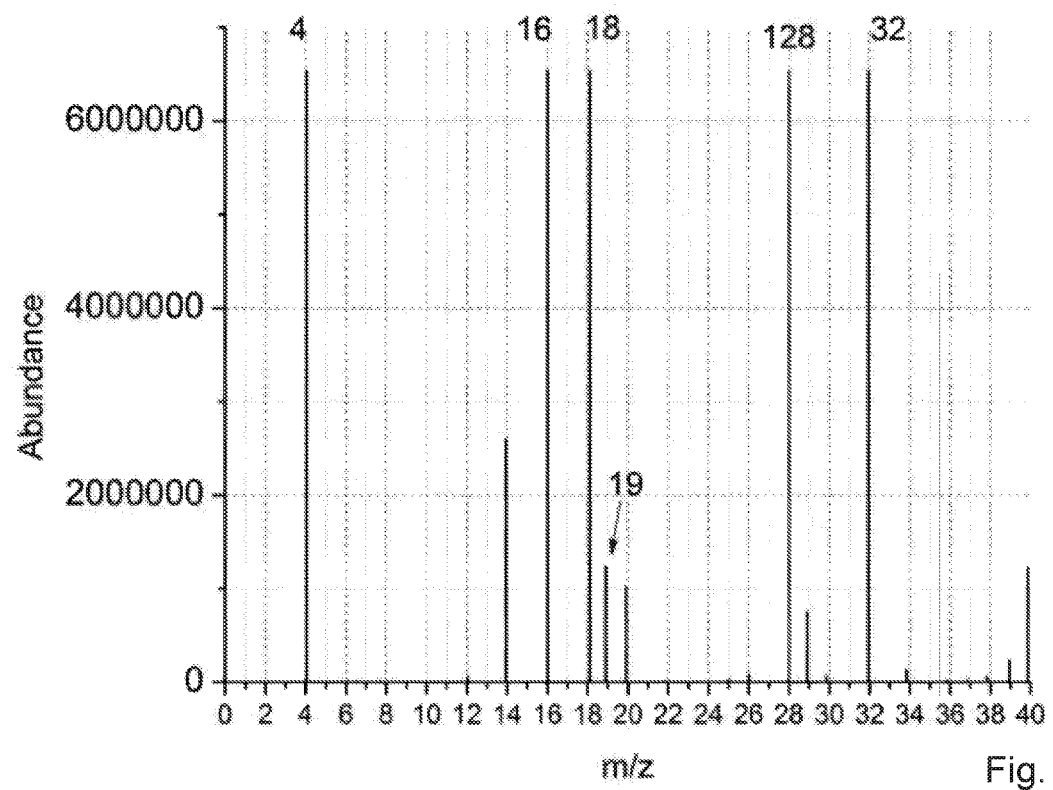
FIG. 29a illustrates experimental measurements.
Figure 29B:
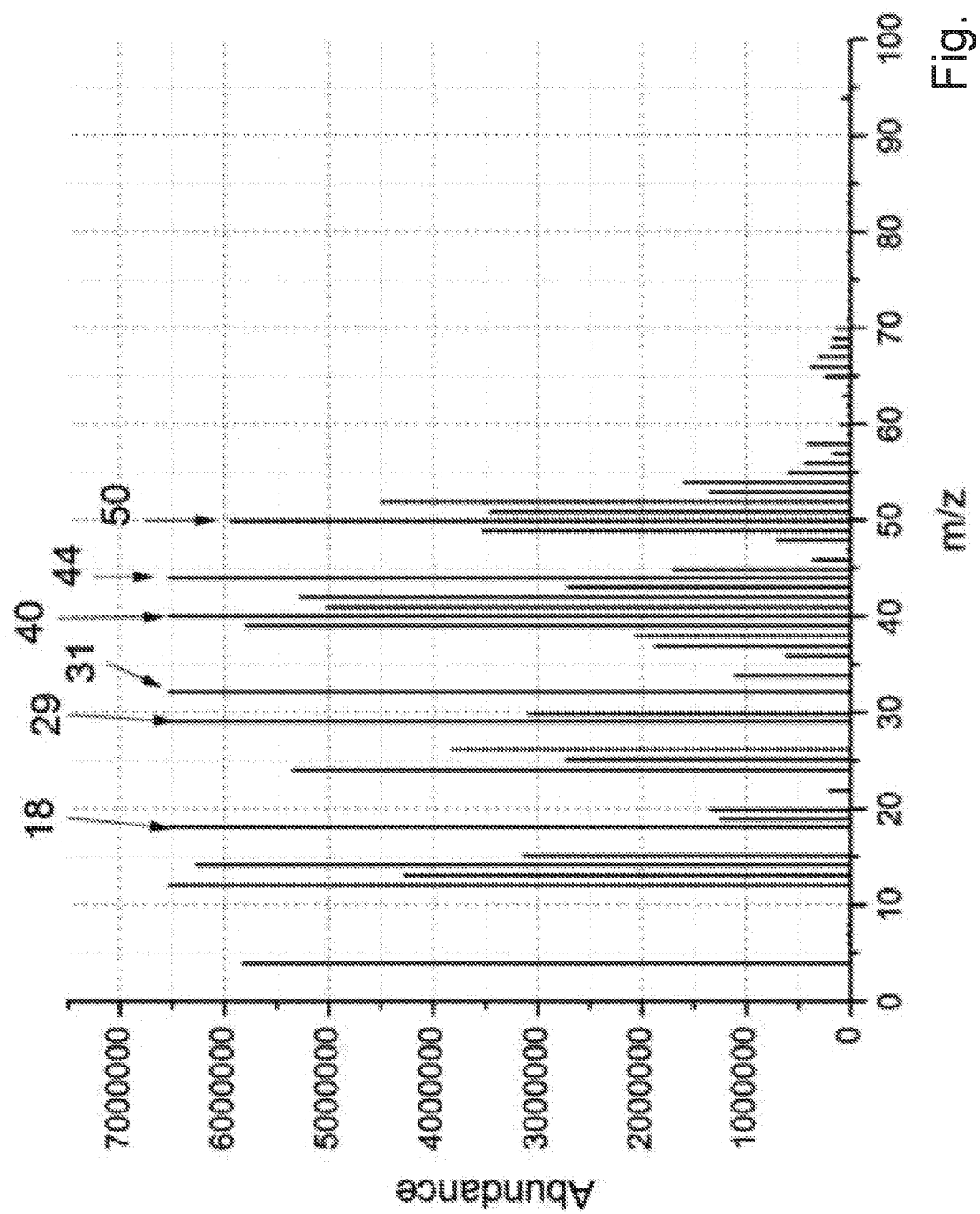
FIG. 29b illustrates experimental measurements.
Figure 29C:
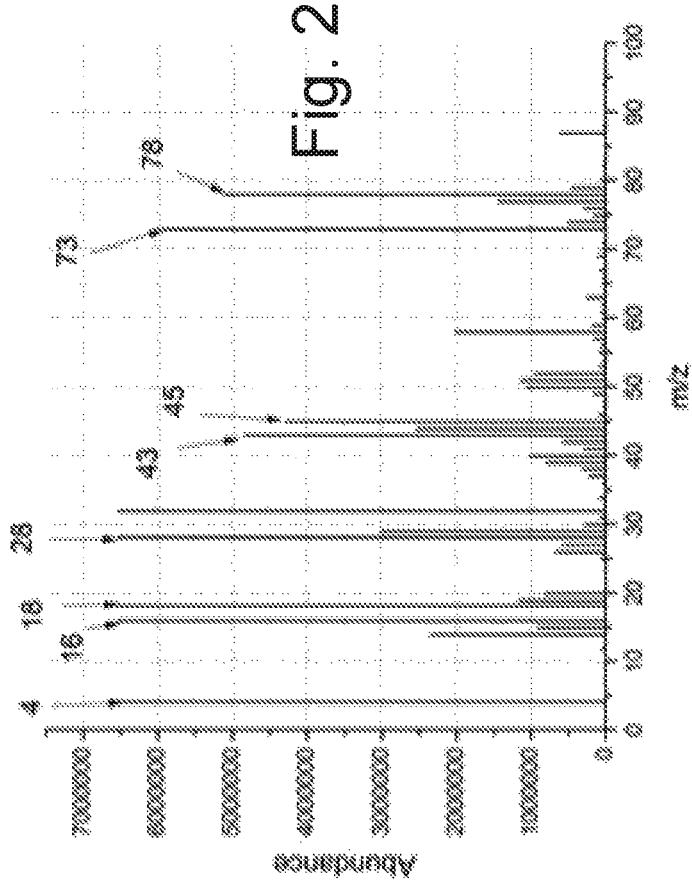
FIG. 29c illustrates experimental measurements.
Figure 31:
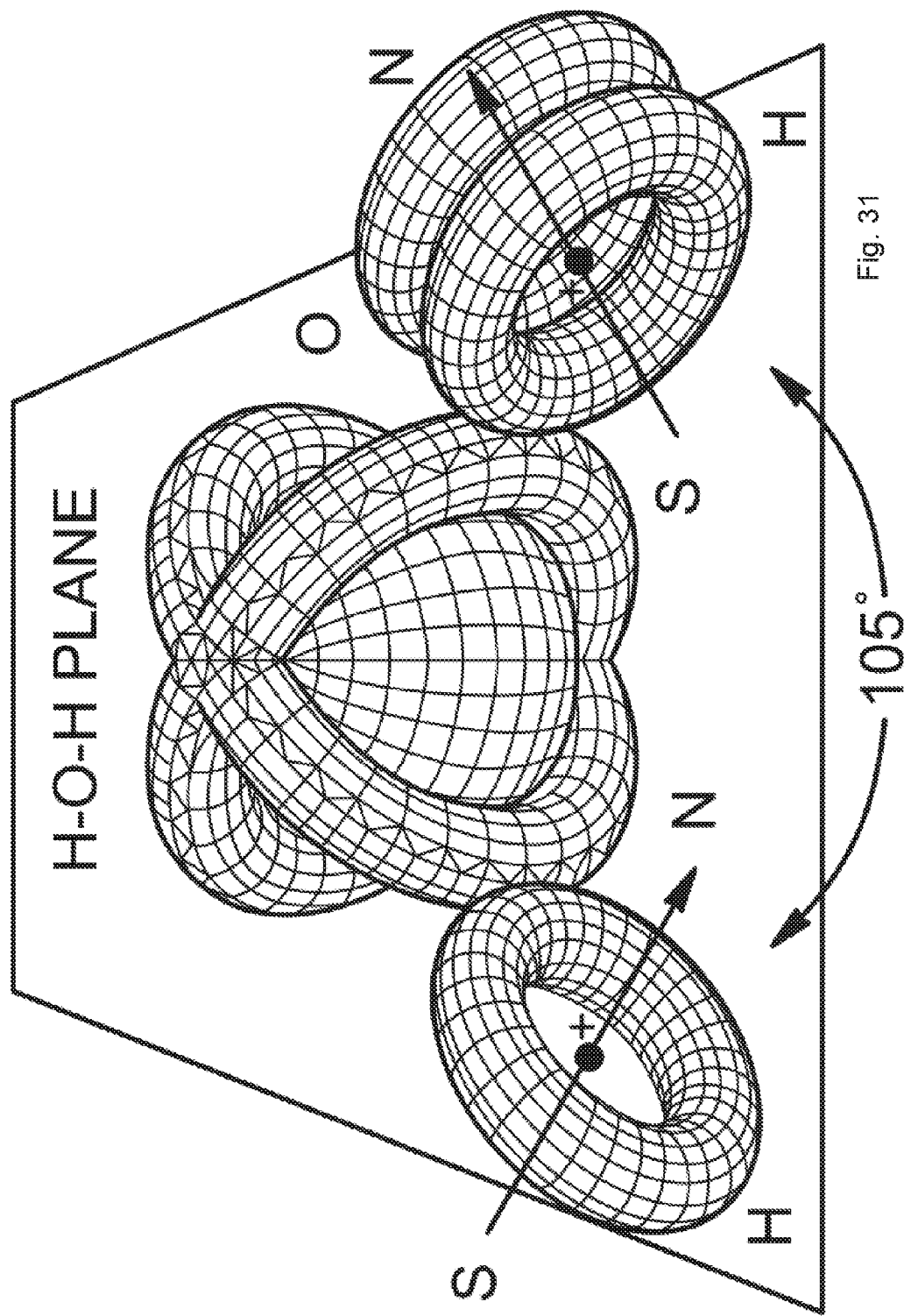
FIG. 31 illustrates polarized atoms.
Figure 32:
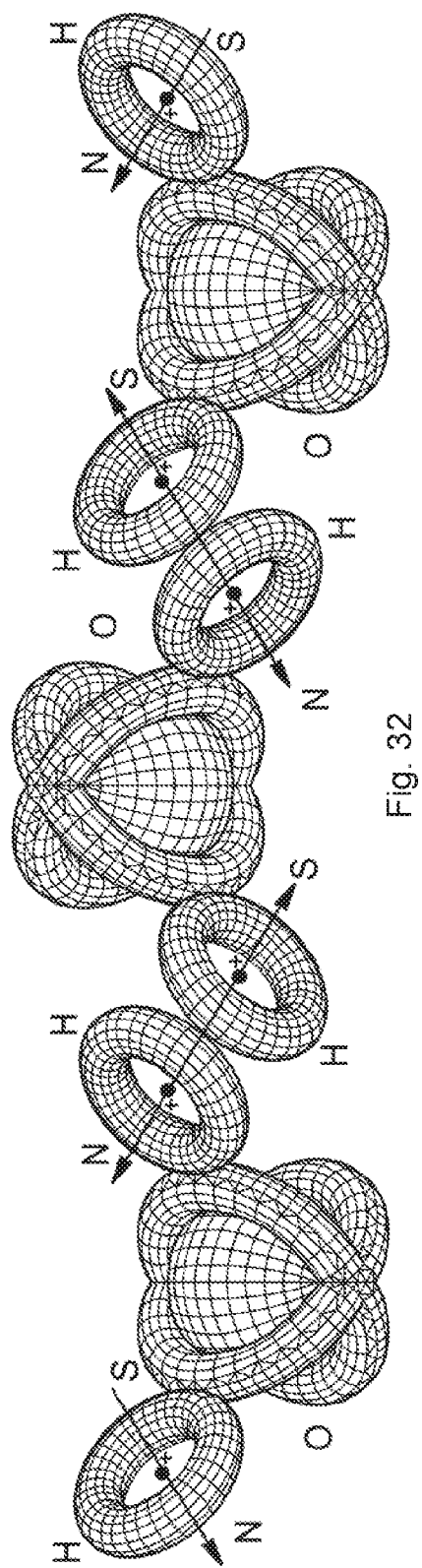
FIG. 32 illustrates polarized atoms.
Figure 34:
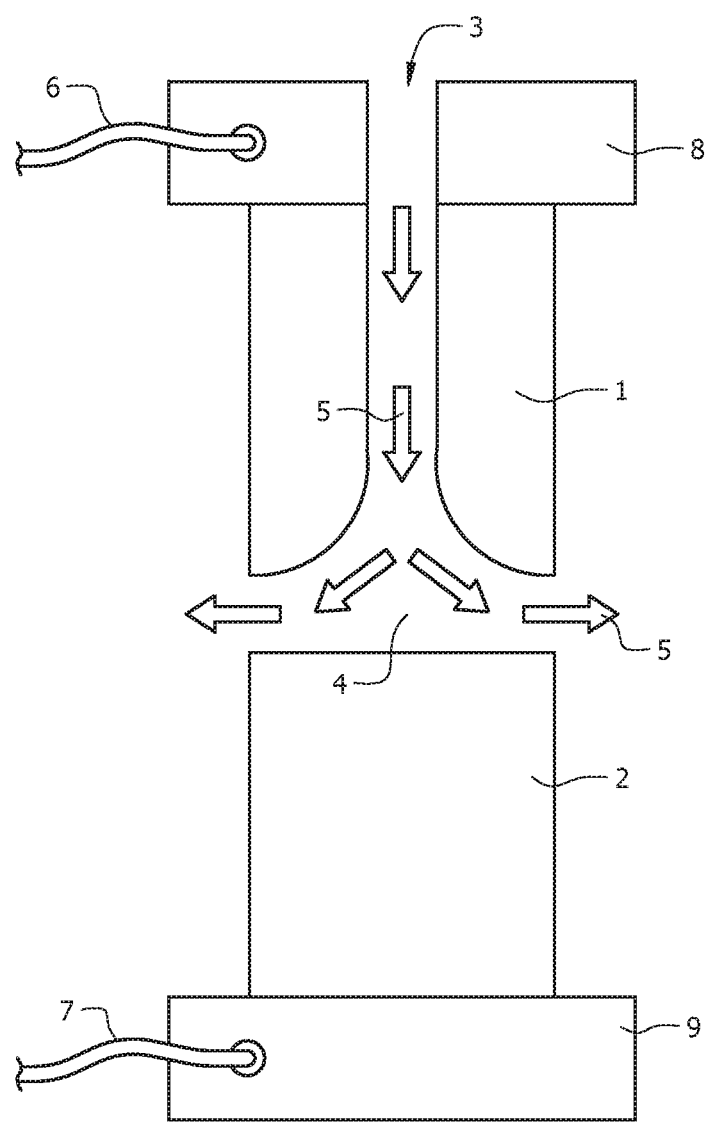
FIG. 34 illustrates a Plasma-Arc-Through apparatus.

In the following, the term "fluid" is used to denote either a gas or a liquid; the term "substance" is used to denote the a gas or a liquid or a solid; the terms "atomic orbit" or "atomic orbital" is referred to the orbit of peripheral atomic electrons as established by quantum mechanics; the terms "magnetic polarization" is used to denote the control of the orientation via magnetic fields of at least some of the orbits of atomic electrons, thus being of atomic, rather than molecular character; the terms "toroidal polarizations" or "toroid polarization" refer to the magnetic polarization of the orbits of at least some of the atomic electrons into toroids of the type illustrated in FIG. 1; the terms "magnecular bonding" or "magnecular bond" refer to the attraction between opposing magnetic polarities of toroidal polarizations of the orbits of atomic electrons as also illustrated in FIG. 1; the term "magnecules" refers to clusters of atoms, dimers and ordinary molecules under a magnecular bond; the symbol "—" is used to denote molecular (valence) bond as in the water molecule $H_2O=H-O-H$ and the symbol "×" is used to denote magnecular bond such as in the new species $H3O=H-O-H\times H$ of the analysis of FIG. 28; the terms "axial magnetic field" or "perpendicular magnetic field" refer to the property that the magnetic field of a toroid polarization of atomic orbits exists along the symmetry axis of said toroid, thus being perpendicular to the toroid symmetry plane; the term "MagneHydrogen" and its symbol MH refer to the species of Hydrogen with toroid polarization of its atomic orbitals resulting in magnecular bonding of its atoms essentially along the chemical analyses of FIGS. 12 to 18, thus having specific weight greater than the conventional specific weight of $H_2=H-H$; the terms "MagneOxygen" and its symbol MO, "MagneNitrogen" and its symbol MN, "MagneCarbonMonoxyde" and its symbol MCO, and other gases refer to the new form of said gases caused by the toroidal polarization of the atomic orbitals resulting in specific weight bigger than those of conventional values; the term "MagneGas" and its symbol MG are referred to a gas composed by H, O, C and other atoms under magnecular bond, thus admitting molecular bonds as constituents of magnecular clusters; the term "MagneLiquid" and its symbol ML refer to a liquid with toroid polarization of at least some of the orbits of their atomic electron and resulting magnecular bond, thus admitting molecular bonds as particular case; The terms "pipe" and "line" are used in this invention under the same meaning referring to a tube capable of delivering a fluid.

The novel method herein presented is based on the anomalous adhesion of magnetically polarized Hydrogen, Oxygen and other elements to other substances, as experimentally established via numerous experimental measurements, such as those reported in FIGS. 3 to 24.

In fact, such anomalous adhesion permits the industrial production of basically new fuels here individually referred to with the names of Hy-Gasoline, Hy-Diesel, Hy-Coal, and others, and collectively referred to under the name of HyFuels.

These new fuels consists in the magnecular bond of Hydrogen to a conventional fuels, such as gasoline, diesel, coal, etc., the novelty being clearly established by the fact that Hydrogen and the selected conventional fuel are not a mixture, but in a bond which is stable at ambient temperature and any industrially achievable pressure, such as 10,000 psi.

The utility of the above defined HyFuels is clearly established by the fact conventional fuels release a number of contaminants in their exhaust, some of which are combustible, such as Hydrocarbons HC, carbon Monoxide CO and others. But Hydrogen has one of the biggest flame temperatures and speeds among all known fuels. Therefore, the presence of Hydrogen during the combustion of conventional fossil and other fuels allows the combustion of the combustible contaminants in the exhaust in a way proportional to the percentage of bonded Hydrogen, with evident utility.

The utility of the above novel method is further established by the fact that conventional fossil and other fuels require the catalytic converter in order to be legally used in the U.S.A. Extensive experimentation and measurements conducted by the inventor have established that the bond of at least 10% in BTU units to the BTU content of gasoline allow the elimination of the catalytic converter while verifying all current governmental restrictions in the exhaust.

By remembering that one gasoline gallon has about 110,000 BTU, said measurements have established that compliance with governmental exhaust restrictions without catalytic converter is achieved when bonding to said gasoline gallon 11,000 BTU in Hydrogen. By remembering that one standard cubic foot (scf) of Hydrogen contains about 300 BTU, the above indicated conditions are met when bonding magnecularly to one gasoline gallon 36.6 scf of Hydrogen.

The above utility is best illustrated when applying the new method of this invention to fossil fuel operated electric power plants that, as it is well known, spend hundreds of millions of dollars per plant per year for the cleaning of the contaminants in the exhaust via large scrubbers and other equipment. The combustion of the HyFuels of this invention will, therefore, allow the saving of large sums of money to electric power plants.

In summary, the first principle underlying the new method of this invention is that of "improving the environmental quality of the exhaust of fossil and other fuel by increasing their combustion."

The utility of the new method of this invention is additionally established by the fact that the combustion of combustible exhaust of fossil and other fuels via magnecularly bonded Hydrogen evidently increases the power output. Quantitatively, the magnecular bond of 10% in BTU values of Hydrogen to one gasoline gallon has been measured to cause the increase of about 30% in power output, of which 10% are constituted by the energy content of the bonded Hydrogen and 20% is constituted by the combustion of combustible contaminants.

Therefore, the second principle underlying the novel method of this invention is that of: "achieving increased power output of fossil and other fuels via the increase of the combustion."

The mechanism of combustion of HyFuels is also important for the skilled in the art so as to allow their independent verification of the novelty of this invention. For this purpose, we recall the following chemical notions.

Molecular combustion is referred to the combustion of fuels having the conventional molecular structure that is, said fuels are composed by atoms under the conventional valence bond. A typical example is that of the combustion of $H_2$ and $O_2$ with the production of 57.5 Kcal/mole, $H_2+O_2/2 \rightarrow H_2)+57.5$ Kcal/mole. However, a condition to synthesize the $H_2O$ molecule is the poor separation of the $H_2=H—H$ and $O_2=O—O$ molecules, which separation requires 221 Kcal/mole. The latter separation energy has to be taken into account in order not to violate the principle of conservation of the energy. Consequently, the combustion of $H_2$ and $O_2$ produces in reality 221 Kcal/mole of which the measured energy output of 57.5 Kcal/mole is only the residue.

Magnecular combustion is referred to the combustion of fuels having at least in part a magnecular structure that is, said fuels are composed of atoms under magnecular bond. The novelty important for this invention is that magnecular fuels have a higher energy output than that of molecular fuels under the same atomic constituents because in the firmer case, atoms are "weakly" bonded together, while in the latter case aims are "strongly" bonded together. Alternatively, the energy needed for the separation of magnecular bonds is a fraction of the energy needed for the separation of molecular bonds. As an example, the combustion of a pure $MH2=H \times H$ to a pure $MO_2=O \times O$ yields an energy output of about 278 Kcal/mole less the breaking of the magnecular bond expected to be of the order of 50% that of the valence bonds $H2=H—H$ and $O_2=O \times O$. Therefore, the combustion of MH2 and MO2 will produce 50% of 221 Kcal/mole plus 57 Kcal/mole for a total of about 160 Kcal/mole, i.e., $MH2+MO2/2 \rightarrow H_2O+160$ Kcal/mole. It should be stressed that the numerical value of magnecular bond has not been measured to date with sufficient accuracy. The only established knowledge is that magnecular bonds require smaller separation energy than molecular bonds.

Detailed studied of the magnecular combustion via the use of the covering of quantum chemistry known as hadronic chemistry (see, e.g., Foundations of Hadronic Chemistry, with Applications to New Clean Energies and Fuels, R. M. Santilli, Kluwer Academic Publishers, 2001), have clarified quantitatively with equations that the advantages of the magnecular over the molecular combustion are due to the "magnetic" origin of the magnecular bond because the latter bond ceases to exist at a given temperature scientifically known as the Curie Temperature.

Consequently, the magnecular bond of Hydrogen or other atoms to other substances automatically disappears at combustion whose temperature is the Curie temperature of the bond. Therefore, the scientific, that is, quantitative and numerical, understanding of the anomalous energetic reaction $MH2+MO_2/2 \rightarrow H_2O+160$ Kcal/mole is known as hadronic chemistry, including statistical treatments of instabilities, dispersions, non-linear effects, etc.

One skilled in the art can now understand, at least conceptually, the novel combustion of HyFuels because Hydrogen atoms are not bonded to fossil fuel via the strong valence. Instead, said atoms are bonded via the weaker magnecular bond that essentially allows atoms to be free for combustion at the combustion temperature, with consequential higher energy output. This explains the reason that the magnecular addition of 10% in BTU value of Hydrogen to gasoline yields a 30% increase of energy output without any violation of the principle of conservation of the energy.

Figure 33:
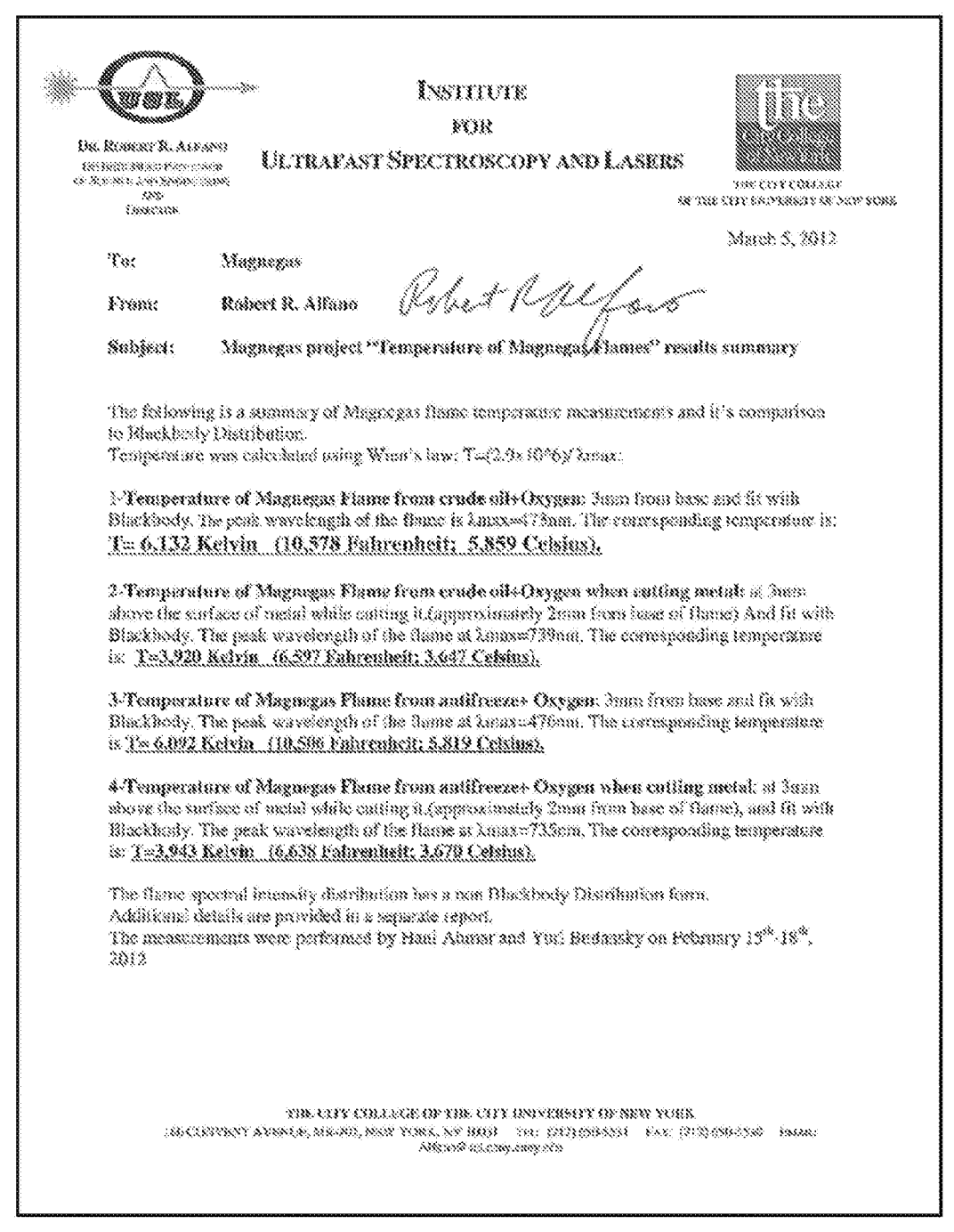

Yet another utility of the novel method of this invention is the fact that the flame temperature of the commercially sold MagneGas fuel with symbol MG is about double that of Natural Gas NG, as established by numerous measurements conducted by scientists of the Institute of UltraFast Spectroscopy and Lasers of the City College of New York, and reproduced in summary in FIG. 33. In fact, Natural Gas has the flame temperature of 3,400 F while MagneGas has a flame temperature of the order of 10,500 F.

Additionally, Magnegas can cut a 6" thick metal plate much faster than Acetylene 9 see the certifications in www-.magnegas.com), resulting in a clear anomaly. In fact, Acetylene has about 2,400 BTU/scf while a combination of 60% H2, 27% CO and 3% volatile gases has about 320 BTU/scf. When subjected to conventional chemical analyses, MagneGas appears as having precisely the indicated composition of about 60% $H_2$, 27% CO and 3% volatile gases, as the skilled in the art can verified with data available in the internet.

The anomaly is that a combustible gas with only 320 BTU/scf cannot possibly cut a 6" steel plate faster than Acetylene that has 2,400 BTU/scf. The only known scientific, that is quantitative resolution of this anomaly is that MagneGas "is not" composed of atoms under a valence bond but of atoms at least in part under a magnecular bond.

We are now in a position to indicate in these specifications that the Hydrogen contained in HyFuels "is not" conventional hydrogen $H_2$ with a spherical distribution of its orbits, but MagneHydrogen MH because such a structure is a necessary pre-requisite for the magnecular bond with conventional fossil fuels.

The utility of the novel method of this invention is then further established by the fact that the anomalous combustion temperature of the magnecular Hydrogen contained in HyFuels provided additional utility because of the evident increase of energy output caused by the anomalous combustion of MH.

Following the clarification that the Hydrogen content of HyFuels must have magnetic polarizations, it is important for the skilled in the art to know that the same magnetic polarizations are needed for fossil fuel, unless the polarization can be achieved by induction as it is the case for coal described below. In the absence of aid polarizations for both the Hydrogen and, separately, for the conventional fuel, the magnecular bond between the two substances is generally impossible or rather weak at best.

The novel method for Hy-Coal is somewhat different than those for other HyFuels, because carbon is one of the best paramagnetic substances in nature that, as such, can easily acquire the needed magnetic polarizations. In particular, carbon in coal can indeed acquire the needed induced magnetic polarizations via its exposure to MagneHydrogen, thus implying considerably the apparatus needed for the production of Hy-Coal. However, it should be stressed that the basic principles underlying Hy-Coal are the same as those for the remaining HyFuels since they are all based on the anomalous adhesion of magnetically polarized Hydrogen.

Specifications of representative new apparatus:

An embodiment of this invention for the case of liquid HyFuels is that based on the use of conventional Hydrogen and conventional liquid fuel such as gasoline, the magnetic polarization of at least some of their atomic orbits and their magnecular bonding. Another embodiment is for solid HyFuels, such as Hy-Coal, is discussed below.

Referring to FIGS. 32 through 38, several views of a reactor system are shown. An efficient means to achieve the needed magnetic polarization of electron orbits are those based on submerged electric arcs between one or more pairs of electrodes under DC, AC, DC pulsing, AC high frequency and other electric power as specified below. Among the various apparatus available for a submerged electric arc, high efficiency is achieved by the U.S. Pat. No. 8,236,150 B2 titled Plasma-Arc-Through, similar to the apparatus of FIG. 35 of an anode 1 (e.g. temperature resistant anode) fastened to a conducting, such as copper holder 8, a temperature resistant cathode 2 fastened to a conducting, such as copper holder 9, a bore 3 through one or the other electrode or through both electrodes, and a DC power delivered to the conducting holders 8/9 via electrical connections 6/7. When power is activated, an arc is established in the gap 4. The gaseous or liquid fluid 5 intended for magnetic polarization is passed through the bore 3 in the direction shown in FIG. 34, thus being forced to pass through the gap 4, by therefore assuring the exposure of the fluid to the electric arc.

The polarization of the orbits of natural elements requires very large values of magnetic fields of the order of $10^{10}$ Gauss or more. Additionally, the achievement of industrial utility requires the bonding of sufficient Hydrogen to the selected liquid fuel, as indicate above, for at least 10% in BTU values. Consequently, industrial utility requires the achievement of magnetic field greater than, for example, $10^{10}$ Gauss, which have been identified to have at least $10^{11}$ Gauss. These magnetic fields are achievable at atomic distance from an electric arc under the condition of using at least 300 kW. In fact, the magnetic field M of a DC arc is described by the law $M=kI/r$, where the current I is measured in Ampere A, r is the distance from the arc measured in cm, and k is a constant depending on selected units whose numerical value is not specified. Therefore, at atomic distances from the electric arc, that is, at about $10^{-8}$ cm, and for 6,000 A of a DC arc at 50 V powered by 300 kW, produces a magnetic field of the order of 6 k $10^{11}$ Gauss.

Figure 35:
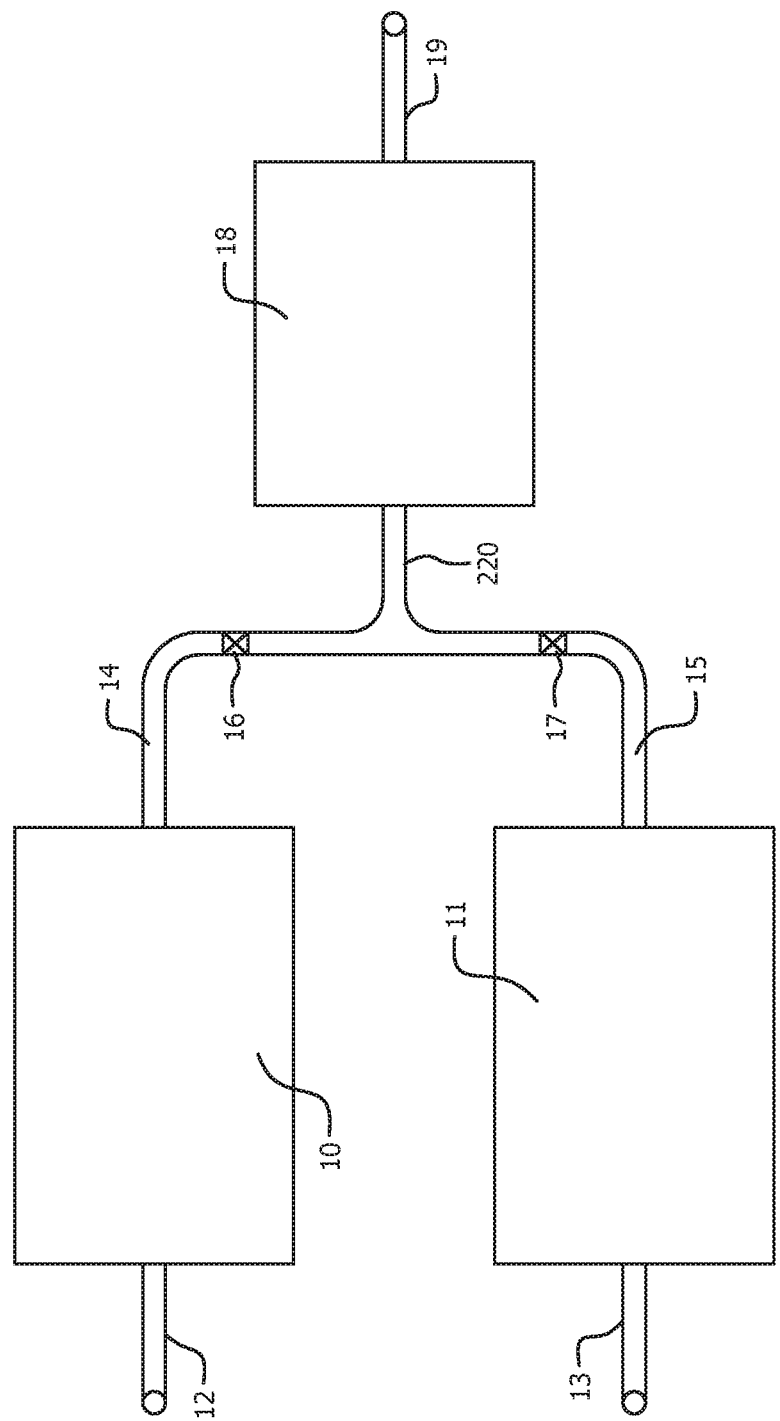
FIG. 35 illustrates detail parts of the reactor.

With reference to FIG. 35, a representative liquid HyFuels production plant consists of a reactor 10 for the polarization of hydrogen entering the reactor via pipe 12 and existing in polarized form via pipe 14 with check valve 16 to prevent the return of the polarized Hydrogen to reactor 10; reactor 11 for the magnetic polarization of the selected liquid fuel entering the reactor via pipe 13 and existing the reactor in a polarized form via pipe 15 with check valve 17 to prevent the polarized liquid returning to reactor 11; the polarized Hydrogen and the polarized liquid fuel acquire the state of a mixture when combined in pipe 220 that enters reactor 18 for their magnecular bond. The desired HyFuels then exit the plant via effluent pipe 19 for collection.

Figure 36A:
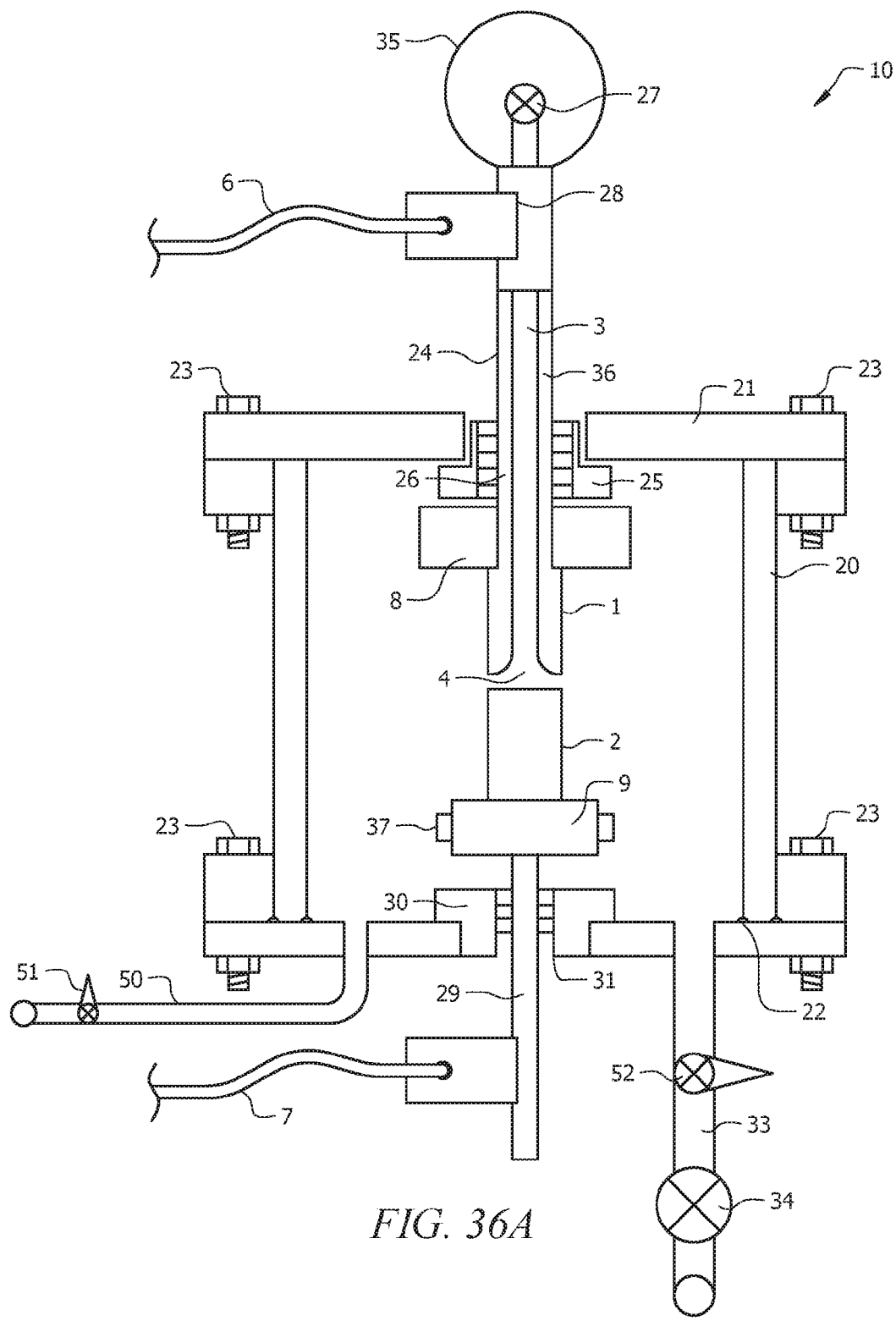
FIG. 36A illustrates an exemplary reactor.
Figure 36B:
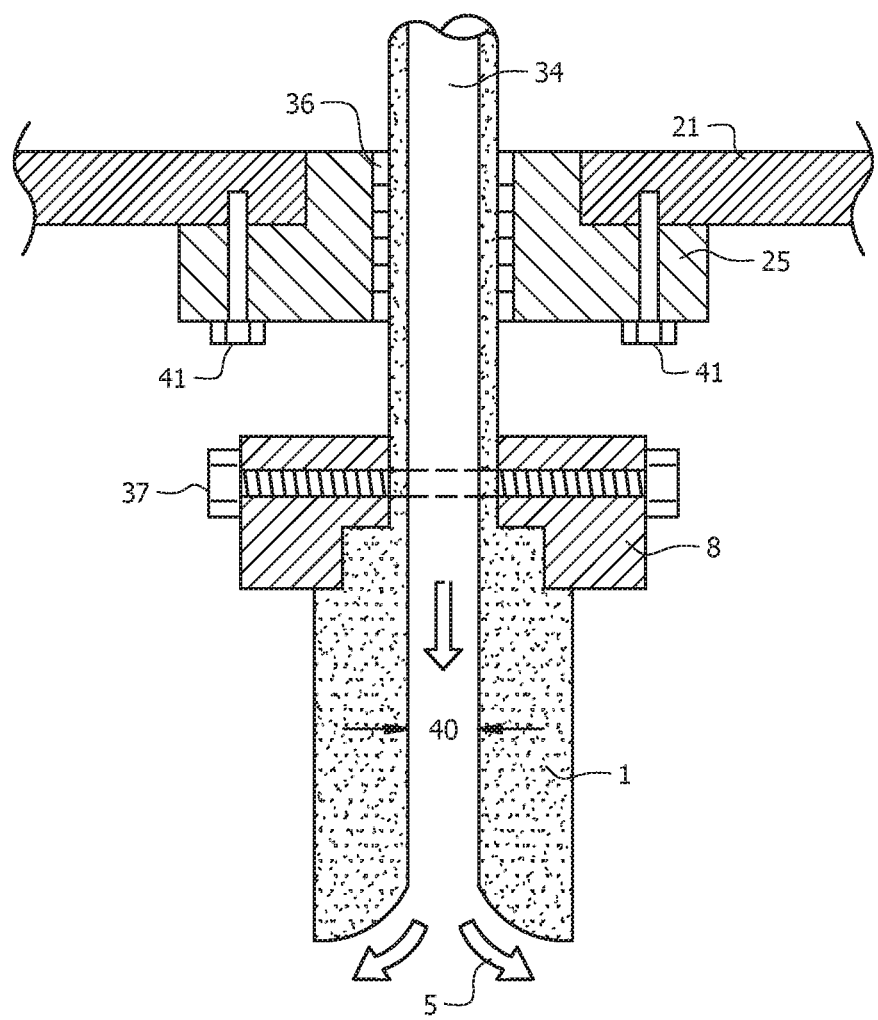
FIG. 36B illustrates a second exemplary reactor.

With reference to FIGS. 36A and 36B, an exemplary reactor 10 for the magnetic polarization of conventional Hydrogen H2 comprises: for example, a schedule 40 carbon steel pipe 20 of 2 feet OD and 3 feet length horizontally or vertically oriented and completed with welded on hollow flanges as shown in FIG. 36A, plain flange 21 at one end of said pipe fastened to the hollow flanges via bolts 23, plus a mirror of plane flange 21 and related fasteners at the other end of pipe 20 so as to be able to sustain internal pressure for at least 100 psi; said vessel 20 containing in its interior the electrode assembly shown in detail in FIG. 37B. The electrode assembly comprises an anode 1 (as shown, hollow) of, for example, 5" OD and 5" length and the cathode 2 of 5" OD and 7" length with the gap 4 of approximately ⅛". The copper holders 8/9 of said electrodes 1/2, respectively, being composed by copper disks of 7" OD and 3" thickness to fasten together the anode and cathode The anode is connected as shown in FIG. 36A to a copper pipe 34 of 2" OD and 1" ID hole 40 and the cathode is connected to a 2" OD copper rod 29 via fasteners 37 shown in FIG. 36B in dashed lines because off center with respect to the holders 8/9 (e.g., disk-shaped); The anode assembly is connected to flange 21 by phenolic bushing 25 of, for example, 5" OD and 3" thickness and fastened to a flange 21 via bolts 41. The phenolic bushings 25 comprise a series of seals 36 assuring the constant maintaining of pressure inside vessel 20 (e.g., 100 psi). The corresponding cathode assembly as shown in FIG. 36A includes a cathode 2. The corresponding copper holder 9 is preferably identical to the copper holder 8; 2" OD copper rod 29, phenolic bushing 30 and related seals 31 are preferably identical to those for the anode assembly of FIG. 36B. The tube 24 (e.g., copper tube) and copper rod 29 protruding outside the plain flanges 21 of vessel 20 as shown in FIG. 36A in such a fashion to allow electrical connections 6/7. The reactor 10 for the polarization of hydrogen is completed with, for example, a tank 35 (e.g., an aluminum tank) for Hydrogen at pressure of 1,500 psi which is connected to the tube 24 (e.g. copper tube) via pressure regulator 27, pipe 33 and related check valve 34 for the existing of polarized Hydrogen. A variety of automatic controls and other peripheral equipment for the initiation, maintaining and optimization of the arc in between the anode and cathode that are not reproduced in FIG. 36A for brevity and such is described in detail in the U.S. Pat. No. 8,236,150 B2, which is hereby incorporated by reference.

The operations of the reactor 10 for the polarization of hydrogen are as follows. A vacuum of up to −30 psi is pulled out of vessel 20 via a commercially available vacuum pump connected to said vessel 20 via tube 50 and valve 51 while being sure that valve 52 of pipe 33 is closed. Following the achievement of said vacuum, the vacuum pump is halted and valve 51 closed. Then, the pressure regulator 27 of Hydrogen tank 35 is set to 100 psi and Hydrogen is allowed to fill up vessel 20 at 100 psi. Valve 51 is open to flush the interior gas in order to make sure that vessel 20 contains no atmospheric or other gases. During this flushing, the Hydrogen existing from tube 50 and valve 51 is capture to prevent its release in the atmosphere for evident environmental reason and disposed of either for re-use or via governmental approved regulations. Following these preparatory steps, with vessel 20 filled up with Hydrogen, the electric arc in gap 4 is activated by automatic means not shown in the figures but such is disclosed in U.S. Pat. No 8,236,150 which has been incorporated by reference. Following the activation of the electric arc, valve 52 is automatically open and Hydrogen is allowed to pass through said arc and exit through pipe 33 for its passage to the rest of the HyFuels production plant described below.

A main outcome of the above Hydrogen polarization reactor is that of turning a conventional Hydrogen with molecular structure H2=H—H into a magnecular species MH as depicted, for instance, in FIG. 16 showing a clear magnecular structure composed by a mixture of molecular and magnetically bonds such as: MH2=(H—H, H×H), MH3=(H—H×H, H×H×H), MH4=(H—H×H—H, H—H× H×H, H×H×H×H), etc. Carbon electrodes are selected in the preferred embodiment depicted above because of their low costs as well as resistance to high temperature. It should be noted that said carbon electrodes consume during the operation of reactor 10 by producing dimers C—H and their composites that are clearly identified in the chemical analysis of FIG. 16. These Hydrocarbons HC are admitted by this invention because they are combustible and mostly having a magnetically structure particularly for higher value of atomic mass unit, which means that their combustion is of the novel magnecular type thus being more efficient than that of molecular type as described above.

A variety of 300 kW power units are anticipated for use in the preferred embodiment depicted above, including but not limiting to: steady DC power; DC power with arc pulsing at the rate of at least 100 discharges per seconds (100 Hz) so as to increase the energy content in Joules of each individual discharge by a factor of at least ten when compared to a steady DC arc; steady AC power at commercially available 60 Hz; AC power with increased frequency up to the maximum commercially available at this writing of the order of 150,000 Hz with the capability to vary said frequency in such a way to select a frequency which is a sub harmonic of the resonating frequency of the Hydrogen molecule H2=H—H in which case there is an increase of at least five fold in the efficiency of reactor 10 in the separation of the Hydrogen molecule as typical of all resonating effects. It should be recalled that the separation of the H2 molecule is a necessary pre-requisite for the creation of the new species MH. The above power units can be used either individually or collectively and can be complemented with a variety of additional power assistance means, such as microwave source not shown in the drawings because commercially available and described in details by preceding patents granted to the inventor.

Maintenance of the reactor 10 for the polarization of hydrogen requires its disassembling at least once per week, checking out conditions of seals 36 or replace them to assume lack of leakage of Hydrogen in the environment; checking out or replacing the electrodes 1/2, and cleaning the interior of vessel 20 from carbon powder that are usually deposited in the interior of vessel 20 as a result of the consumption of the electrodes under the action of the electric arc. In the event a continuous 24 hour use is desired indefinitely without interruptions, reactor 10 should be duplicated with automatic means for releasing polarized Hydrogen into line 14 from one reactor to the other.

Figure 37:
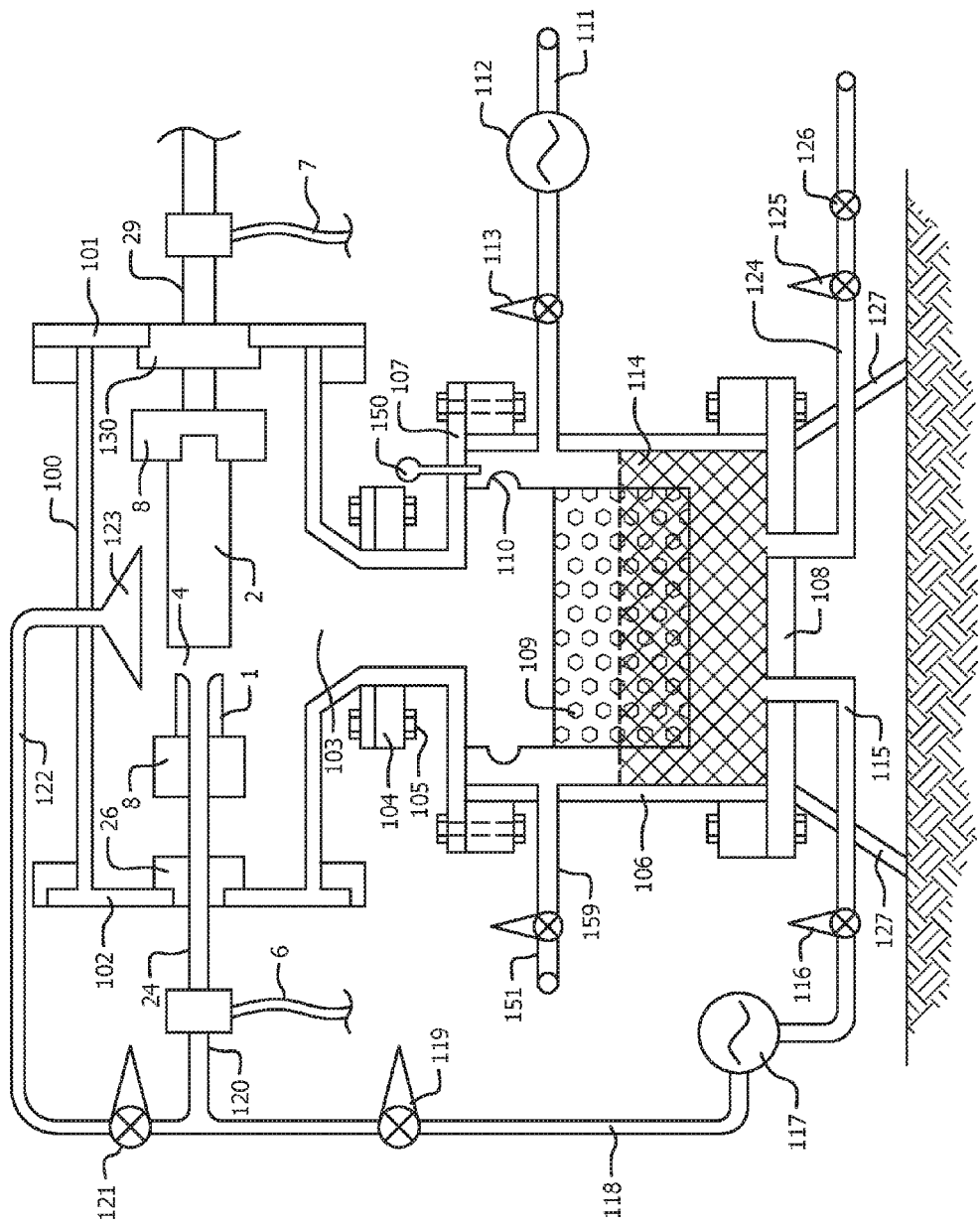
FIG. 37 illustrates a liquid fuel polarization reactor.
Figure 38:
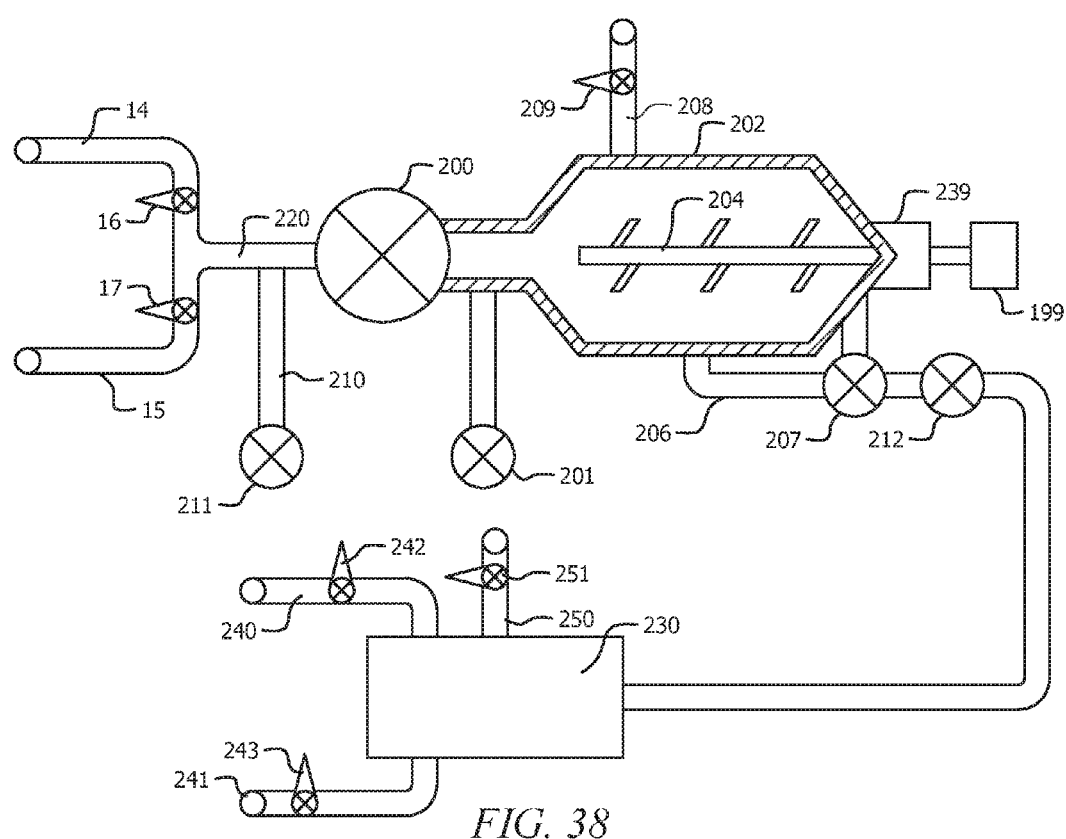
FIG. 38 illustrates a fuel/gas combining apparatus.

With reference to FIG. 37, the reactor 11 for the magnetic polarization of the liquid comprises: a vessel 100 (e.g. horizontally placed vessel) consistent of a schedule 40 carbon steel pipe of 2 feet in OD and 7 feet in length completed with welded on hollow flanges at each end as shown in the figure as well as plain flanges 101 and 102 fastened to said hollow flanges in such a way to allow the maintaining of pressure (e.g. 100 psi) in its interior; said vessel 100 containing in its interior the anode-cathode assembly of FIGS. 36a and 36b, including anode 1 (as shown, hollow), plain cathode 2, gap 4, respective copper holders 8 and 9, respective phenolic bushings 26 and 30, tube 24 (e.g. copper tube) and copper rod 29 in such a fashion to allow electrical connections to the respective negative polarity 6 and positive polarity 7 of the power unit; said horizontally placed vessel 100 comprising in its lower portion a welded on funnel 103 which is connected to the lower parts of the reactor via bolted on hollow flanges 104 and 105 as shown in the figure; said lower part of the reactor comprising vessel 106 consisting of vertically placed a carbon steel tube of 3 feet in diameter and 5 feet in height completed at the top and bottom ends by welded on hollow flanges as shown in FIG. 38, plus bolted on plain flanges 107 in the top and 108 at the bottom fastened to said hollow flanges in such a way to allow the maintaining of, for example, 100 psi internal pressure; the interior of vessel 106 comprising basket 109 constructed from, for example, perforated 1/16" thick steel with 1/16" holes having the dimensions of 2.5 feet OD and 4 feet in height which basked is connected to the top flange 107 via hooks 110; the lower vessel 106 being filled up with the desired liquid fuel up to level 114 which is approximately half of the height of vessel 106; said liquid fuel being circulated through the tube 24 (e.g. copper tube) via pump 117 transferring said liquid fuel from vessel 106 through pipe 115 and then pumping said liquid fuel through the tube 24 (e.g. copper tube) via pipe 118. The liquid fuel circulation is completed by secondary pipe 121, flowing the liquid fuels through gap 4 of the electrodes via funnel 123. The initial filling of reactor 11 is done via pipe 111 connected to an external tank of said liquid field (not shown). The process of filling is performed by a pump 112 discharging the liquid fuel into vessel 106 as shown. The reactor 11 is completed by a sensor 150 for the measuring of the level of the liquid fuel in vessel 106 by way of, for example, microwaves or other mechanisms. Automatic control of the electric arc, automatic refill of the liquid fuel so as to maintain a constant level, and various other peripheral equipment are not shown in FIG. 37, such are disclosed in U.S. Pat. No. 8,236,150.

The operation of reactor 11 for the polarization of a conventional liquid fuel is as follows: vessel 106 is filled with the selected liquid fuel through the input pipe 111 from an outside tank of said fuel by a pump 112 with a valve 113 set in an open position and valves 125 and 151 set in closed positions. The filling is stopped by automatic controls when a maximal allowed level is achieved. The input pipe 111, pump 112 and valve 113 are later used for subsequent automatic refills. A vacuum is pulled out of the entire reactor down to, for example, minus 30 psi via the use of an industrially available vacuum pump connected to a vacuum pipe 159 with a valve 151 open to remove air from the interior of the reactor. The pump 117 (e.g. circulation pump) is activated, for example, for about one minute to circulate the liquid fuel through the gap 4 between the electrodes 1/2 as well as through funnel 123; the electric arc is then activated in between electrodes 1/2, thereby polarizing said liquid fuel and jointly producing a gaseous fuel as well as carbon deposited often referred to as fullerenes. The gaseous fuel is produced until the internal pressure of reactor 11 is of about, for example, 100 psi at which point, reactor 11 enters into the mode of automatic operation I which the automatic release of the mixture of polarized liquid fuel and gas produced by the reactor through effluent line 124 with a valve 125 automatically open. The automatic refill of the conventional liquid fuel occurs through the input pipe 111 and the valve 113 in an open position. The gap 4 between electrodes 1/2 becomes covered by fullerene deposits that are continuously removed by the vertical flow of the liquid fuel through the funnel 123. The fullerenes are continuously drained through the funnel 103 into the lower vertical vessel 106 and are captured by a basket 109 that is perforated to permit the polarized liquid fuel to drain to the bottom of vessel 106 where it exits through exit tube 124 and a valve 125 that is automatically opened.

Maintenance of reactor 11 is needed on a regular basis. It is anticipated that the reactor needs to be disassembled after about one week of operation to verify that seals are in good condition and to replace the seals when needed, reducing the release of contaminants into the atmosphere as well as to reduce contamination of the interior of the reactor by atmospheric gasses. A lid 107 is removed from vessel 106 and the basket 109 containing the fullerene deposits is removed from vessel 106 and emptied. The fullerene deposits are dried in a commercially available dryer for use in carbon composites and other manufactured goods as known in the industry. After servicing, the reactor 11 is reassembled and the operations are initiated again according to the above description. 24 hour operation is possible by duplicating reactors with channels for flowing of the mixture of polarized liquid fuel and gas produced by the arc into a tube 15 from the disabled reactor to the operating reactor.

With reference to FIG. 38, the mixing system 18 of the production plant of FIG. 35 is shown. Polarized Hydrogen originating from reactor 10 of FIG. 36a enters the mixing system 18 through a pipe 14 and a check valve 16. Polarized liquid fuel from reactor 11 of FIG. 37 enters the mixing system 18 through a pipe 15 and the check valve 17. The mixture of polarized liquid fuel and gas produced by the arc in reactor 11 flow through the pipe 15 mixing with the polarized hydrogen flowing through the pipe 14, converging into the single pipe 220. The resulting mixture of gaseous polarized Hydrogen MH and polarized liquid fuel are compressed at, for example, 5,000 psi by a pressure pump 200 into a high pressure vessel 202 made from, for example, schedule 80 pipe of about 6" diameter and about 3 feet length. Within the high pressure vessel 202 is a shaft and propellers 203. The shaft and the propellers 204 are rotated by a motor 199 for the continuous mixing of the gaseous and liquid phases while the internal pressure (e.g., 5,000 psi) is maintained by suitable seals 239. The fluid produced by the apparatus exits the high pressure vessel 202 through an outlet pipe 206 controlled by a pressure regulator 207 and a check valve 212, thereby releasing the fluid into a separation tank 230 operating at, for example, around 100 psi, thereby the fluid separates into liquids and gases. The liquids exist through an exit pipe 241 and a control valve 243. The gases exit the separation tank 230 through an exit pipe 240 and a control valve 242. It is anticipated that the gases be used, for example, in the gaseous phase (see above), or as a gaseous fuel. In some embodiments, a safety release vent 208 is provided with a pressure relief valve 209.

The operation of the high pressure vessel 202 is shown in FIG. 38. By closing the valves 16/17/242/243 and opening the valves 251/207 open, a vacuum down to minus 30 psi is pulled out of the entire apparatus by a vacuum pump connected to line 250. This is done to remove all or most of the air. Next, two valves 16/17 are opened, allowing the mixture of polarized Hydrogen and liquid fuel to enter the high pressure vessel 202 at, for example, 100 psi as monitored by a pressure gauge 211 connected by a tube 210. The pressure pump 200 is activated until the pressure within the high pressure vessel 202 is at the desired pressure, for example 5,000 psi, as monitored by a second pressure gauge 201. The downstream pressure regulator 212 is set to release the effluent fluid at 100 psi. The motor 199 is activated to mix the gaseous and liquid materials that are now within the high pressure vessel 202 at which point two valves 242/243 are opened to maintain 5,000 psi pressure inside the high pressure vessel 202. The synthesized Fuel exits the plant from the exit pipe 241 for collection and use while the residual gas exits from the exit pipe 240 for use as described previously.

Maintenance of the apparatus of FIG. 38 includes disassembly, for example, once per week to verify that all seals are in proper order and, if not, the seals are replaced to reduce any release of contaminants into the atmosphere. Regular cleaning procedures, such as the removal of possible internal carbon deposits, are also performed.

Numerous alternatives exist over the preceding preferred embodiment. As one illustration among several, the HyFuel production plant can be based on the use of MagneHydrogen MH separated from MagneGas MG, thus requiring no additional polarization. In this case, the production plant of FIG. 35 is essentially reduced to reactor 11 and final station 18 with MH being moved into the latter by the pipe 14.

The separation of MH from MG is done by the use of industrially available equipment such as Pressure Swing Adsorption PSA, Vacuum Swing Adsorption VSA, Molecular Seeving MG and other equipment that are not shown.

Yet another alternative to the above preferred embodiments is given by the use of MagneGas MG in lieu of MH as the additive gaseous phase released into the pipe 14. This alternative has industrial utility because MG is internally rich in magnecularly bonded Hydrogen as well as Oxygen whose latter presence in the produced HyFuel can only be beneficial for utility and the environment. Apparatus for the production of MagneGas is known in the art.

Yet an additional embodiment of this invention is characterized by the use of MagneOxygen MO as an additive to the enrich HyFuels. Being magnecularly bonded, the Oxygen in MO is not free, thus being safe when used in percentage below the stoichiometric ratio for the combustion of Oxygen and HyFuels. In fact, the presence of magnecularly bonded Oxygen in HyFuels increases its combustion, thus decreasing the contaminants in the exhaust while increasing energy output, thus having clear utility.

Oxygen rich HyFuels can be produced by the plant of FIG. 35 in which reactor 10 is used for the polarization of commercially available Oxygen $O_2$. Alternatively, MO can be obtained via its separation from MG via the use of PSA, VSA, MS or other commercially available equipment. In the latter case, reactor 10 is bypassed and MO is directly released into pipe 14 of FIG. 38.

A preferred embodiment of the industrial production of solid HyFuels, such as Hy-Coal but not restricted to the latter, is essentially that of FIG. 38 in which: the solid fuel (e.g. coal) is reduced to a powdery form and it is processed for the removal of Sulfur and other contaminants via commercially available equipment (not shown) as known by those skilled in the art. The treated solid fuel is then released into the input line 15 and mixed with MH via inlets 14/15 at, for example, 100 psi as monitored by the pressure gauge 211. The mixture is passed through the pressure pump 200 to increase the pressure of the mixture to, for example, 5,000 psi. The mixture under pressure is passed to the high pressure vessel 202 with the second pressure regulator 212 set to 100 psi as described above. The propellers 204 are rotated, facilitating the mixture of the powdery fuel with MH and the resulting mixture is then transferred to the separation tank 230 for the separation of the solid HyFuels from the residual MH in the related exit tubes 240 and 241. The solid, Hydrogen rich HyFuels is collected while the residual MH is collected for re-use or other uses.

Yet additional preferred embodiments of this invention for the case of solid HyFuels are given by the use of MagneOxygen MO or MagneGas MG as additive to powdery solid fuel due to their utility indicated earlier.

Yet an additional preferred embodiment for the production of solid HyFuels is as follows. According to a chemical law established in the early part of the 20th century, all gaseous fuels can be converted into a liquid form via their exposure at pressure of about 240 psi to suitable catalysts, via a process known as the Fisher-Tropsch Catalytic Liquefaction. As an illustration, Natural Gas is converted to Liquid Petroleum LP via said Fisher-Tropsch catalytic tower and said LP remains in the liquid state provided that it is contained in a vessel capable of sustaining its vapor pressure of about 100 psi. This process also applies to MagneHydrogen MH and MagneGas MG resulting in new combustible liquid fuels called, MagneLiquids ML, due to the predominance of the magnecular structure of the liquid state.

The additional preferred embodiment under consideration for the industrial production of solid HyFuels is essentially that of FIG. 39 in which the solid fuel fed into the plant via the feeding tube 15, while releasing into the exit line 14 a selected ML, rather than MH, the two liquids are mixed in intermediate tube 220 and the operation of the reactor of FIG. 38 are continued as per the operation described for the gaseous additive.

The utility of the embodiment using ML additive over the embodiment using MH or MG or MO as additive is the achievement of a greater percentage of additive magnetically bonded to the solid fuel. This is evidently due to the fact that in the transition from a gaseous to a liquid state, there is the increase of the density of at least by a factor of 1,000. Additional increases of utility are due to capillary and other effects present in the liquid but not so defined in the gaseous state.

Figure 25:
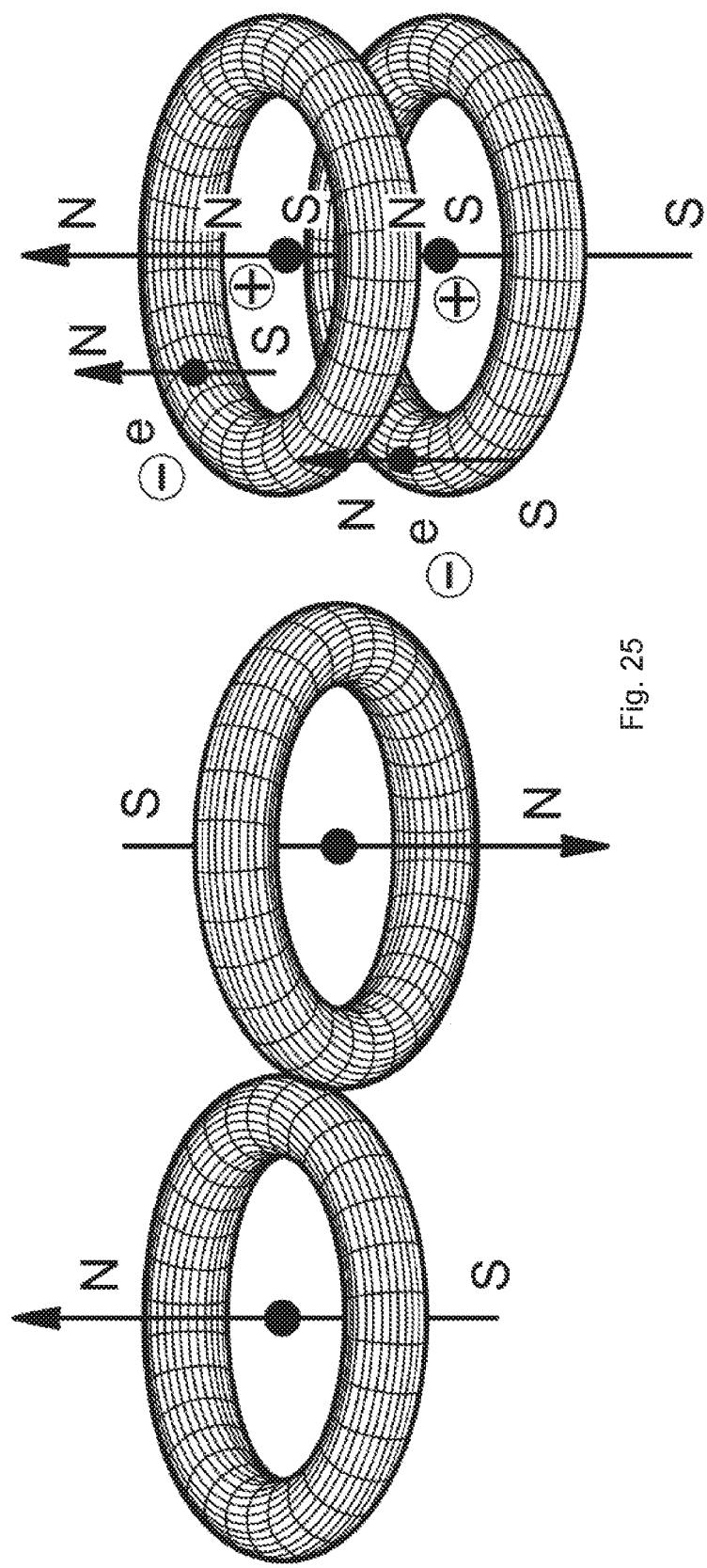
FIG. 25 illustrates polarized atoms.

Yet an additional use of the apparatus of this invention is that of the industrial production of MagneGases via the use of conventional gases and their polarization and mixture via the plant of FIG. 35. As an illustration, two reactors 10 can be used to induce a magnecular structure in $H_2$ and, separately in CO. The two magnetically polarized gases are then mixed by the apparatus of FIG. 38, and the final effluent gas out of the exit pipe 240 is a combustible gas essentially equivalent to MagneGas as produced via the gasification of liquid waste. This is due to having a chemical structure of the type presented in FIG. 19. This process has utility because the individual atoms are weakly bonded, thus having the magnecular combustion identified above, with increasing the flame temperature as per FIG. 25. Essentially the same method and apparatus are applicable to other forms of fuels, both gaseous, such as $O_2$, $CH_4$, etc., as well as liquid, such as gasoline, diesel and propane.

A yet additional application of the apparatus presented herein is given by a novel type of protective coating also based on the anomalous adhesion of polarized gases to substances. An illustrative, but not limiting example is given by the protective coating of computer chips (e.g. silicon substrate) with several layers of Nitrogen atoms that evidently prevent oxidation. For this purpose, conventional pure Nitrogen $N_2$ can be magnetically polarized via reactor 10 of FIGS. 36A and 36B, the sole difference being the replacement of carbon electrodes with temperature resistant conducting and non-consumable electrodes such as tungsten electrodes. Such electrodes do not contaminate the original gas. The computer chips (e.g. silicon substrate) can then be exposed to the intense magnetic fields generated by solenoids. The so polarized nitrogen and computer chips (e.g. silicon substrate) are then combined via an equipment of the type of FIG. 38 described above. Exposure of the polarized computer chips (e.g. silicon substrate) to the polarized nitrogen at, for example, 5,000 psi, results in the coating of the chips with layers of polarized Nitrogen, such as those of FIGS. 12 to 18. The resulting mixture of coated chips (e.g. silicon substrate) and residual polarized nitrogen is then brought to low pressure tank 230 for the separation of the coated chips from the residual polarized nitrogen via respective exit lines 241/240. The coated chips (e.g. silicon substrate) are collected for further processing, while the residual polarized nitrogen is collected for sale or re-use.

The specific embodiment constructed out of available, high pressure pipes, seals, flanges, etc., is shown as an example of an operational system of the present invention and is not intended to limit this disclosure in any way.

Equivalent elements can be substituted for the ones set forth above such that they perform in substantially the same manner in substantially the same way for achieving substantially the same result.

It is believed that the system and method as described and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely exemplary and explanatory embodiment thereof. It is the intention of the following claims to encompass and include such changes.

What is claimed is:

1. A method for bonding a fluid to a substance, the method comprising:
    exposing the fluid to a an electric arc within a first pressure vessel, thereby creating a treated fluid;
    exposing the substance to a magnetic field within a second pressure vessel, thereby forming a polarized substance; and
    combining the treated fluid and polarized substance under a high pressure within a third pressure vessel, thereby exposing the treated fluid to the polarized substance at a pressure sufficient to achieve a bond.

2. The method of claim 1, wherein the fluid is hydrogen.

3. The method of claim 1, wherein the substance is gasoline.

4. The method of claim 1, wherein the substance is diesel.

5. The method of claim 1, wherein the substance is coal.

6. The method of claim 1, wherein the substance is carbon monoxide.

7. The method of claim 1, wherein the fluid is nitrogen.

8. The method of claim 1, wherein the substance is a semiconductor substrate.

9. A method for bonding a fluid to a substance, the method comprising:
    filling a first pressure vessel with the fluid;
    pressurizing the first pressure vessel to a first pressure;
    circulating the fluid through an electric arc formed within the first pressure vessel, thereby creating a treated fluid;
    within a second pressure vessel, exposing the substance to a magnetic field, thereby forming a polarized substance; and
    combining the treated fluid and polarized substance under a second pressure within a third pressure vessel, thereby exposing the treated fluid to the polarized substance at a pressure sufficient to achieve a bond.

10. The method of claim 9, wherein the first pressure is at least 100 pounds per square inch.

11. The method of claim 9, wherein, before the step of filling, evacuating the first pressure vessel.

12. The method of claim 11, wherein, the first pressure vessel is evacuated to minus 30 pounds per square inch.

13. The method of claim 9, wherein the arc is powered by a pulsed direct current of greater than or equal to 100 Hz.

14. The method of claim 9, wherein the arc is powered by an alternating current of up to 150 KHz.

15. The method of claim 9, wherein the second pressure is at least 5,000 pounds per square inch.

16. The method of claim 9, wherein, before the step of combining, evacuating the third pressure vessel to approximately minis 30 pounds per square inch.

17. The method of claim 9, wherein the combining the treated fluid and polarized substance includes mixing by a propeller within the third pressure vessel.

18. The method of claim 9, wherein the fluid is hydrogen.

19. The method of claim 9, wherein the substance is gasoline.

20. The method of claim 9, wherein the substance is diesel.

* * * * *